United States Patent
Okamoto et al.

(10) Patent No.: US 10,566,183 B2
(45) Date of Patent: Feb. 18, 2020

(54) METHOD OF MANUFACTURING SEMICONDUCTOR DEVICE AND THE SEMICONDUCTOR DEVICE

(71) Applicant: Renesas Electronics Corporation, Tokyo (JP)

(72) Inventors: Yasuhiro Okamoto, Ibaraki (JP); Takashi Ide, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/052,929

(22) Filed: Aug. 2, 2018

(65) Prior Publication Data

US 2019/0074174 A1   Mar. 7, 2019

(30) Foreign Application Priority Data

Sep. 7, 2017   (JP) .................. 2017-172307

(51) Int. Cl.
   *H01L 29/66*   (2006.01)
   *H01L 21/02*   (2006.01)
   (Continued)

(52) U.S. Cl.
   CPC ...... *H01L 21/02164* (2013.01); *H01L 21/022* (2013.01); *H01L 21/0228* (2013.01);
   (Continued)

(58) Field of Classification Search
   CPC ............. H01L 29/1259; H01L 29/1262; H01L 29/66431; H01L 29/66477; H01L 29/66462; H01L 29/66522
   See application file for complete search history.

(56) References Cited

U.S. PATENT DOCUMENTS

2009/0058532 A1*   3/2009   Kikkawa ............. H01L 29/1075
                                                        330/295
2015/0221757 A1*   8/2015   Nakayama .......... H01L 27/0605
                                                        257/20
(Continued)

FOREIGN PATENT DOCUMENTS

JP        5684574 B2      3/2015
WO   2010/064706 A1      6/2010

OTHER PUBLICATIONS

K. Kita and A. Toriumi "Origin of electric dipoles formed at high-k/SiO2 interface," Applied Physics Letters, vol. 94, 132902 (2009).

*Primary Examiner* — Jae Lee
(74) *Attorney, Agent, or Firm* — Mattingly & Malur, PC

(57) ABSTRACT

Characteristics of a semiconductor device are improved. A method of manufacturing a semiconductor device of the invention includes a step of forming a gate insulating film over a nitride semiconductor layer. The step includes steps of forming a crystalline $Al_2O_3$ film on the nitride semiconductor layer, forming a $SiO_2$ film on the $Al_2O_3$ film, and forming an amorphous $Al_2O_3$ film on the $SiO_2$ film. The step further includes steps of performing heat treatment on the amorphous $Al_2O_3$ to crystallize the amorphous $Al_2O_3$, thereby forming a crystalline $Al_2O_3$ film, and forming a $SiO_2$ film on the crystalline $Al_2O_3$ film. In this way, since a film stack, which is formed by alternately stacking the crystalline $Al_2O_3$ films and the $SiO_2$ films from a bottom side, is used as the gate insulating film, threshold voltage can be cumulatively increased.

9 Claims, 35 Drawing Sheets

(51) Int. Cl.
*H01L 29/778* (2006.01)
*H01L 29/51* (2006.01)
H01L 29/417 (2006.01)
H01L 29/423 (2006.01)
H01L 29/43 (2006.01)
H01L 29/20 (2006.01)

(52) U.S. Cl.
CPC .. *H01L 21/02178* (2013.01); *H01L 21/02271* (2013.01); *H01L 21/02356* (2013.01); *H01L 29/513* (2013.01); *H01L 29/66462* (2013.01); *H01L 29/778* (2013.01); *H01L 29/7783* (2013.01); *H01L 29/2003* (2013.01); *H01L 29/41758* (2013.01); *H01L 29/4236* (2013.01); *H01L 29/42376* (2013.01); *H01L 29/432* (2013.01)

(56) References Cited

U.S. PATENT DOCUMENTS

2015/0221758 A1* 8/2015 Miura ................. H01L 29/7787
257/76
2018/0097096 A1* 4/2018 Sugiyama ............. H01L 23/291

* cited by examiner

FIG. 54

| Group | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| Period | | | | | | | | | | | | | | | | | | |
| 1 | H 2.20 | | | | | | | | | | | | | | | | | He |
| 2 | Li 0.98 | Be 1.57 | | | | | | | | | | | B 2.04 | C 2.55 | N 3.04 | O 3.44 | F 3.98 | Ne |
| 3 | Na 0.93 | Mg 1.31 | | | | | | | | | | | Al 1.61 | Si 1.90 | P 2.19 | S 2.58 | Cl 3.16 | Ar |
| 4 | K 0.82 | Ca 1.00 | Sc 1.36 | Ti 1.54 | V 1.63 | Cr 1.66 | Mn 1.55 | Fe 1.83 | Co 1.88 | Ni 1.91 | Cu 1.90 | Zn 1.65 | Ga 1.81 | Ge 2.01 | As 2.18 | Se 2.55 | Br 2.96 | Kr 3.00 |
| 5 | Rb 0.82 | Sr 0.95 | Y 1.22 | Zr 1.33 | Nb 1.6 | Mo 2.16 | Tc 1.9 | Ru 2.2 | Rh 2.28 | Pd 2.20 | Ag 1.93 | Cd 1.69 | In 1.78 | Sn 1.96 | Sb 2.05 | Te 2.1 | I 2.66 | Xe 2.6 |
| 6 | Cs 0.79 | Ba 0.89 | * | Hf 1.3 | Ta 1.5 | W 2.36 | Re 1.9 | Os 2.2 | Ir 2.20 | Pt 2.28 | Au 2.54 | Hg 2.00 | Tl 1.62 | Pb 2.33 | Bi 2.02 | Po 2.0 | At 2.2 | Rn |
| 7 | Fr 0.7 | Ra 0.9 | ** | Rf | Db | Sg | Bh | Hs | Mt | Ds | Rg | Cn | Uut | Fl | Uup | Lv | Uus | Uuo |

| Lanthanoid * | La 1.1 | Ce 1.12 | Pr 1.13 | Nd 1.14 | Pm 1.13 | Sm 1.17 | Eu 1.2 | Gd 1.2 | Tb 1.1 | Dy 1.22 | Ho 1.23 | Er 1.24 | Tm 1.25 | Yb 1.1 | Lu 1.27 |
|---|---|---|---|---|---|---|---|---|---|---|---|---|---|---|---|
| Actinide ** | Ac 1.1 | Th 1.3 | Pa 1.5 | U 1.38 | Np 1.36 | Pu 1.28 | Am 1.13 | Cm 1.28 | Bk 1.3 | Cf 1.3 | Es 1.3 | Fm 1.3 | Md 1.3 | No 1.3 | Lr |

METHOD OF MANUFACTURING SEMICONDUCTOR DEVICE AND THE SEMICONDUCTOR DEVICE

CROSS-REFERENCE TO RELATED APPLICATIONS

The disclosure of Japanese Patent Application No. 2017-172307 filed on Sep. 7, 2017 including the specification, drawings and abstract is incorporated herein by reference in its entirety.

BACKGROUND

The present invention relates to a method of manufacturing a semiconductor device and the semiconductor device. For example, the invention can be preferably applied to a semiconductor device using a nitride semiconductor.

GaN-based nitride semiconductor is expected to be used for a transistor in applications of high withstand voltage, high output, and high frequency because of its wide bandgap and high electron mobility compared with Si or GaAs, and has been actively developed in recent years. Among such transistors, a transistor having normally-off characteristics is useful, and a structure is earnestly investigated so that the transistor has the normally-off characteristics.

For example, Japanese Patent No. 5684574 discloses a semiconductor device including an under layer, an electron supply layer, a two-dimensional electron gas cancel layer, a first insulating film, and a gate electrode.

K. Kita and A. Toriumi "Origin of electric dipoles formed at high-k/$SiO_2$ interface," Applied Physics Letters vol. 94, 132902 (2009) describes a MOS device having a so-called high-k metal structure, in which a film stack including $Al_2O_3$ stacked on $SiO_2$ is used as a gate insulating film to increase a threshold voltage.

SUMMARY

The inventors have engaged in research and development of a semiconductor device using a nitride semiconductor, and have made earnest investigations on improvement in characteristics of the semiconductor device. Specifically, the inventors have made investigations on a structure (mesa-type MOS structure) of the transistor so that the transistor has the normally-off characteristics.

However, the investigation of the inventors shows that threshold voltage of the mesa-type MOS structure is low, roughly 0 V, for example; hence, the threshold voltage is desirably increased so that the normally-off characteristics are effectively exhibited.

In a MOS device (silicon device) formed on a main surface of a silicon substrate, as well known, the film stack including $Al_2O_3$ stacked on $SiO_2$ is used to increase a threshold voltage as described in the literature "Origin of electric dipoles formed at high-k/$SiO_2$ interface".

From such a viewpoint, the inventors have examined threshold voltage of a nitride semiconductor device using the film stack including $Al_2O_3$ stacked on $SiO_2$ as a gate insulating film. As a result, the threshold voltage has not increased significantly and reproducibly. Through further investigations, the inventors have examined various film stacks as a gate insulating film. As a result, contrary to the case of a silicon device, when a film stack including $SiO_2$ stacked on $Al_2O_3$ is used, an effect of increasing a threshold voltage has been confirmed in some nitride semiconductor devices. Through analysis, it has been found that the effect of increasing the threshold voltage is given in the case where a lower layer, $Al_2O_3$, is crystallized. Furthermore, a relationship between Vt and thickness of the $SiO_2$ film has revealed that the effect of increasing the threshold voltage is explained by a dipole model.

According to such findings, the inventors have made earnest investigations on a structure and a manufacturing method of a nitride semiconductor device to secure an effect of further increasing a threshold voltage, and have achieved a semiconductor device that has good normally-off characteristics while suppressing the reduction in threshold voltage.

Other objects and novel features will be clarified from the description of this specification and the accompanying drawings.

Among the embodiments disclosed in this application, typical ones are briefly summarized as follows.

A method of manufacturing a semiconductor device according to one embodiment disclosed in this application includes a step of forming a gate insulating film over a nitride semiconductor layer. The step includes steps of forming a crystalline oxide film of a first metal, forming an oxide film of a second metal over the crystalline oxide film of the first metal, and forming an amorphous oxide film of the first metal over the oxide film of the second metal.

A semiconductor device according to one embodiment disclosed in this application includes a gate insulating film formed over a nitride semiconductor layer. The gate insulating film includes a stack formed by stacking a crystalline oxide film of a first metal, an oxide film of a second metal, a crystalline oxide film of the first metal, and an oxide film of the second metal in order from a bottom side.

According to the method of manufacturing a semiconductor device described in each of the following typical embodiments disclosed in this application, a semiconductor device having good characteristics can be manufactured.

According to the semiconductor device of each of the following typical embodiments disclosed in this application, characteristics of the semiconductor device can be improved.

BRIEF DESCRIPTION OF THE DRAWINGS

FIG. 54 illustrates a Table of Pauling's electronegativity.

DETAILED DESCRIPTION

Although each of the following embodiments may be dividedly described in a plurality of sections or embodiments for convenience as necessary, they are not unrelated to one another except for the particularly defined case, and are in a relationship where one is a modification, an application, detailed explanation, supplementary explanation, or the like of part or all of another one. In each of the following embodiments, when the number of elements and others (including the number, a numerical value, amount, and a range) is mentioned, the number is not limited to a specified number except for the particularly defined case and for the case where the number is principally clearly limited to the specified number. In other words, the number may be not less than or not more than the specified number.

In each of the following embodiments, a constituent element (including an element step etc.) of the embodiment is not necessarily indispensable except for the particularly defined case and for the case where the constituent element is considered to be indispensable in principle. Similarly, in the following embodiment, when a shape of a constituent element, a positional relationship, and others are described, any configuration substantially closely related to or similar to such a shape or the like should be included except for the particularly defined case and for the case where such a configuration is considered to be not included in principle. The same holds true in each of the number of elements and others (including the number, a numerical value, amount, and a range).

Hereinafter, some embodiments will be described in detail with reference to the accompanying drawings. In all drawings for explaining the embodiments, components having the same function are designated by the same or relevant numeral, and duplicated description is omitted. If a plurality of similar components (sites) exist, the numeral for a general term may be further marked with a sign to indicate an individual or a particular site. In the following embodiments, the same or similar portion is not repeatedly described in principle except for a particularly required case.

Furthermore, a sectional view for explaining each embodiment may not be hatched for better viewability. A plan view may be hatched for better viewability.

In the sectional views and the plan views, size of each site does not correspond to size of an actual device, and a particular site may be illustrated to be relatively large for better viewability. Even if a sectional view corresponds to a plan view, a particular site may be illustrated to be relatively large for better viewability.

First Embodiment

A semiconductor device of a first embodiment is now described in detail with reference to the accompanying drawings.

Figure 1:
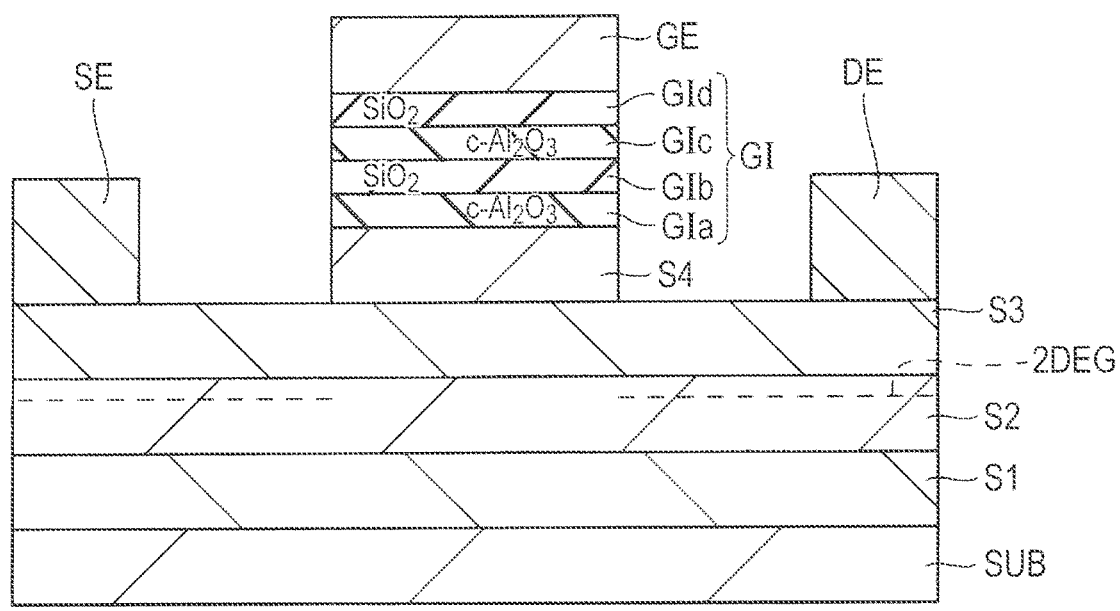
FIG. 1 is a sectional view illustrating a schematic configuration of a semiconductor device of a first embodiment.

FIG. 1 is a sectional view illustrating a schematic configuration of the semiconductor device of the first embodiment.

The semiconductor device of FIG. 1 is a metal-oxide-semiconductor field effect transistor (MOSFET, MISFET) using a nitride semiconductor. The semiconductor device may also be referred to as high electron mobility transistor (HEMT). The semiconductor device of FIG. 1 has a structure where a gate electrode is disposed over a mesa part with a gate insulating film in between as described later, and thus may also be referred to as "mesa-type MOS structure".

In the semiconductor device of the first embodiment, as shown in FIG. 1, a first nitride semiconductor layer S1, a second nitride semiconductor layer S2, and a third nitride semiconductor layer S3 are formed in order over a substrate SUB. A mesa part including a fourth nitride semiconductor layer S4 is formed on a part (substantially the middle in FIG. 1) of the third nitride semiconductor layer S3.

The second nitride semiconductor layer S2 has an electron affinity equal to or larger than that of the first nitride semiconductor layer S1 (S1≤S2).

The third nitride semiconductor layer S3 has an electron affinity smaller than that of the first nitride semiconductor layer S1 (S1>S3).

The fourth nitride semiconductor layer S4 has an electron affinity larger than that of the first nitride semiconductor layer S1 (S4>S1).

The first nitride semiconductor layer S1, which may be referred to as buffer layer, is made of AlGaN, for example. The second nitride semiconductor layer S2, which may be referred to as channel layer, is made of GaN, for example. The third nitride semiconductor layer S3, which may be referred to as barrier layer (electron supply layer), is made of AlGaN, for example. However, the third nitride semiconductor layer S3 has a larger proportion of Al than the first nitride semiconductor layer S1. The mesa part including the fourth nitride semiconductor layer S4, which may be referred to as 2DEG cancel layer (2DEG suppression layer, cap layer), is made of GaN, for example.

The planar shape of the mesa part including the fourth nitride semiconductor layer S4 is, for example, a rectangular shape having a long side in a paper depth direction.

A gate electrode GE is formed over the mesa part including the fourth nitride semiconductor layer S4 with a gate insulating film GI in between. A source electrode SE is formed over the third nitride semiconductor layer S3 on one side (left side in FIG. 1) of the mesa part including the fourth nitride semiconductor layer S4, and a drain electrode DE is formed over the third nitride semiconductor layer S3 on the other side (right side in FIG. 1) thereof.

Figure 16:
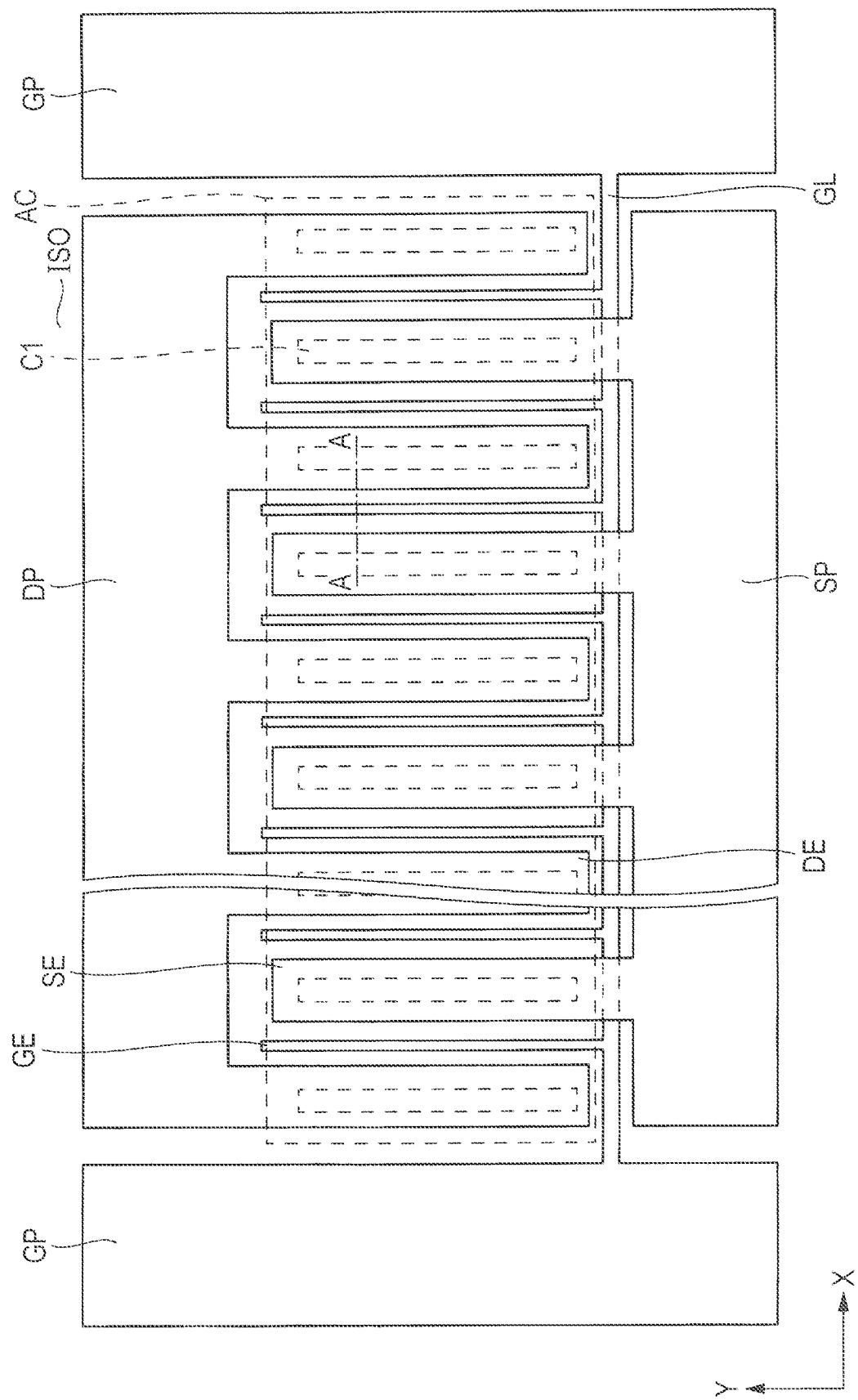
FIG. 16 is a plan view illustrating a configuration of the semiconductor device of the first embodiment.

The planar shape of a stack of the gate electrode GE and the gate insulating film (GI) is a rectangular shape having a long side in the paper depth direction (see FIG. 16). The planar shape of each of the source electrode SE and the drain electrode DE is also a rectangular shape having a long side in the paper depth direction (see FIG. 16). The paper depth direction corresponds to a Y direction in FIG. 16.

The two-dimensional electron gas (2DEG) is generated in the vicinity of the interface between the second nitride semiconductor layer (channel layer) S2 and the third nitride semiconductor layer (barrier layer) S3 and in the second nitride semiconductor layer S2. The fourth nitride semiconductor layer S4 has a function of suppressing the 2DEG. The function of suppressing the 2DEG may be a function of reducing concentration of the two-dimensional electron gas (2DEG). The fourth nitride semiconductor layer S4 therefore may also be referred to as 2DEG cancel layer.

Hence, when a predetermined voltage (threshold voltage) is applied to the gate electrode GE, a channel is formed below the gate electrode GE, and a portion between the 2DEG regions becomes conductive by the channel, leading to an on state of the transistor. That is, normally-off operation can be achieved.

In the first embodiment, the gate insulating film GI includes a first gate insulating film GIa formed on the mesa part including the fourth nitride semiconductor layer S4, a second gate insulating film GIb formed on the first gate insulating film GIa, a third gate insulating film GIc formed on the second gate insulating film GIb, and a fourth gate insulating film GId formed on the third gate insulating film GIc. The first gate insulating film GIa and the third gate insulating film GIc are made of crystalline aluminum oxide (c-$Al_2O_3$). The second gate insulating film GIb and the fourth gate insulating film GId are made of silicon oxide ($SiO_2$). In other words, the first embodiment uses a film stack, which is formed by alternately stacking the crystalline $Al_2O_3$ films and the $SiO_2$ films from the bottom side, as the gate insulating film GI. In other words, the first embodiment uses a film stack, which is formed by repeatedly stacking the two-layer films including the crystalline $Al_2O_3$ films and the overlying $SiO_2$ films, (uses a film stack of at least two layers) as the gate insulating film GI. The above-described compositional ratio between Al, Si, and oxygen (O) is not limitative.

As described above, in the first embodiment, the film stack, which is formed by alternately stacking the crystalline $Al_2O_3$ films and the $SiO_2$ films from the bottom side, is used as the gate insulating film GI; hence, a threshold voltage (Vt) can be shifted in a positive direction. That is, the threshold voltage (Vt) can be increased.

Figure 2A:
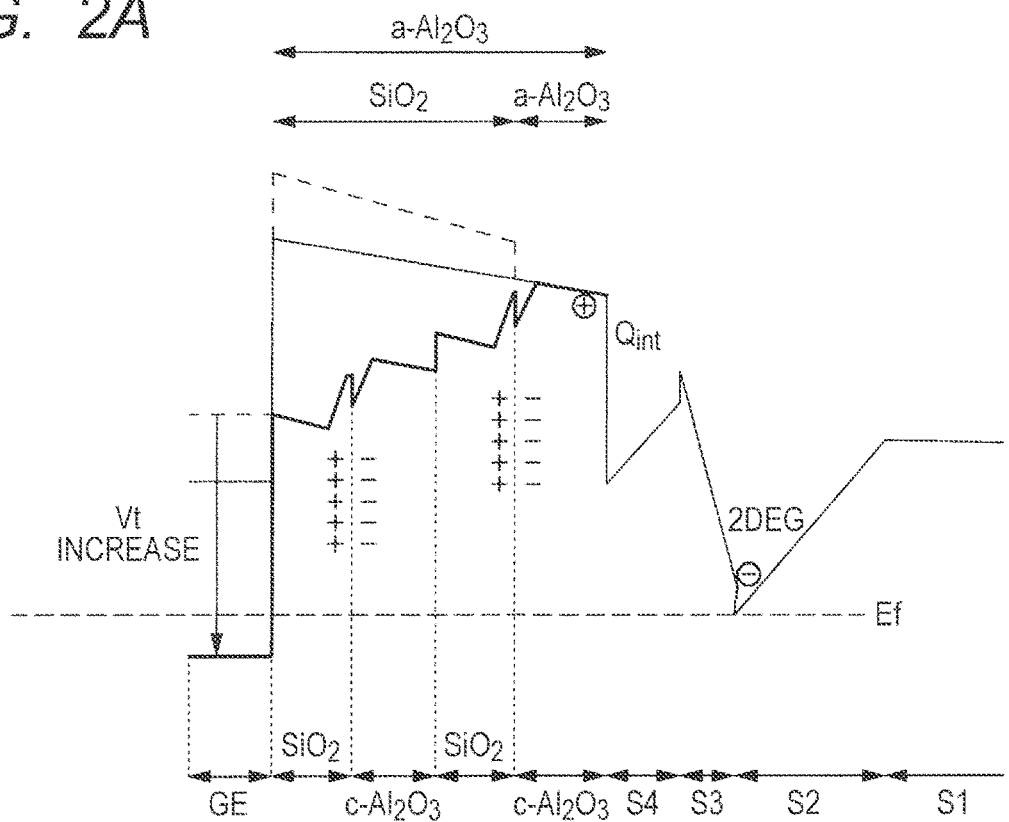
FIGS. 2A and 2B are each an energy band diagram of the semiconductor device of the first embodiment.
Figure 2B:
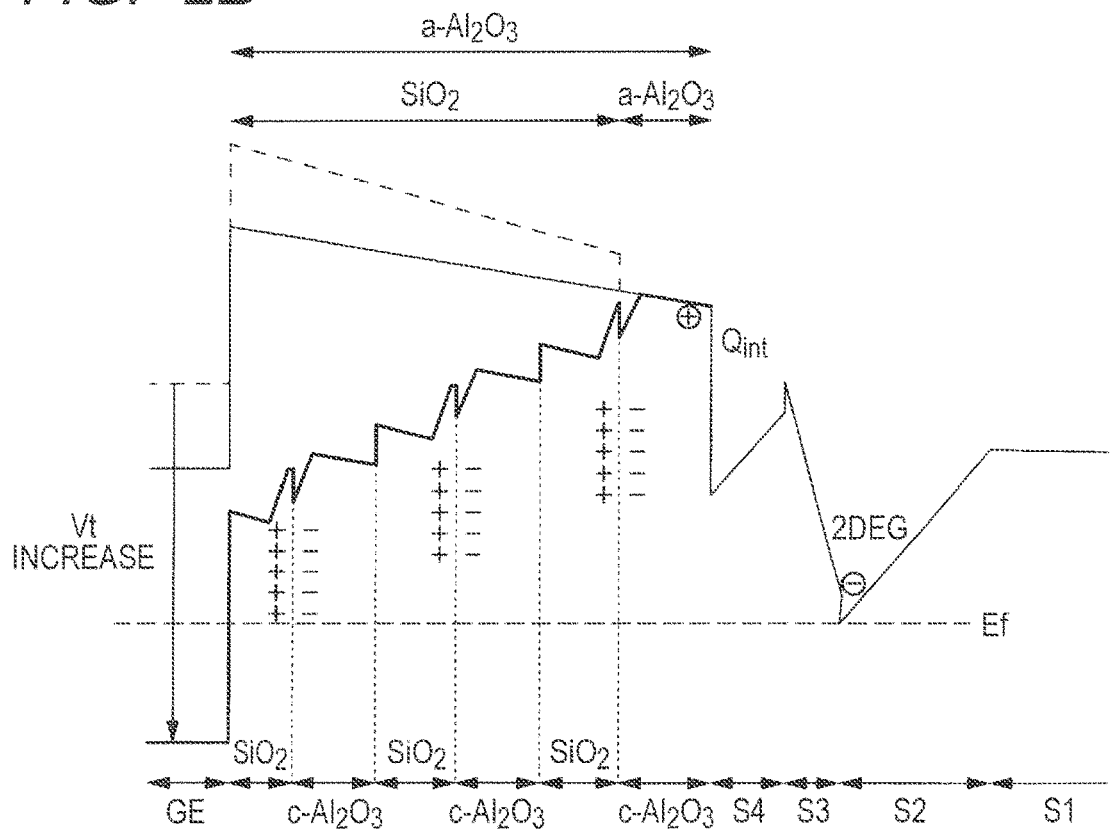
Figure 9:
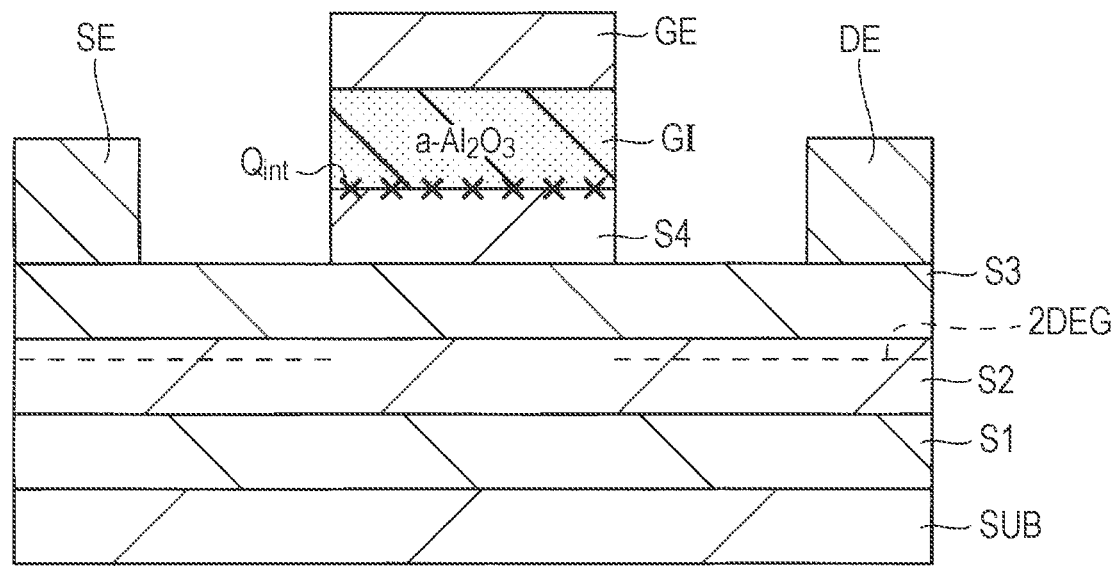
FIG. 9 is a sectional view illustrating a configuration of a semiconductor device of a first comparative example.
Figure 10:
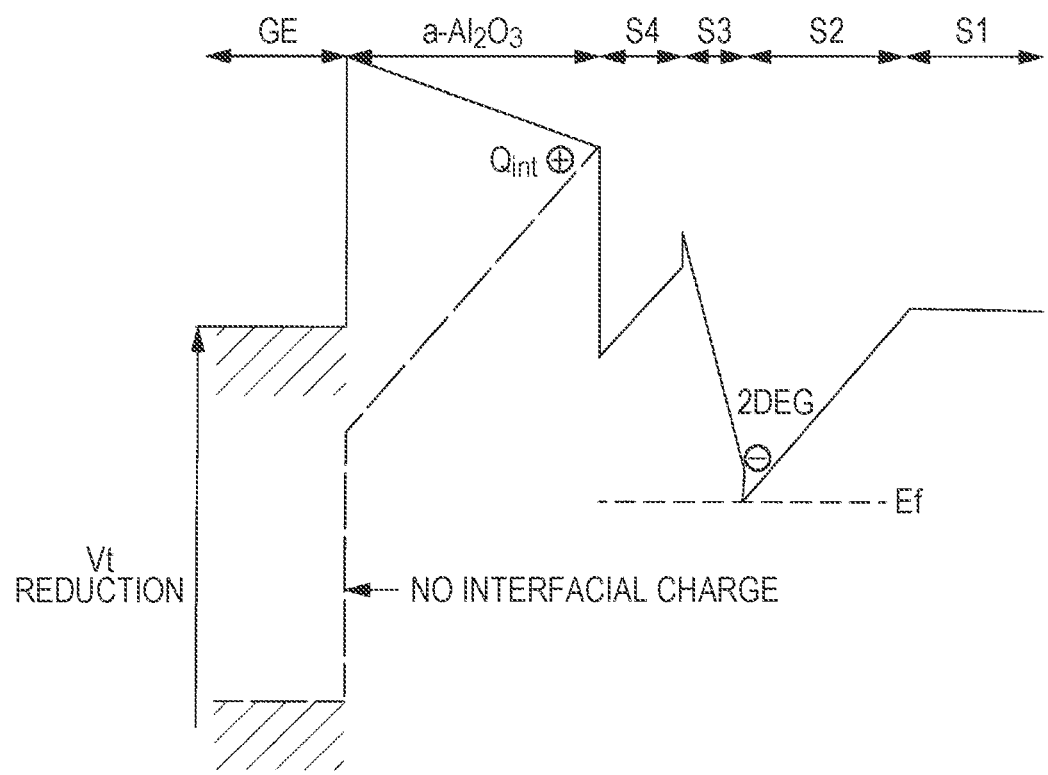
FIG. 10 is an energy band diagram of the semiconductor device of the first comparative example.
Figure 11:
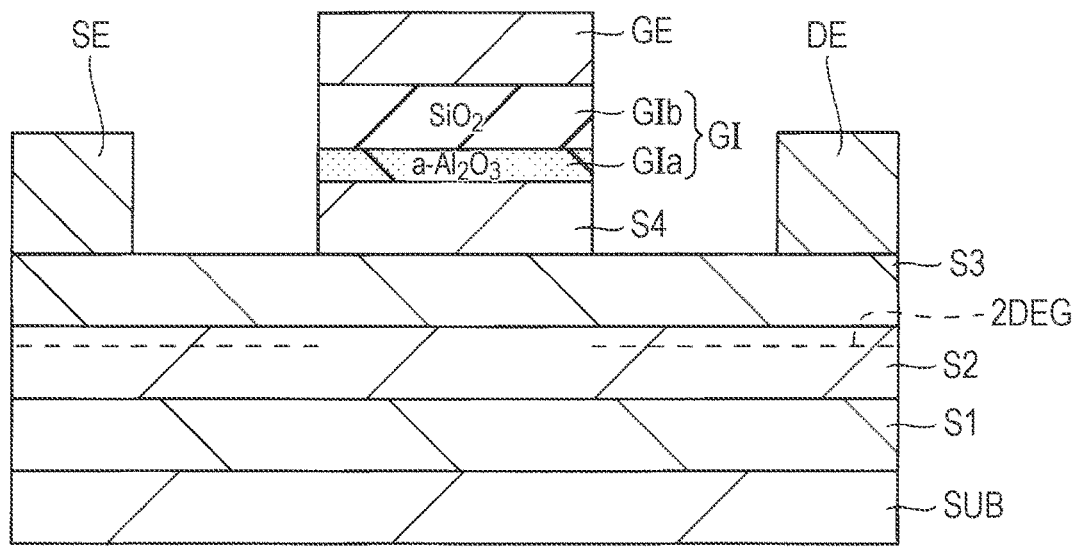
FIG. 11 is a sectional view illustrating a configuration of a semiconductor device of a second comparative example.
Figure 12:
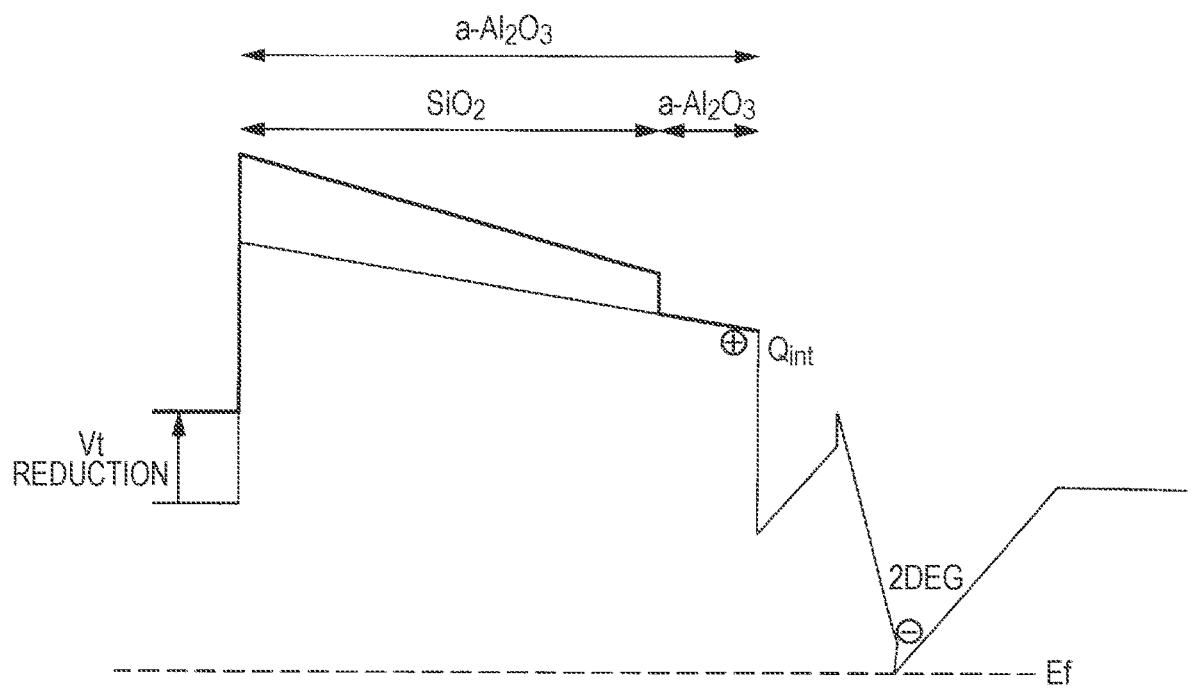
FIG. 12 is an energy band diagram of the semiconductor device of the second comparative example.
Figure 13:
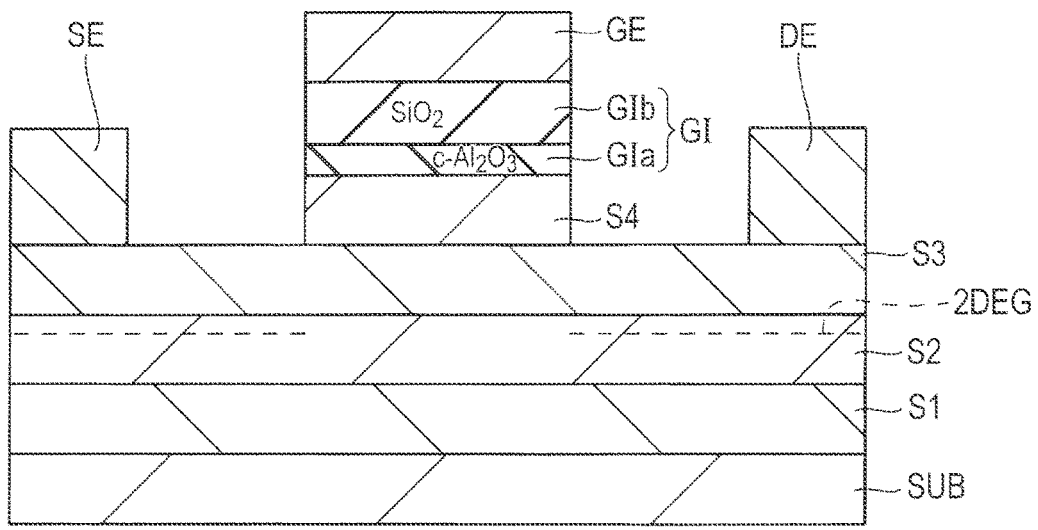
FIG. 13 is a sectional view illustrating a structure of a semiconductor device using a film stack of a crystalline $Al_2O_3$ film and an overlying $SiO_2$ film as a gate insulating film.
Figure 14:
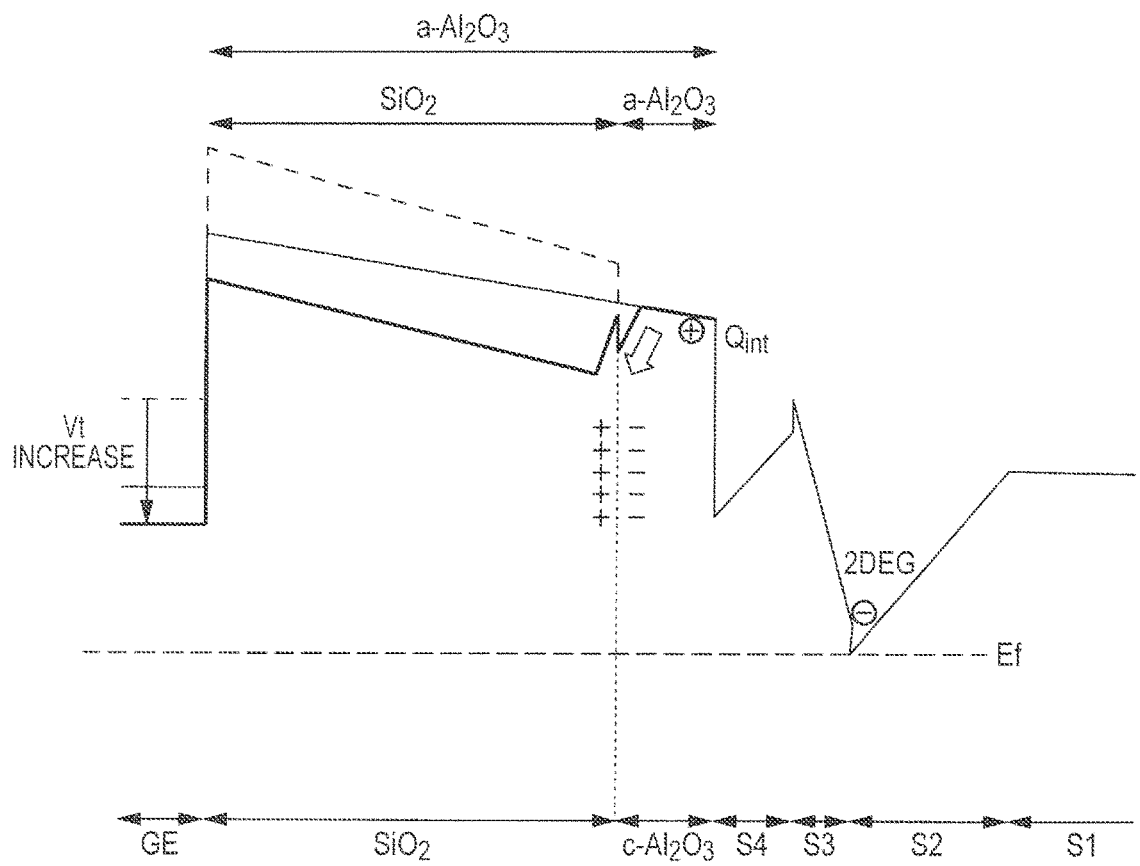
FIG. 14 is an energy band diagram of the semiconductor device using the film stack of the crystalline $Al_2O_3$ film and an overlying $SiO_2$ film as the gate insulating film.

Such an effect of increasing the threshold voltage (Vt) of the first embodiment is described with reference to FIGS. 1 to 14. FIGS. 2A and 2B are each an energy band diagram of the semiconductor device of the first embodiment. FIGS. 3 to 8 are each a sectional view illustrating a formation process of the gate insulating film and the gate electrode of the first embodiment. FIG. 9 is a sectional view illustrating a structure of a semiconductor device of a first comparative example. FIG. 10 is an energy band diagram of the semiconductor device of the first comparative example. FIG. 11 is a sectional view illustrating a structure of a semiconductor device of a second comparative example. FIG. 12 is an energy band diagram of the semiconductor device of the second comparative example. FIG. 13 is a sectional view illustrating a structure of a semiconductor device using a film stack of a crystalline $Al_2O_3$ film and an overlying $SiO_2$ film as a gate insulating film. FIG. 14 is an energy band diagram of the semiconductor device using the film stack of the crystalline $Al_2O_3$ film and the overlying $SiO_2$ film as the gate insulating film. The energy band diagram corresponds to the gate electrode, and the gate insulating film and the nitride semiconductor layer below the gate electrode.

A single-layer amorphous $Al_2O_3$ film is used as the gate insulating film GI in the semiconductor device of the first comparative example shown in FIG. 9. In such a case, in a band diagram in design, a level of a gate electrode GE portion is located below the Fermi level (Ef) as shown by a broken line in FIG. 10. In an actual device, however, as shown by a solid line in FIG. 10, a direction of an electric field applied to the gate insulating film (a-$Al_2O_3$ film) GI is inverted and the threshold voltage (Vt) is reduced due to an interfacial positive charge $Q_{int}$ occurring at an interface between the mesa part including the fourth nitride semiconductor layer S4 and the gate insulating film (a-$Al_2O_3$ film) GI.

From the investigation of the inventors, it is found that although the film stack of the $SiO_2$ film and the overlying amorphous $Al_2O_3$ film provides the effect of increasing the threshold voltage in silicon devices, using such a film stack as the gate insulating film does not increase the threshold voltage in nitride semiconductor devices.

Various film stacks have been examined as the gate insulating film in a further investigation of the inventors. As a result, when a film stack including a $SiO_2$ film stacked on an $Al_2O_3$ film is used as the gate insulating film contrary to the case of the silicon device, an effect of increasing the threshold voltage has been confirmed in some nitride semiconductor device. Through further analysis, it has been found that the effect of increasing the threshold voltage is given when the lower layer, $Al_2O_3$, is crystallized.

For example, as in the semiconductor device of the second comparative example as shown in FIG. 11, when a film stack of an amorphous $Al_2O_3$ film and an overlying $SiO_2$ film is used as the gate insulating film GI, the energy band is as shown by a thick black solid line in FIG. 12. That is, since the interfacial positive charge $Q_{int}$ occurring at an interface between the mesa part including the fourth nitride semiconductor layer S4 and the gate insulating film (a-$Al_2O_3$ film) GI is not changed, the direction of the electric field remains inverted. In addition, $SiO_2$ has a smaller electron affinity and a lower dielectric constant than $Al_2O_3$, causing a high field strength. Hence, the threshold voltage (Vt) is further reduced compared with the case of the first comparative example (FIGS. 9 and 10).

On the other hand, when a film stack of a crystalline $Al_2O_3$ film to be the first gate insulating film GIa and an overlying $SiO_2$ film to be the second gate insulating film GIb is used as the gate insulating film GI as shown in FIG. 13, the threshold voltage (Vt) can be increased compared with the case of the second comparative example (FIGS. 11 and 12) as shown in FIG. 14. In other words, the threshold voltage (Vt) can be shifted in a positive direction.

The effect of increasing the threshold voltage (Vt) can be explained by the following "dipole model" from comparison between the first comparative example, the second comparative example, and the semiconductor device of FIG. 13.

Specifically, dipole is formed at a boundary between the crystalline $Al_2O_3$ film and the $SiO_2$ film in the film stack of the crystalline $Al_2O_3$ film and the overlying $SiO_2$ film. Such dipole has negative charge (−) on a crystalline $Al_2O_3$ film side and positive charge (+) on a $SiO_2$ film side (see FIG. 14). A distance between the positive charge and the negative charge is 1 nm or less. In the vicinity of the boundary between the crystalline $Al_2O_3$ film and the $SiO_2$ film, at which the dipole (charge pair) exists, an electric field is applied in a direction in which an electric field, which is caused by the interfacial positive charge $Q_{int}$ occurring at the interface between the crystalline $Al_2O_3$ film and the mesa part including the fourth nitride semiconductor layer S4, is cancelled (see a thick arrow in FIG. 14). As a result, the threshold voltage (Vt) can be increased compared with the case of the first or second comparative example. Although an applicable range of an electric field is narrow, 1 nm or less, as described above, charge amount (charge amount of each of positive charge and negative charge) is about one order higher than the amount of the interfacial positive charge $Q_{int}$, leading to a change in potential energy effective in increasing the threshold voltage.

Furthermore, when a film, which is formed by repeatedly stacking the two-layer films including the crystalline $Al_2O_3$ films and the overlying $SiO_2$ films, is used as in the first embodiment (FIG. 1), the threshold voltage (Vt) can be further increased as shown in FIGS. 2A and 2B. In this description, the films configuring the gate insulating film GI include a crystalline $Al_2O_3$ film (GIa), a $SiO_2$ film (GIb), a crystalline $Al_2O_3$ film (GIc), and a $SiO_2$ film (GId) in order from the bottom side.

As described above, even if dipole is formed at the boundary between the crystalline $Al_2O_3$ film (GIa) and the $SiO_2$ film (GIb), formation of reverse dipole, i.e., dipole including positive charge (+) on the $SiO_2$ film side and negative charge (−) on the $Al_2O_3$ film side, cancels the effect of increasing the threshold voltage by the dipole. However, when an amorphous $Al_2O_3$ film is formed on the $SiO_2$ film (GIb), the reverse dipole is not formed. In addition, even if the amorphous $Al_2O_3$ film is formed and crystallized by heat treatment and thus formed into a crystalline $Al_2O_3$ film (GIc), the reverse dipole is not formed.

Hence, whenever the two-layer films including the crystalline $Al_2O_3$ films and the overlying $SiO_2$ films are stacked, the threshold voltage is cumulatively increased, so that the threshold voltage (Vt) can be made positive. In addition, the threshold voltage (Vt) can be easily adjusted. FIG. 2A shows a band diagram for a stack of two layers of the two-layer film including the crystalline $Al_2O_3$ film and the overlying $SiO_2$ film (four layers in total). FIG. 2B shows a band diagram for a stack of three layers of the two-layer film including the crystalline $Al_2O_3$ film and the overlying $SiO_2$ film (six layers in total). In the case shown in FIGS. 2A and 2B, a level of the gate electrode GE portion is located below the Fermi level (Ef).

In this way, even if the interfacial positive charge $Q_{int}$ occurs between the mesa part including the fourth nitride semiconductor layer S4 and the gate insulating film (a-$Al_2O_3$ film) GI by the dipole at the boundary between the crystalline $Al_2O_3$ film and the $SiO_2$ film, the threshold voltage (Vt) can be increased. Furthermore, when the film stacks including the crystalline $Al_2O_3$ films and the $SiO_2$ films are repeatedly stacked, the amorphous $Al_2O_3$ film stacked on the $SiO_2$ film prevents formation of the reverse dipole that cancels the effect of the dipole. In addition, even if the amorphous $Al_2O_3$ film is formed and then crystallized, the reverse dipole is not formed. Hence, the film stacks including the crystalline $Al_2O_3$ films and the $SiO_2$ films are repeatedly stacked, thereby the threshold voltage is cumulatively increased, so that the threshold voltage (Vt) can be made positive. In addition, the threshold voltage (Vt) can be easily adjusted.

In the formation of the $SiO_2$ film on the $Al_2O_3$ film, when the $SiO_2$ film is formed in an atmosphere of 800° C. or higher, the $Al_2O_3$ film as the lower layer may be amorphous. In such a case, the $Al_2O_3$ film is exposed to the above atmosphere, thereby the $SiO_2$ film is formed on the $Al_2O_3$ film of which at least the surficial portion is concurrently crystallized; hence, the dipole is formed.

The effect of increasing the threshold voltage by the dipole is now quantitatively described from the viewpoint of charge. For example, when thickness of the $Al_2O_3$ film on the interface, at which the interfacial positive charge $Q_{int}$ of $1 \times 10^{12}$ $cm^{-2}$ exists, is assumed to be 60 nm, the threshold voltage is reduced by 1.2 V. On the other hand, the dipole charge occurring at the interface between the crystalline $Al_2O_3$ film and the $SiO_2$ film in the first embodiment is $3.5 \times 10^{13}$ $cm^{-2}$, which is an order of magnitude greater than the interfacial positive charge $Q_{int}$, leading to the effect of an increase in the threshold voltage of 0.7 V. Hence, the effect of an increase in the threshold voltage of 1.4 V is given by stacking the film stacks two times, and an increase of 2.1 V is given by stacking the film stacks three times. In such a case, the film stacks are stacked at least two times, thereby the effect of increasing the threshold voltage is obtained beyond the effect of reducing the threshold voltage by the interfacial positive charge $Q_{int}$.

A manufacturing process of the gate insulating film, the gate electrode, and the like of the semiconductor device of the first embodiment is now described with reference to FIGS. 3 to 8, while a stacking state of the $Al_2O_3$ film and the $SiO_2$ film and formation of the dipole are described.

Figure 3:
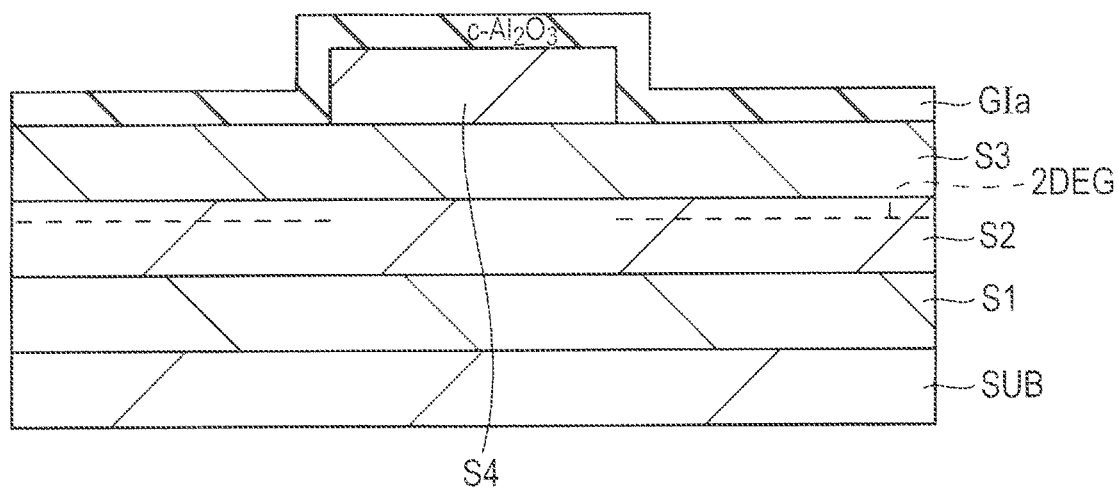
FIG. 3 is a sectional view illustrating a formation process of a gate insulating film and a gate electrode of the first embodiment.

A substrate SUB as shown in FIG. 3 is provided, and first to third nitride semiconductor layers (S1 to S3) are formed in order. A semiconductor substrate made of, for example, silicon (Si) is used as the substrate SUB. Subsequently, an AlGaN layer (Al proportion 5%) as the first nitride semiconductor layer (buffer layer) S1, a GaN layer as the second nitride semiconductor layer (channel layer) S2, and an AlGaN layer (Al proportion 22%) as the third nitride semiconductor layer (barrier layer) S3 are epitaxially grown in order over the substrate SUB. Subsequently, a GaN layer is epitaxially grown as a fourth nitride semiconductor layer S4 on the third nitride semiconductor layer S3, and then an undepicted mask film is formed in a formation region of a mesa part, and the fourth nitride semiconductor layer S4 is etched with the mask film as a mask. As a result, the mesa part is formed.

Subsequently, the gate insulating film GI and the gate electrode GE are formed over the mesa part including the fourth nitride semiconductor layer S4. For example, as shown in FIG. 3, a crystalline aluminum oxide (c-$Al_2O_3$) is formed as the first gate insulating film GIa on the mesa part including the fourth nitride semiconductor layer S4 and on the third nitride semiconductor layer S3. First, amorphous aluminum oxide (a-$Al_2O_3$) is deposited at a deposition temperature of 300° C. so as to have a thickness of 5 nm using an atomic layer deposition (ALD) process. Subsequently, the amorphous aluminum oxide (a-$Al_2O_3$) is subjected to heat treatment for 10 min at 800° C. in an inert gas (for example, nitrogen) atmosphere. Through the heat treatment, the amorphous aluminum oxide (a-$Al_2O_3$) is crystallized and thus formed into the crystalline aluminum oxide (c-$Al_2O_3$).

Herein, crystallization means treatment to produce grains, and the crystalline aluminum oxide (c-$Al_2O_3$) has a number of grains. The crystalline aluminum oxide may therefore be referred to as polycrystalline aluminum oxide. The average grain size of the grains is preferably similar (±80%) to the thickness of the aluminum oxide film (a-$Al_2O_3$, c-$Al_2O_3$).

Although the thickness of the aluminum oxide film (a-$Al_2O_3$, c-$Al_2O_3$) is about 5 nm in this case, the thickness can be adjusted within a range from 2 to 20 nm, more preferably 5 to 10 nm. The thickness of 2 nm or more allows dipole formation. The thickness is preferably 5 nm or more to secure a sufficiently large dipole (increase the charge amount). Although the thickness has no upper limit, when the two-layer films including the crystalline $Al_2O_3$ films and the overlying $SiO_2$ films are repeatedly stacked, the thickness is sufficiently 20 nm or less. The thickness is more preferably 10 nm or less to suppress influence of the interfacial positive charge $Q_{int}$.

Figure 4:
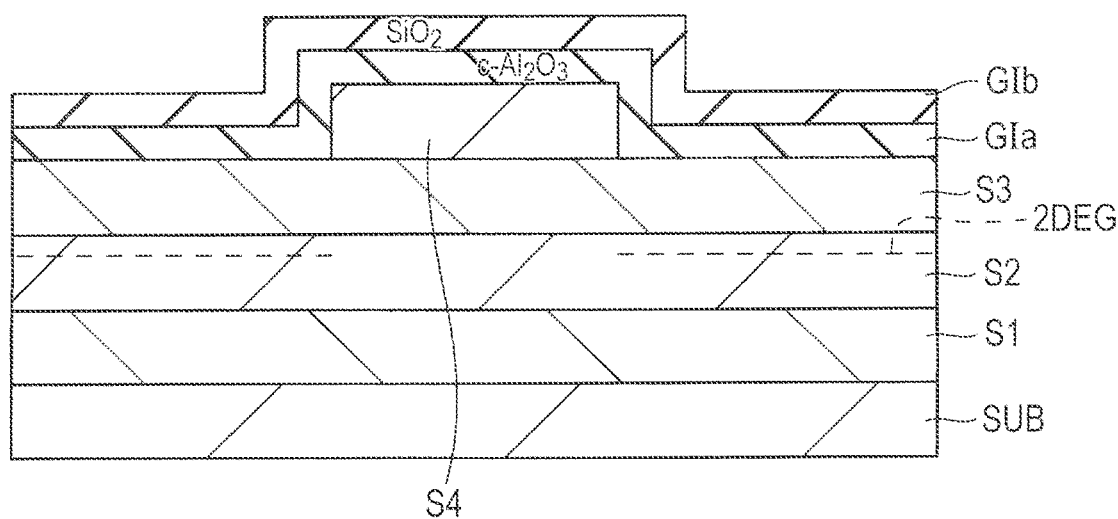
FIG. 4 is a sectional view illustrating the formation process of the gate insulating film and the gate electrode of the first embodiment.

Subsequently, as shown in FIG. 4, a silicon oxide film ($SiO_2$ film) is formed as the second gate insulating film GIb on the first gate insulating film GIa. For example, the silicon oxide film ($SiO_2$ film) is formed at a deposition temperature of 400° C. so as to have a thickness of 10 nm using a low pressure chemical vapor deposition (LPCVD) process. Although the thickness of the silicon oxide film ($SiO_2$ film) is about 10 nm in this case, the thickness can be adjusted within a range from 5 to 20 nm, more preferably 5 to 10 nm. The thickness of 5 nm or more allows dipole formation. Although the thickness has no upper limit, when the two-layer films including the crystalline $Al_2O_3$ films and the overlying $SiO_2$ films are repeatedly stacked, the thickness is sufficiently 20 nm or less. The thickness is more preferably nm or less to suppress influence of the interfacial positive charge $Q_{int}$.

The silicon oxide film ($SiO_2$ film) is formed as the second gate insulating film GIb on the crystalline aluminum oxide (c-$Al_2O_3$); hence, dipole is formed at the interface between such films.

Figure 5:
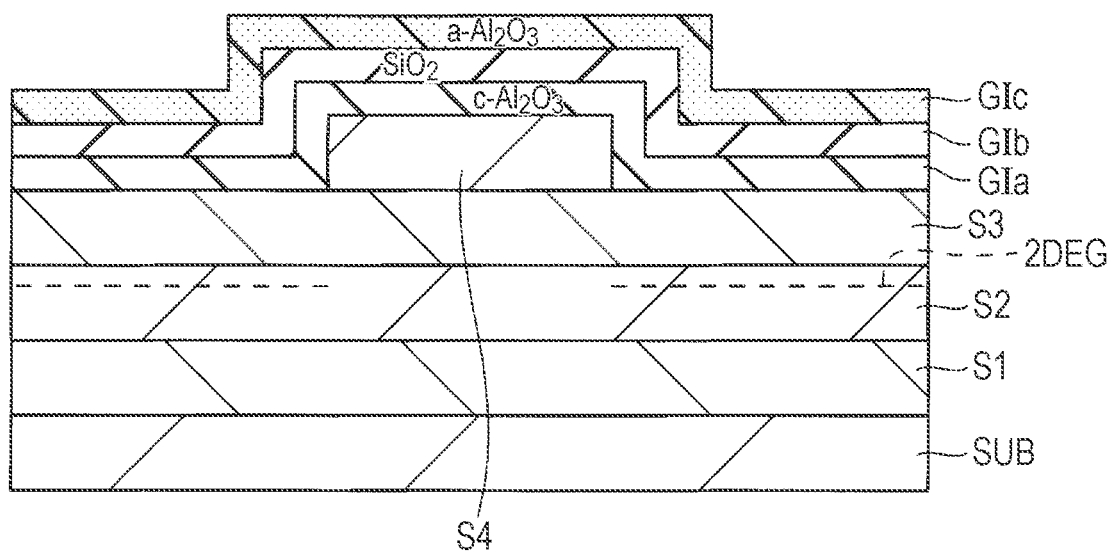
FIG. 5 is a sectional view illustrating the formation process of the gate insulating film and the gate electrode of the first embodiment.
Figure 6:
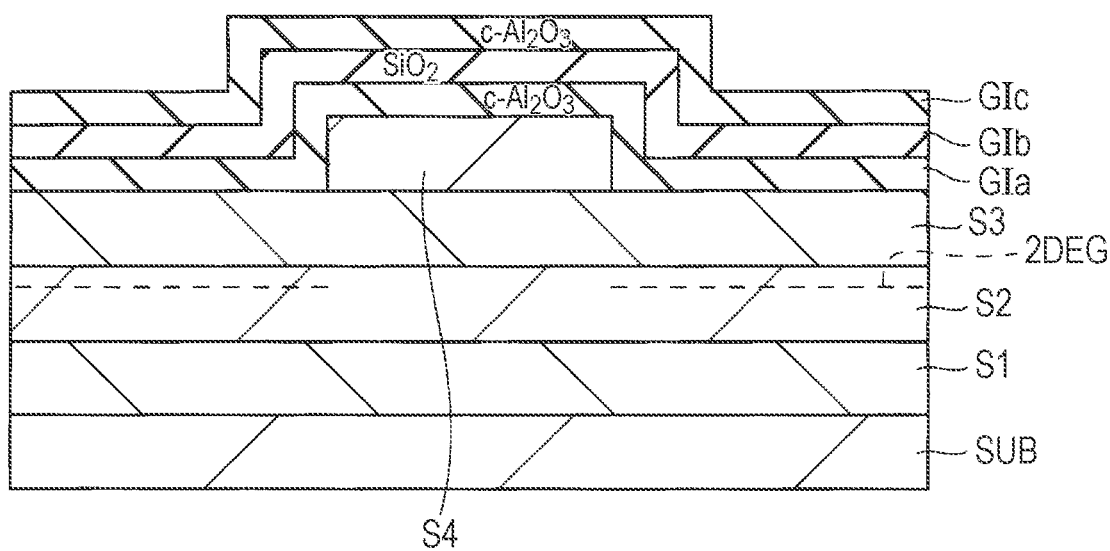
FIG. 6 is a sectional view illustrating the formation process of the gate insulating film and the gate electrode of the first embodiment.

Subsequently, as shown in FIGS. 5 and 6, the crystalline aluminum oxide (c-$Al_2O_3$) is formed as the third gate insulating film GIc on the second gate insulating film GIb. First, as shown in FIG. 5, the amorphous aluminum oxide (a-Al$_2$O$_3$) is formed at a deposition temperature of 300° C. so as to have a thickness of 10 nm using an ALD process.

The amorphous aluminum oxide (a-Al$_2$O$_3$) film is formed on the silicon oxide film (SiO$_2$ film) as the second gate insulating film GIb; hence, no dipole is formed at the interface between such films.

Subsequently, the amorphous aluminum oxide (a-Al$_2$O$_3$) is subjected to heat treatment for 10 min at 800° C. in an inert gas (for example, nitrogen) atmosphere. Through the heat treatment, the amorphous aluminum oxide (a-Al$_2$O$_3$) is crystallized and thus formed into the crystalline aluminum oxide (c-Al$_2$O$_3$) (FIG. 6). The above heat treatment condition is an exemplary condition. However, heat treatment at 800° C. or higher is preferably performed to crystallize the amorphous aluminum oxide (a-Al$_2$O$_3$).

No dipole is formed at the interface between the silicon oxide film (SiO$_2$ film) as the second gate insulating film GIb and the crystalline aluminum oxide (c-Al$_2$O$_3$) as the third gate insulating film GIc even after the heat treatment (crystallization). That is, the state where no dipole exists remains even after the heat treatment (crystallization).

The thickness of the aluminum oxide film (a-Al$_2$O$_3$, c-Al$_2$O$_3$) to be the third gate insulating film GIc can be adjusted within a range from 2 to 20 nm, more preferably 5 to 10 nm. The thickness of 2 nm or more allows dipole formation. The thickness is preferably 5 nm or more to secure a sufficiently large dipole (increase the charge amount). Although the thickness has no upper limit, when the two-layer films including the crystalline Al$_2$O$_3$ films and the overlying SiO$_2$ films are repeatedly stacked, the thickness is sufficiently 20 nm or less. The thickness is more preferably 10 nm or less to suppress influence of the interfacial positive charge $Q_{int}$.

Figure 7:
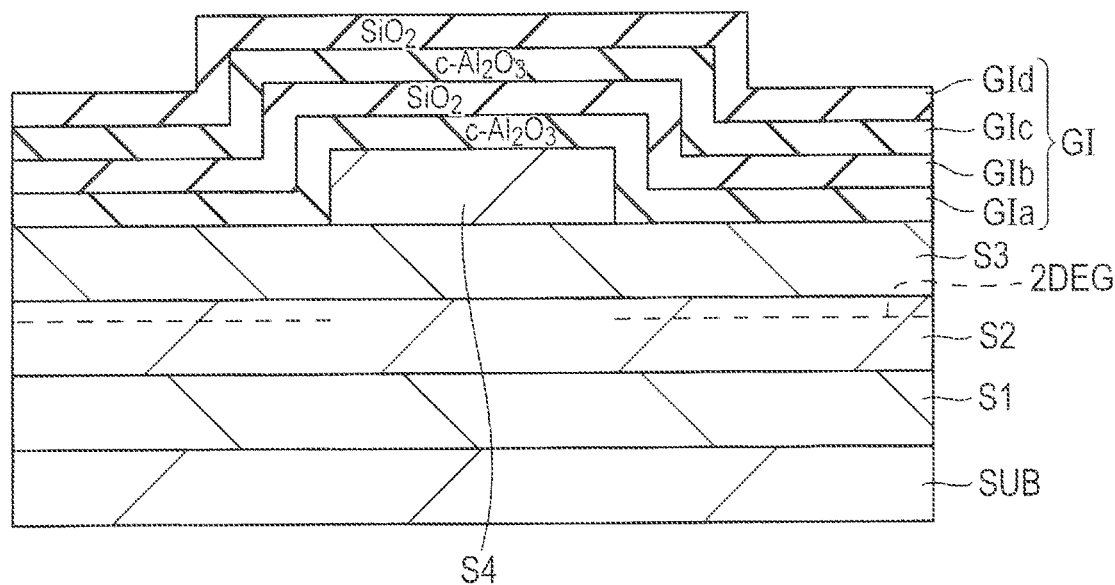
FIG. 7 is a sectional view illustrating the formation process of the gate insulating film and the gate electrode of the first embodiment.

Subsequently, as shown in FIG. 7, a silicon oxide film (SiO$_2$ film) is formed as the fourth gate insulating film GId on the third gate insulating film GIc. For example, the silicon oxide film (SiO$_2$ film) is formed at a deposition temperature of 400° C. so as to have a thickness of 10 nm using a LPCVD process. The thickness of the silicon oxide film (SiO$_2$ film) to be the fourth gate insulating film GId can be adjusted within a range from 5 to 20 nm, more preferably 5 to 10 nm. The thickness of 5 nm or more allows dipole formation. Although the thickness has no upper limit, when the two-layer films including the crystalline Al$_2$O$_3$ film and the overlying SiO$_2$ film are repeatedly stacked, the thickness is sufficiently 20 nm or less. The thickness is more preferably 10 nm or less to suppress influence of the interfacial positive charge $Q_{int}$.

The silicon oxide film (SiO$_2$ film) is formed as the fourth gate insulating film GId on the crystalline aluminum oxide (c-Al$_2$O$_3$); hence, dipole is formed at the interface between such films.

As described above, formation of dipole is not simply due to contact of the Al$_2$O$_3$ film and the SiO$_2$ film, but is due to crystallinity of the Al$_2$O$_3$ film and a stacking order of the films.

Specifically, in a new important finding, the experimental facts of "dipole is formed by forming the silicon oxide film (SiO$_2$ film) on the crystalline aluminum oxide (c-Al$_2$O$_3$)" and "no dipole is formed in the case where the amorphous aluminum oxide (a-Al$_2$O$_3$) is formed on the silicon oxide film (SiO$_2$ film) and crystallized" are used, so that the threshold voltage can be cumulatively increased using the gate insulating film formed by repeatedly stacking the two-layer films including the crystalline Al$_2$O$_3$ films and the overlying SiO$_2$ films. This means a new finding of "dipole formation is not simply due to contact of the Al$_2$O$_3$ film and the SiO$_2$ film" and "dipole polarity between the Al$_2$O$_3$ film and the SiO$_2$ film on nitride semiconductor devices is opposite to that on Si device". The threshold voltage can be increased according to the new finding that is unique to the nitride semiconductor and different from such technology.

Although the gate insulating film GI includes four layers (GIa to GId) in this case, the gate insulating film GI may include six, eight, or at least ten layers.

In this case, the films configuring the gate insulating film GI include the crystalline Al$_2$O$_3$ film (GIa) 5 nm thick, the SiO$_2$ film (GIb) 10 nm thick, the crystalline Al$_2$O$_3$ film (GIc) 10 nm thick, and the SiO$_2$ film (GId) 10 nm thick from the bottom side. This is an example where the film stacks are designed to have the same capacitance value in total as that of a gate insulating film GI including a single-layer Al$_2$O$_3$ film 60 nm thick so that the same gate drive capability is obtained. The gate insulating film GI is therefore not limited to such a thickness configuration. An example where the gate insulating film GI is designed to include six layers is shown in the following. That is, the gate insulating film may include the crystalline Al$_2$O$_3$ film (GIa) 5 nm thick, the SiO$_2$ film (GIb) 5 nm thick, the crystalline Al$_2$O$_3$ film (GIc) 5 nm thick, the SiO$_2$ film (GIb) 5 nm thick, the crystalline Al$_2$O$_3$ film (GIc) 5 nm thick, and the SiO$_2$ film (GId) 10 nm thick, which are stacked in order from the bottom side.

Figure 8:
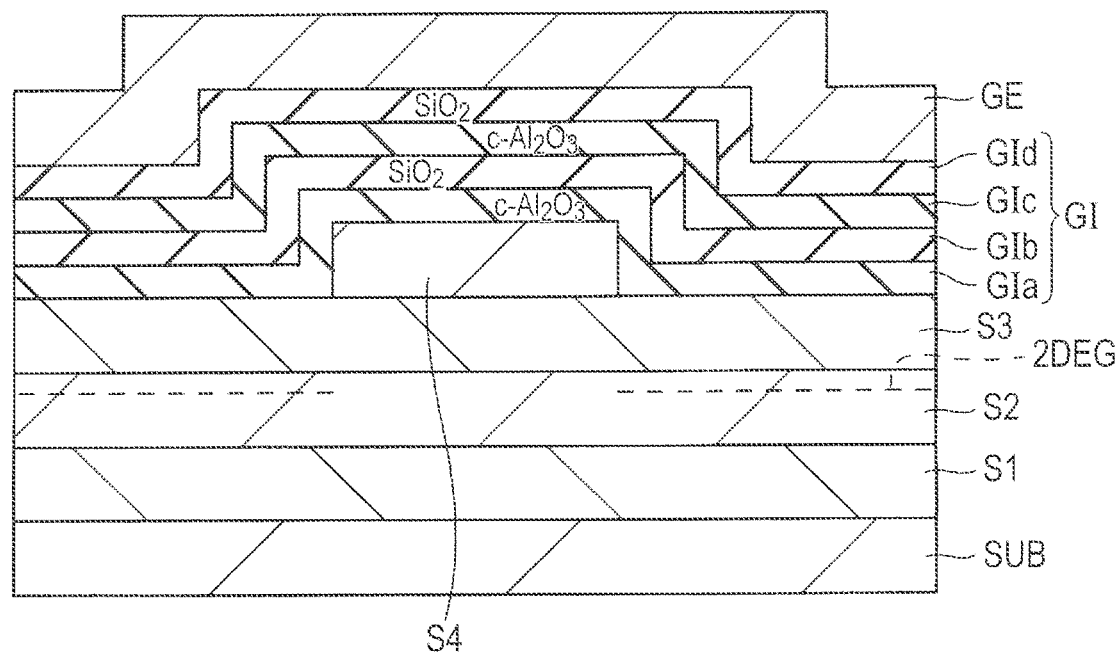
FIG. 8 is a sectional view illustrating the formation process of the gate insulating film and the gate electrode of the first embodiment.

Subsequently, as shown in FIG. 8, for example, a titanium nitride (TiN) film is deposited as a conductive film for the gate electrode GE on the gate insulating film (fourth gate insulating film GId) GI at a thickness of about 100 nm using a sputtering process or the like. Subsequently, an undepicted photoresist film is formed in the formation region of the gate electrode GE, and the conductive film for the gate electrode GE and the underlying gate insulating film GI (GIa to GId) are etched with the photoresist film as a mask. As a result, the gate electrode GE is formed, and the gate insulating film GI (GIa to GId) having the same planar shape as the gate electrode GE is formed under the gate electrode GE (see FIG. 1). Subsequently, the photoresist film is removed.

Subsequently, a source electrode SE and a drain electrode DE are formed. The source electrode SE and the drain electrode DE are formed using a liftoff process, for example. For example, regions other than the formation regions of the source electrode SE and the drain electrode DE are covered with an undepicted photoresist film, and a conductive film is formed above the substrate SUB. For example, an aluminum film is deposited using a sputtering process or the like. Subsequently, the photoresist film is removed, and the conductive film in the regions other than the formation regions of the source and drain electrodes SE and DE are removed.

As described above, the semiconductor device of FIG. 1 can be formed.

Subsequently, the semiconductor device of the first embodiment is further described in detail with reference to FIGS. 15 to 33.

Description of Structure

Figure 15:
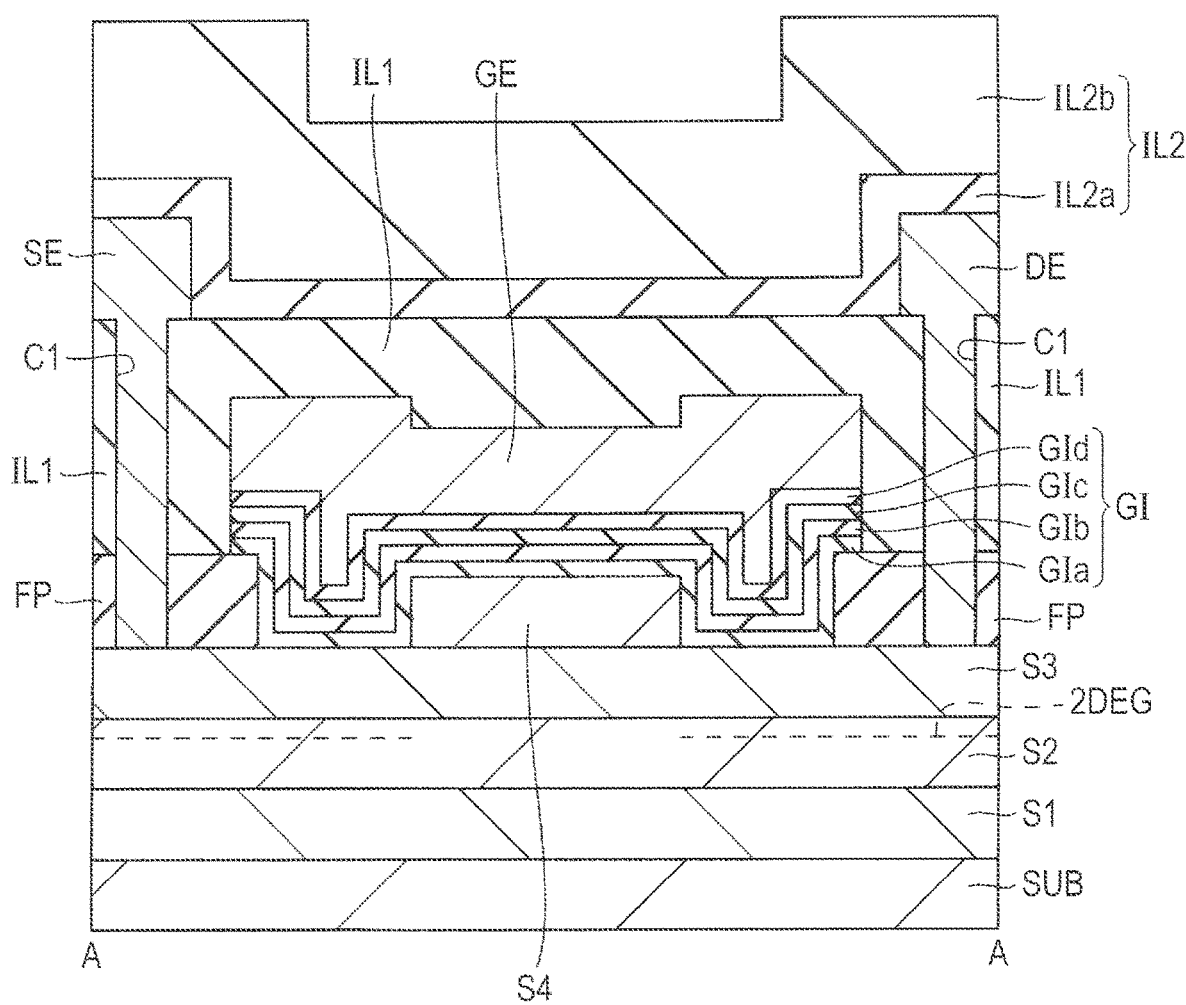
FIG. 15 is a sectional view illustrating the configuration of the semiconductor device of the first embodiment.

FIG. 15 is a sectional view illustrating a configuration of the semiconductor device of the first embodiment. FIG. is a plan view illustrating the configuration of the semiconductor device of the first embodiment. The sectional view of FIG. 15 corresponds to a portion A-A in FIG. 16, for example.

In the semiconductor device of the first embodiment, as shown in FIG. 15, the first nitride semiconductor layer S1, the second nitride semiconductor layer S2, and the third nitride semiconductor layer S3 are formed in order over the substrate SUB. The mesa part including the fourth nitride semiconductor layer S4 is formed on a part of the third nitride semiconductor layer S3. A nucleation layer and an overlying high-resistance buffer layer may be formed over the substrate SUB before formation of the first nitride semiconductor layer S1 and others.

For, example, a semiconductor substrate made of silicon (Si) exposing a (111) plane may be used as the substrate SUB. In addition to the silicon substrate, a SiC or sapphire substrate may be used as the substrate SUB. A substrate made of GaN may also be used. In such a case, the nucleation layer may be omitted.

The nucleation layer includes a nitride semiconductor layer. For example, an aluminum nitride (AlN) layer can be used as the nucleation layer. The high-resistance buffer layer includes one or more nitride semiconductor layers each including a nitride semiconductor doped with an impurity forming a deep level. For example, a superlattice structure (superlattice layer) including a plurality of nitride semiconductor layers can be formed by repeatedly stacking film stacks (AlN/GaN film) including gallium nitride (GaN) layers and aluminum nitride (AlN) layers so as to be used as the high-resistance buffer layer.

Any of the nitride semiconductor layers (III-V compound semiconductor layers) over the substrate SUB is typically formed by group III face growth.

As described above, the first nitride semiconductor layer S1, the second nitride semiconductor layer S2, and the third nitride semiconductor layer S3 are formed in order over the substrate SUB. The mesa part including the fourth nitride semiconductor layer S4 is formed on a part of the third nitride semiconductor layer S3.

The second nitride semiconductor layer S2 has an electron affinity equal to or larger than that of the first nitride semiconductor layer S1 (S1≤S2).

The third nitride semiconductor layer S3 has an electron affinity smaller than that of the first nitride semiconductor layer S1 (S1>S3).

The fourth nitride semiconductor layer S4 has an electron affinity larger than that of the first nitride semiconductor layer S1 (S4>S1).

As described above, the first nitride semiconductor layer S1, which may be referred to as buffer layer, is made of AlGaN, for example. The second nitride semiconductor layer S2, which may be referred to as channel layer, is made of GaN, for example. The third nitride semiconductor layer S3, which may be referred to as barrier layer (electron supply layer), is made of AlGaN, for example. However, the third nitride semiconductor layer S3 has a larger Al proportion than the first nitride semiconductor layer S1. For example, the Al proportion of the first nitride semiconductor layer S1 is 0 to 10%, more preferably 3 to 8%. For example, the Al proportion of the third nitride semiconductor layer S3 is 15 to 30%, more preferably 18 to 22%. The fourth nitride semiconductor layer (2DEG cancel layer) S4 is an undoped layer, and includes, for example, i-GaN, but may include AlGaN having a smaller Al proportion than the first nitride semiconductor layer S1. The fourth nitride semiconductor layer S4 may also include InGaN.

The gate electrode GE is formed over the mesa part including the fourth nitride semiconductor layer S4 with the gate insulating film GI in between. The planar shape of the mesa part is a rectangular shape having a long side in the paper depth direction.

A stack of the gate insulating film (GI) and the gate electrode GE has a planar shape being a rectangular shape having a long side in the paper depth direction (Y direction) (see FIG. 16). The width (length in the X direction, length in the current flow direction from the drain electrode to the source electrode, i.e., in the gate length direction) of the gate electrode GE is larger than the width (length in the X direction) of the mesa part.

A film including four layers (GIa to GId) is formed as the gate insulating film GI in the first embodiment. Specifically, provided is the gate insulating film including a stack of two layers of two-layer film including the crystalline $Al_2O_3$ as the lower layer and the silicon oxide ($SiO_2$) as the upper layer.

As described above, the first embodiment uses film stack, which is formed by repeatedly stacking the two-layer films including the crystalline $Al_2O_3$ films and the overlying $SiO_2$ films, as the gate insulating film GI. The $Al_2O_3$ film on the $SiO_2$ film is formed in an amorphous state and then crystallized. Such a film stack is used as the gate insulating film GI, thereby the threshold voltage (Vt) can be increased as described above.

A field plate insulating film FP is formed on the third nitride semiconductor layer S3 on both sides of the mesa part. In other words, the field plate insulating film FP having an opening is formed over the third nitride semiconductor layer S3, and the mesa part is disposed in the opening. The gate insulating film GI and the gate electrode GE are disposed so as to cover the opening of the field plate insulating film FP. Consequently, the width (length in the X direction) of the opening of the field plate insulating film FP is smaller than the width (length in the X direction) of the gate electrode GE, but larger than the width (length in the X direction) of the mesa part. In this way, the field plate insulating film FP is provided below the end portion of the gate electrode GE, making it possible to increase the withstand voltage of the semiconductor device.

An interlayer insulating film IL1 is formed over the gate electrode GE. The source electrode SE and the drain electrode DE are formed over the third nitride semiconductor layer S3 on the two respective sides of the mesa part (S4). For example, contact holes (coupling holes) C1 are formed in the interlayer insulating film IL1, and the source electrode SE and the drain electrode DE are disposed in and on the respective contact holes C1. An insulating film IL2 is formed over the source electrode SE and the drain electrode DE. The insulating film IL2 is a film stack of a lower film IL2a and an upper film IL2b.

As shown in FIG. 16, the planar shape of the drain electrode DE is a rectangular shape having a long side in the Y direction. The planar shape of the source electrode SE is also a rectangular shape having a long side in the Y direction. A contact hole C1 to be a coupling part (coupling region) between the drain electrode DE and the third nitride semiconductor layer S3 is disposed below the drain electrode DE. The planar shape of the contact hole C1 is a rectangular shape having a long side in the Y direction. A contact hole C1 to be a coupling part (coupling region) between the source electrode SE and the third nitride semiconductor layer S3 is disposed below the source electrode SE. The planar shape of the contact hole C1 is a rectangular shape having a long side in the Y direction.

The gate electrode GE is disposed between the drain electrode DE and the source electrode SE. As described above, the gate electrode GE has a rectangular shape having the long side in the Y direction.

As shown in FIG. 16, a plurality of drain electrodes DE, gate electrodes GE, and source electrodes SE are repeatedly disposed.

Specifically, the planar shape of the drain electrode DE is the rectangular shape having the long side in the Y direction. The plurality of linear drain electrodes DE are arranged in the X direction at a certain interval. The planar shape of the source electrode SE is the rectangular shape having the long side in the Y direction. The plurality of linear source electrodes SE each have a linear shape, and are arranged in the X direction at a certain interval. The source electrodes SE and the drain electrodes DE are alternately arranged along the X direction. The gate electrode GE is disposed between the contact hole C1 below the drain electrode DE and the contact hole C1 below the source electrode SE.

The drain electrodes DE are coupled to one another by a drain pad (terminal part) DP. The drain pad DP is disposed so as to extend in the X direction on one end side (for example, the upper side in FIG. 16) of the drain electrode DE. In other words, the drain electrodes DE are disposed so as to protrude in the Y direction from the drain pad D1 extending in the X direction. Such a shape may be referred to as comblike shape.

The source electrodes SE are coupled to one another by a source pad (terminal part) SP. The source pad SP is disposed so as to extend in the X direction on one end side (for example, the lower side in FIG. 16) of the source electrode SE. In other words, the source electrodes SE are disposed so as to protrude in the Y direction from the source pad SP extending in the X direction. Such a shape may be referred to as comblike shape.

The gate electrodes GE are coupled to one another by a gate line GL. The gate line GL is disposed so as to extend in the X direction on one end side (for example, the lower side in FIG. 16) of the gate electrode GE. In other words, the gate electrodes GE are disposed so as to protrude in the Y direction from the gate line GL extending in the X direction. The gate line GL is coupled to a gate pad GP provided on each side (for example, each of right and left sides in FIG. 16) in the X direction of the gate line GL.

The mesa part of the fourth nitride semiconductor layer S4 is disposed below the gate electrodes GE and the gate line GL with the gate insulating film (GI) in between.

The source electrodes SE, the drain electrodes DE, and the gate electrodes GE are disposed mainly over an active region AC surrounded by an element isolation region ISO. The planar shape of the active region AC is a rectangular shape having a long side in the X direction. The drain pad DP, the gate line GL, and the source pad SP are disposed over the element isolation region ISO. The gate line GL is disposed between the active region AC and the source pad SP. In the element isolation region ISO, an ion species such as boron (B) or nitrogen (N) is implanted by ion implantation or the like, so that crystallinity of the nitride semiconductor layer is disrupted.

Description of Manufacturing Method

A method of manufacturing the semiconductor device of the first embodiment is now described with reference to FIGS. 17 to 33 while the configuration of the semiconductor device is further clarified. FIGS. 17 to 33 are each a sectional view illustrating a manufacturing process of the semiconductor device of the first embodiment.

Figure 17:
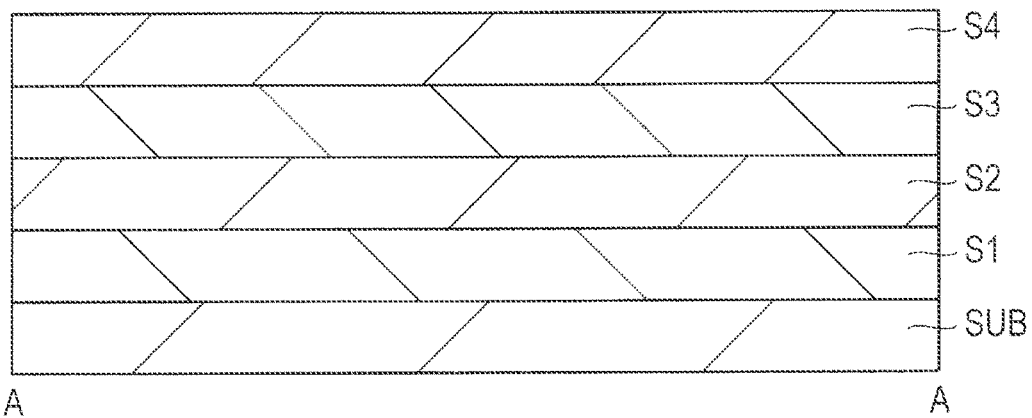
FIG. 17 is a sectional view illustrating a manufacturing process of the semiconductor device of the first embodiment.

As show in FIG. 17, the substrate SUB is provided, and the first to fourth nitride semiconductor layers (S1 to S4) are formed in order. For example, a semiconductor substrate made of silicon (Si) exposing a (111) plane is used as the substrate SUB. In addition to such a silicon substrate, a substrate made of SiC or sapphire may be used as the substrate SUB. A substrate made of GaN may also be used. Any of subsequently formed nitride semiconductor layers (III-V compound semiconductor layers) is typically formed by group III face growth (herein, gallium face growth or aluminum face growth). A nucleation layer and a high-resistance buffer layer may be formed on the substrate SUB before the first to fourth nitride semiconductor layers (S1 to S4) are formed in order. For example, an aluminum nitride (AlN) layer can be used as the nucleation layer, which can be formed by epitaxial growth using a metal organic chemical vapor deposition (MOCVD) process, for example. A superlattice structure, which is formed by repeatedly stacking film stacks (AlN/GaN film) including gallium nitride (GaN) layers and aluminum nitride (AlN) layers, can be used as the high-resistance buffer layer. Such a superlattice structure can be formed by alternate epitaxial growth of the gallium nitride (GaN) layer and the aluminum nitride (AlN) layer using the metal organic chemical vapor deposition process, for example.

Subsequently, an AlGaN layer (Al proportion 5%) is epitaxially grown about 1 μm as the first nitride semiconductor layer (buffer layer) S1 over the substrate SUB using a metal organic chemical vapor deposition process or the like. The constituent element ratio of the AlGaN layer can be adjusted within a range of X of 0 to 0.1 ($0 \leq X \leq 0.1$), more preferably X of 0.03 to 0.08 ($0.03 \leq X \leq 0.08$) for $Al_xGa_{1-x}N$, for example. For an Al proportion of 5%, X is 0.05. The AlGaN layer is an undoped layer, for example. That is, the AlGaN layer is not intentionally doped with an n-type or p-type impurity.

Subsequently, a GaN layer is epitaxially grown about 40 nm as the second nitride semiconductor layer (channel layer) S2 on the first nitride semiconductor layer S1 using a metal organic chemical vapor deposition process or the like.

Subsequently, an AlGaN layer (Al proportion 22%) is epitaxially grown about 14 nm as the third nitride semiconductor layer (barrier layer) S3 on the second nitride semiconductor layer S2 using a metal organic chemical vapor deposition process or the like. For a constituent element ratio of the AlGaN layer, Z is larger than X, 0.15 to less than 0.3 ($0.15 \leq Z < 0.3$), more preferably 0.18 to 0.22 ($0.18 \leq Z \leq 0.22$) for $Al_zGa_{1-z}N$, for example.

As described above, the two-dimensional electron gas (2DEG) is generated at the interface between the second nitride semiconductor layer (channel layer) S2 and the third nitride semiconductor layer (barrier layer) S3 and in the second nitride semiconductor layer S2.

Subsequently, a GaN layer is epitaxially grown about 25 nm as the fourth nitride semiconductor layer S4 on the third nitride semiconductor layer S3 using a metal organic chemical vapor deposition process or the like. The 2DEG disappears through such formation of the fourth nitride semiconductor layer S4.

The first to fourth nitride semiconductor layers S1 to S4 are each grown while a carrier gas and a source gas are introduced into an apparatus, for example. A gas containing constituent elements of the nitride semiconductor layer (herein, AlGaN layer or GaN layer) is used as the source gas. For example, for formation of the AlGaN layer, trimethyl aluminum (TMA1), trimethyl gallium (TMG), and ammonia are used as the source gases of Al, Ga, and N, respectively. For example, for formation of the GaN layer, trimethyl gallium (TMG) and ammonia are used as the source gases of Ga and N, respectively. Thus, the epitaxial growth process allows the constituent element ratio of each layer to be easily and accurately adjusted through control of flow rate of the source gas. Furthermore, the epitaxial growth process allows layers having different element configurations to be formed easily and continuously through switching of the source gas.

Subsequently, an element isolation region (ISO), which cannot be shown in the section of FIG. 17, is formed (see FIG. 16). For example, a protective film such as an insulating film is formed to cover over the fourth nitride semiconductor layer S4, and an undepicted photoresist film to open the element isolation region is formed on the protective film by photolithography processing. Subsequently, boron ions are implanted through the protective film with the photoresist film as a mask to form the element isolation region (ISO). In this way, the ion species such as boron (B) or nitrogen (N) is implanted, thereby crystallinity of the nitride semiconductor layer is disrupted, so that the element isolation region (ISO) is formed.

For example, boron ions are implanted at a density of about $1\times10^{14}$ to $4\times10^{14}$ cm$^{-2}$ into part of the stack including the first to fourth nitride semiconductor layers S1 to S4. The implantation energy is about 100 to 200 keV, for example. The implantation condition of the boron ions is adjusted such that the implantation depth, i.e., the bottom of the element isolation region (ISO) is located below the bottom surface of the third nitride semiconductor layer (barrier layer) S3, for example. In this way, the element isolation region (ISO) is formed. The region surrounded by the element isolation region (ISO) corresponds to the active region AC. As shown in FIG. 16, the active region AC has a substantially rectangular shape. Subsequently, the photoresist film is removed by plasma stripping processing or the like, and then the protective film is removed.

Figure 18:
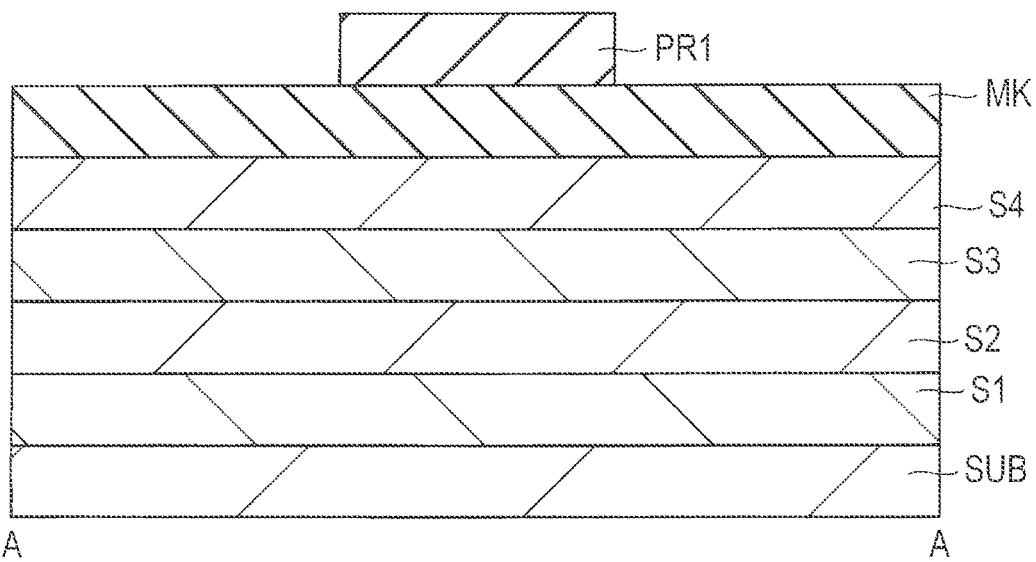
FIG. 18 is a sectional view illustrating the manufacturing process of the semiconductor device of the first embodiment.
Figure 19:
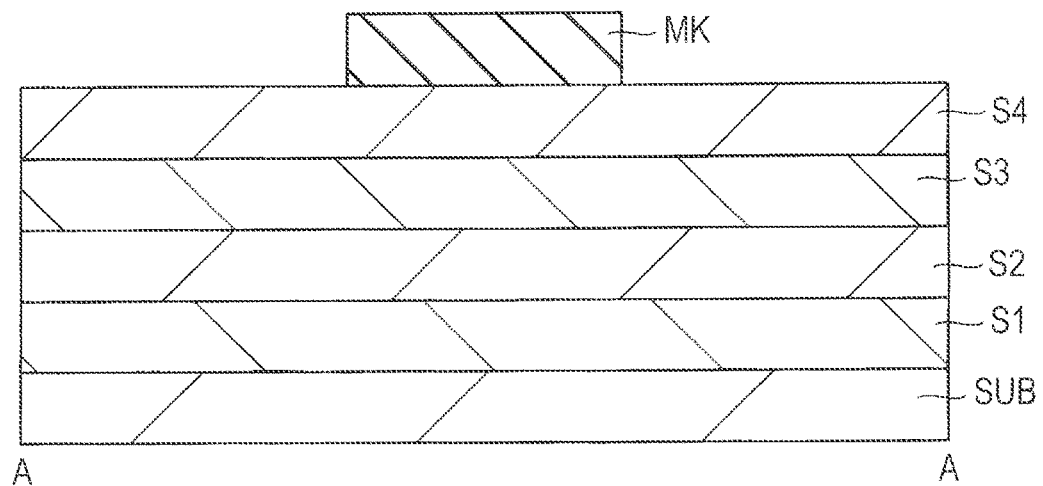
FIG. 19 is a sectional view illustrating the manufacturing process of the semiconductor device of the first embodiment.

Subsequently, as shown in FIG. 18, for example, a silicon oxide film is formed as a mask film MK on the fourth nitride semiconductor layer S4 so as to have a thickness of 100 nm using an LPCVD process or the like. Subsequently, a photoresist film PR1 is formed in a mesa part formation region on the mask film MK by photolithography processing. Subsequently, the mask film MK is etched with the photoresist film as a mask (FIG. 19). For example, when a silicon oxide film is used as the mask film MK, dry etching is performed using a fluorine-based gas, for example. Subsequently, the photoresist film PR1 is removed by plasma stripping processing or the like.

Figure 20:
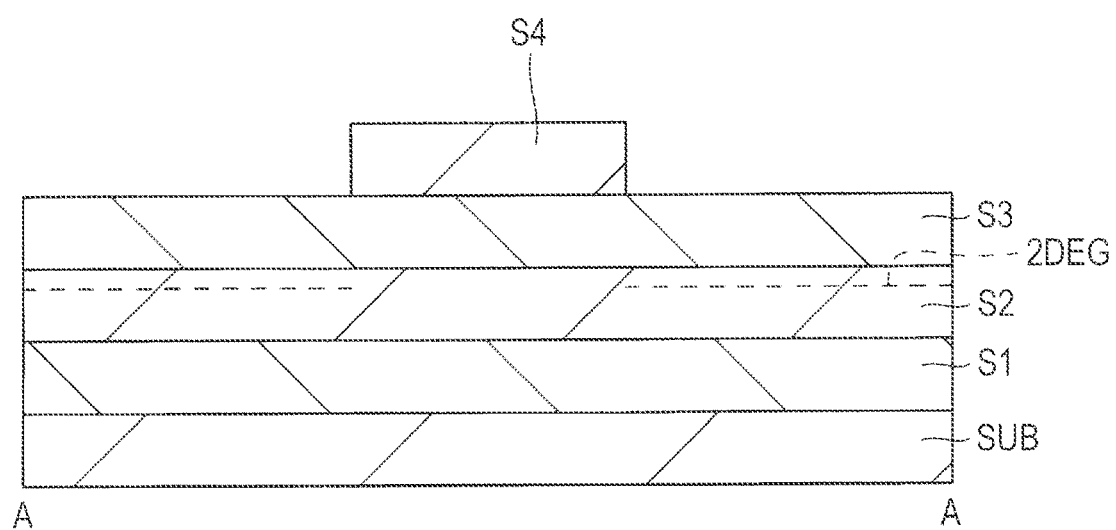
FIG. 20 is a sectional view illustrating the manufacturing process of the semiconductor device of the first embodiment.

Subsequently, as shown in FIG. 20, the mesa part including the fourth nitride semiconductor layer S4 is formed. For example, the fourth nitride semiconductor layer S4 is removed by dry etching using a chlorine-based gas with the mask film MK as a mask. In this stage, the mesa part is formed partially (for example, in a rectangular shape having a long side in the Y direction) over the third nitride semiconductor layer (barrier layer) S3, and 2DEG reoccurs on both sides of the mesa part while remaining nonexistent below the mesa part. Subsequently, the mask film MK is removed by etching. For example, when a silicon oxide film is used as the mask film MK, the mask film MK is removed by wet etching using a buffered hydrofluoric acid, for example.

Figure 21:
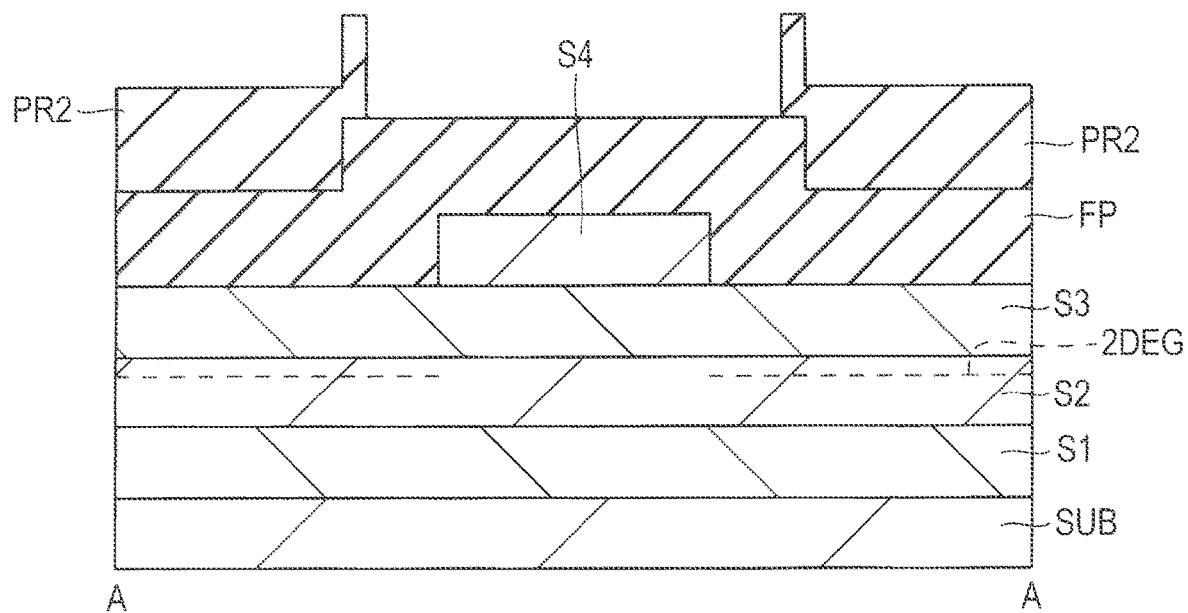
FIG. 21 is a sectional view illustrating the manufacturing process of the semiconductor device of the first embodiment.
Figure 22:
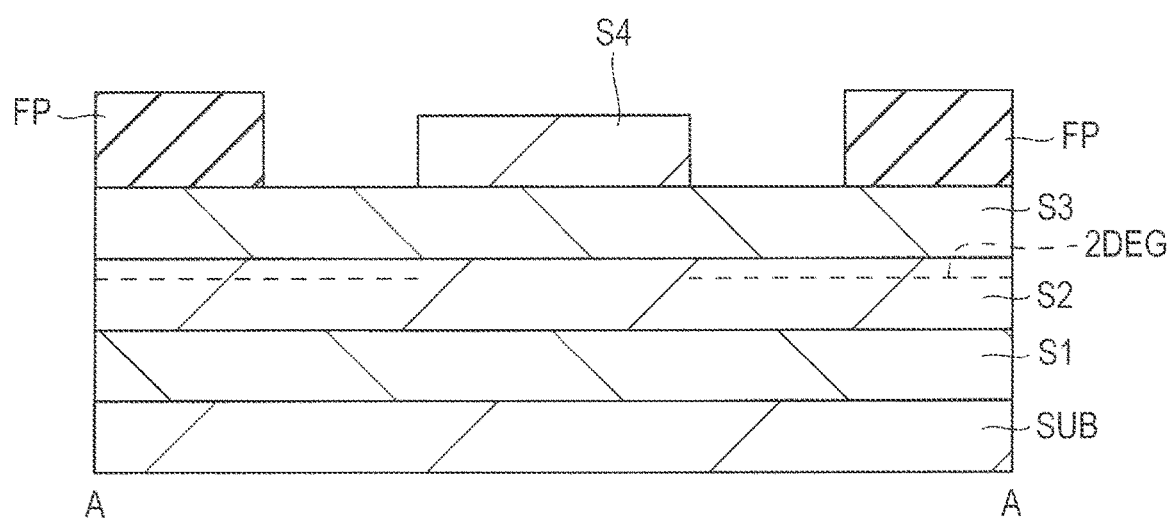
FIG. 22 is a sectional view illustrating the manufacturing process of the semiconductor device of the first embodiment.

Subsequently, as shown in FIGS. 21 and 22, the field plate insulating film FP is formed on the third nitride semiconductor layer S3 on both sides of the mesa part. For example, as shown in FIG. 21, a silicon nitride film is deposited about 90 nm as a film for the field plate insulating film FP over the third nitride semiconductor layer S3 and the fourth nitride semiconductor layer S4 by a plasma CVD process or the like.

Subsequently, a photoresist film PR2 having an opening on the mesa part is formed on the silicon nitride film. The film for the field plate insulating film FP is etched with the photoresist film PR2 as a mask. For example, the film for the field plate insulating film FP is etched by dry etching using a hydrofluoric acid-based gas (FIG. 22). Subsequently, the photoresist film PR2 is removed by plasma stripping processing or the like. As a result, as shown in FIG. 22, the field plate insulating film FP having an opening wider than the width of the mesa part can be formed.

Figure 23:
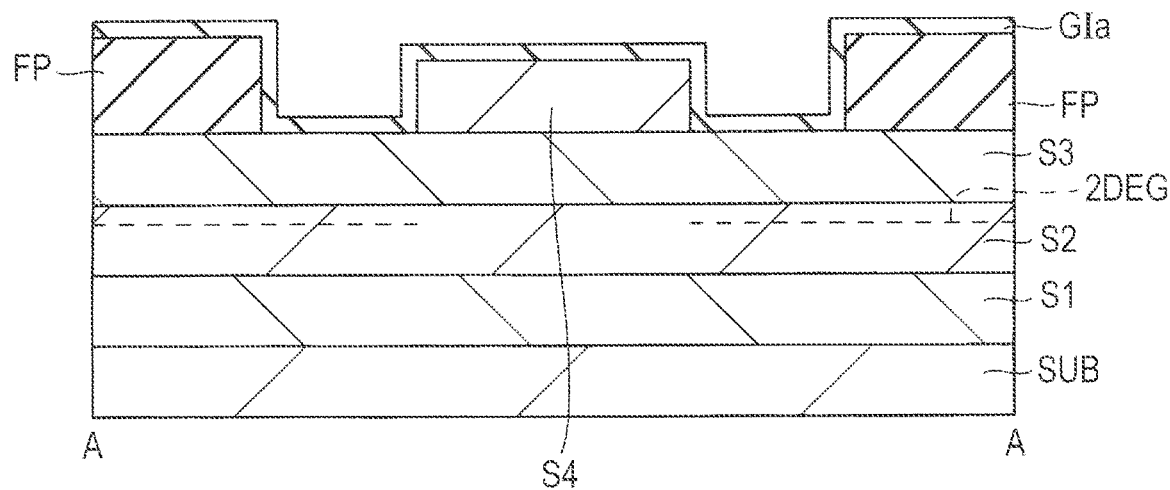
FIG. 23 is a sectional view illustrating the manufacturing process of the semiconductor device of the first embodiment.

Subsequently, as shown in FIGS. 23 to 28, the gate insulating film GI and the gate electrode GE are formed over the mesa part including the fourth nitride semiconductor layer S4. For example, the amorphous aluminum oxide (a-Al$_2$O$_3$) is formed at a deposition temperature of 300° C. so as to have a thickness of 5 nm using an ALD process over the mesa part including the fourth nitride semiconductor layer S4, the third nitride semiconductor layer S3, and the field plate insulating film FP. Subsequently, the amorphous aluminum oxide (a-Al$_2$O$_3$) is subjected to heat treatment for 10 min at 800° C. in an inert gas (for example, nitrogen) atmosphere. Through the heat treatment, the amorphous aluminum oxide (a-Al$_2$O$_3$) is crystallized and formed into crystalline aluminum oxide (c-Al$_2$O$_3$) (FIG. 23). As described above, the thickness of the amorphous aluminum oxide (a-Al$_2$O$_3$) or the crystalline aluminum oxide (c-Al$_2$O$_3$) can be adjusted within a range from 2 to 20 nm, more preferably 5 to 10 nm.

Figure 24:
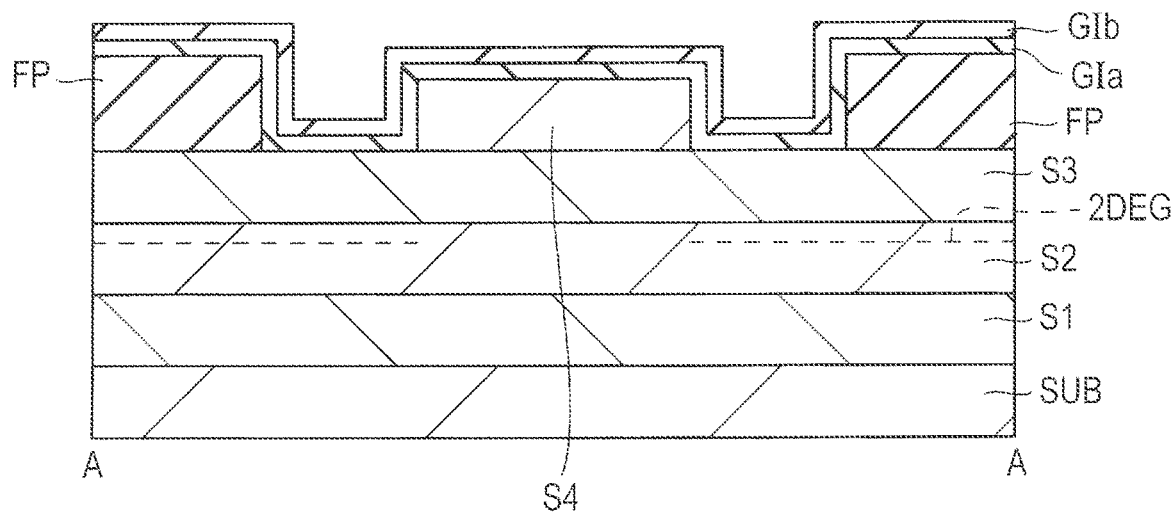
FIG. 24 is a sectional view illustrating the manufacturing process of the semiconductor device of the first embodiment.

Subsequently, as shown in FIG. 24, a silicon oxide film (SiO$_2$ film) is formed as the second gate insulating film GIb on the first gate insulating film GIa. For example, the silicon oxide film (SiO$_2$ film) is formed at a deposition temperature of 400° C. so as to have a thickness of 10 nm using a LPCVD process. As described above, the thickness of the silicon oxide film (SiO$_2$ film) can be adjusted within a range from 5 to 20 nm, more preferably 5 to 10 nm.

The silicon oxide film (SiO$_2$ film) is formed as the second gate insulating film GIb on the crystalline aluminum oxide (c-Al$_2$O$_3$); hence, dipole is formed at the interface between such films.

Figure 25:
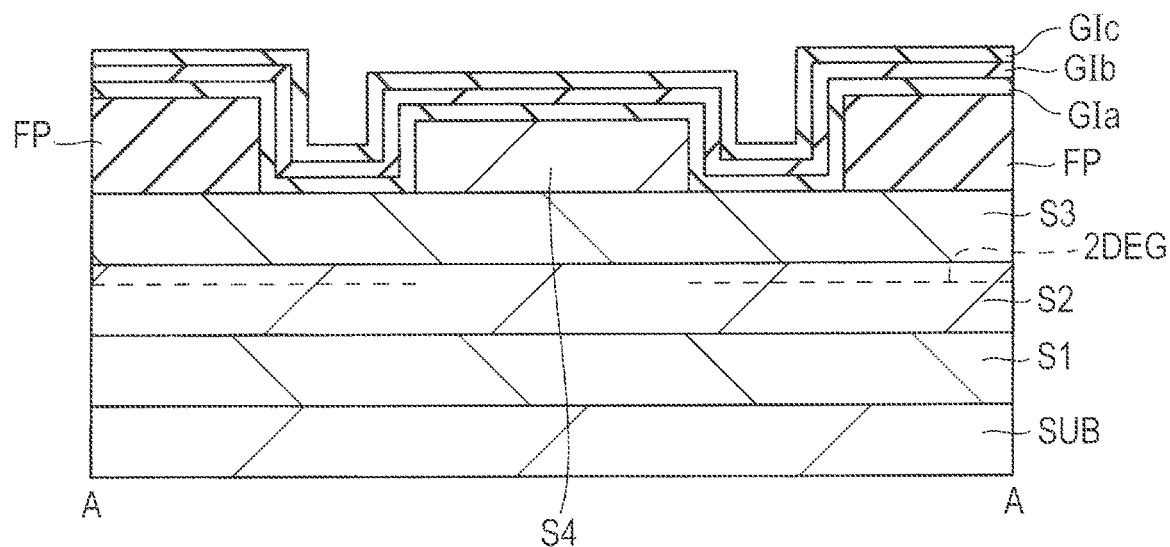
FIG. 25 is a sectional view illustrating the manufacturing process of the semiconductor device of the first embodiment.

Subsequently, the amorphous aluminum oxide (a-Al$_2$O$_3$) is formed on the second gate insulating film GIb at a deposition temperature of 300° C. so as to have a thickness of 10 nm using an ALD process. Subsequently, the amorphous aluminum oxide (a-Al$_2$O$_3$) is subjected to heat treatment for 10 min at 800° C. in an inert gas (for example, nitrogen) atmosphere. Through the heat treatment, the amorphous aluminum oxide (a-Al$_2$O$_3$) is crystallized and formed into crystalline aluminum oxide (c-Al$_2$O$_3$) (FIG. 25). The above heat treatment condition is an exemplary condition. However, heat treatment at 800° C. or higher is preferably performed to crystallize the amorphous aluminum oxide (a-Al$_2$O$_3$).

No dipole is formed at the interface between the silicon oxide film (SiO$_2$ film) GIb and the overlying aluminum oxide (a-Al$_2$O$_3$, c-Al$_2$O$_3$) through the heat treatment (crystallization). As described above, the thickness of the amorphous aluminum oxide (a-Al$_2$O$_3$) or the crystalline aluminum oxide (c-Al$_2$O$_3$) to be the third gate insulating film GIc can be adjusted within a range from 2 to 20 nm, more preferably 5 to 10 nm.

Figure 26:
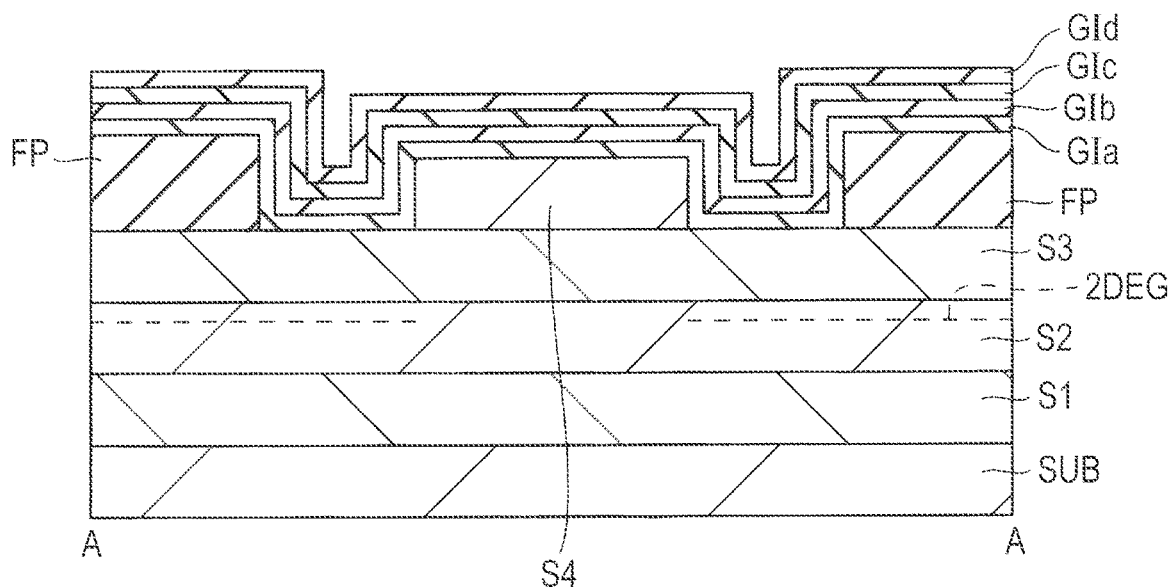
FIG. 26 is a sectional view illustrating the manufacturing process of the semiconductor device of the first embodiment.

Subsequently, as shown in FIG. 26, a silicon oxide film (SiO$_2$ film) is formed as the fourth gate insulating film GId on the third gate insulating film GIc. For example, the silicon oxide film (SiO$_2$ film) is formed at a deposition temperature of 400° C. so as to have a thickness of 10 nm using a LPCVD process. As described above, the thickness of the silicon oxide film (SiO$_2$ film) to be the fourth gate insulating film GId can be adjusted within a range from 5 to 20 nm, more preferably 5 to 10 nm. As a result, the gate insulating film GI including the four-layer insulating film (GIa to GId) can be formed. As described above, when the SiO$_2$ film is formed on the $Al_2O_3$ film, the $SiO_2$ film may be formed in an atmosphere of 800° C. or higher so that the $Al_2O_3$ film as the lower layer is crystallized.

The silicon oxide film ($SiO_2$ film) is formed as the fourth gate insulating film GId on the crystalline aluminum oxide (c-$Al_2O_3$); hence, dipole is formed at the interface between such films.

As described above, the threshold voltage can be cumulatively increased by repeatedly stacking the two-layer films including the crystalline $Al_2O_3$ films and the overlying $SiO_2$ films (FIG. 2). Although the gate insulating film GI includes four layers (GIa to GId) in this case, the gate insulating film GI may include six, eight, or at least ten layers. For example, as described above, a film, which is formed by stacking the crystalline $Al_2O_3$ film (GIa) 5 nm thick, the $SiO_2$ film (GIb) 10 nm thick, the crystalline $Al_2O_3$ film (GIc) 10 nm thick, and the $SiO_2$ film (GId) 10 nm thick in order from the bottom side, may be used as the gate insulating film. In addition, a film, which is formed by stacking a crystalline $Al_2O_3$ film 5 nm thick, a $SiO_2$ film 5 nm thick, a crystalline $Al_2O_3$ film 5 nm thick, a $SiO_2$ film 10 nm thick, a crystalline $Al_2O_3$ film 5 nm thick, and a $SiO_2$ film 10 nm thick in order from the bottom side, may be used as the gate insulating film.

Figure 27:
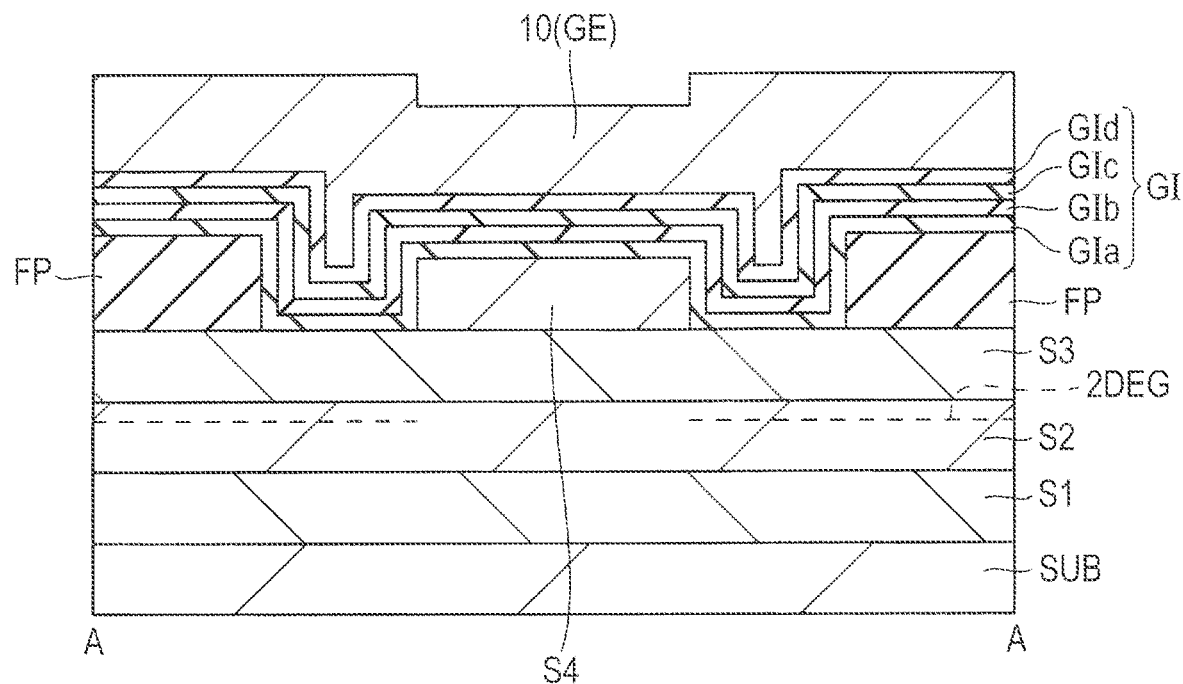
FIG. 27 is a sectional view illustrating the manufacturing process of the semiconductor device of the first embodiment.

Subsequently, for example, as shown in FIG. 27, a titanium nitride (TiN) film is deposited as a conductive film 10 for the gate electrode GE on the insulating film for the gate insulating film GI at a thickness of about 100 nm using a sputtering process or the like. The constitutional material or thickness of the conductive film can be appropriately adjusted. Polycrystalline silicon doped with a dopant such as B or P may be used in addition to TiN for the conductive film for the gate electrode GE. In addition, Ti, Al, Ni, Pt, and Au, and Si compounds or N compounds thereof may also be used. A multilayer film formed by stacking such material films may also be used. For example, a film including an Au film stacked on the Ni film may also be used as the conductive film.

Figure 28:
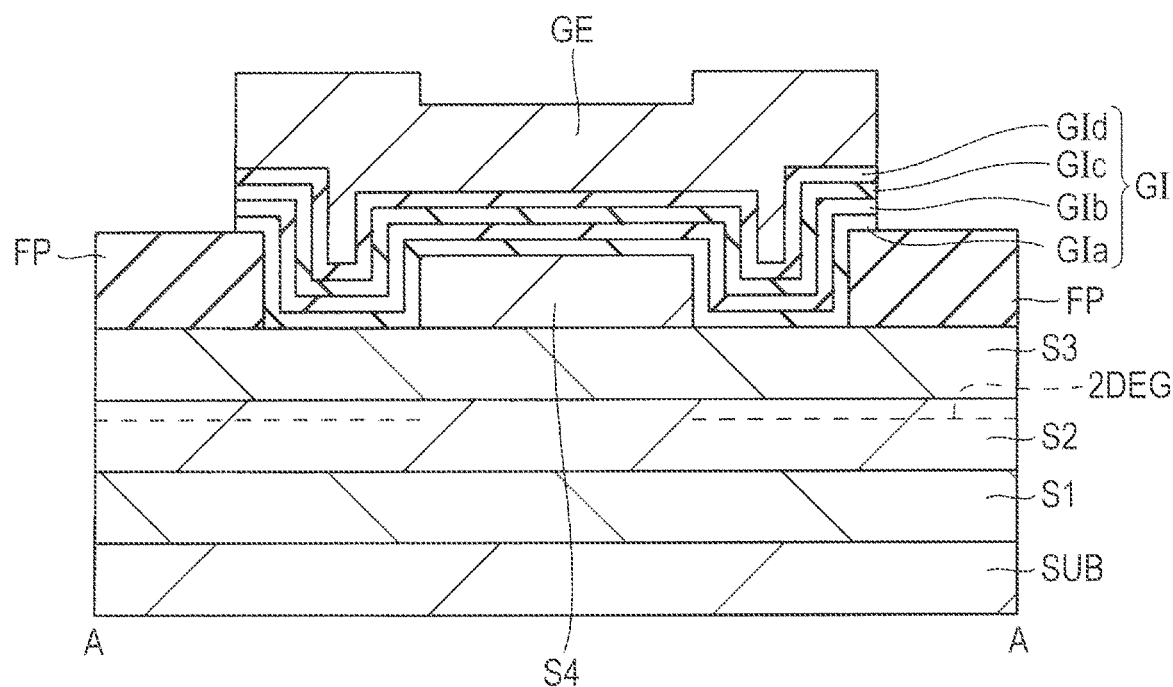
FIG. 28 is a sectional view illustrating the manufacturing process of the semiconductor device of the first embodiment.

Subsequently, an undepicted photoresist film is formed in a formation region of the gate electrode GE on the conductive film for the gate electrode GE by photolithography processing. The conductive film for the gate electrode GE and the gate insulating film GI are etched with the photoresist film as a mask. For example, the TiN film and the aluminum oxide film are etched by dry etching using a chlorine-based gas, and the silicon oxide film is etched by dry etching using a fluorine-based gas. A patterned insulating film (for example, silicon oxide film) may be used as a mask. Subsequently, the photoresist film is removed by plasma stripping processing or the like. Consequently, as shown in FIG. 28, the gate electrode GE is formed over the fourth nitride semiconductor layer S4 with the gate insulating film GI in between.

Figure 29:
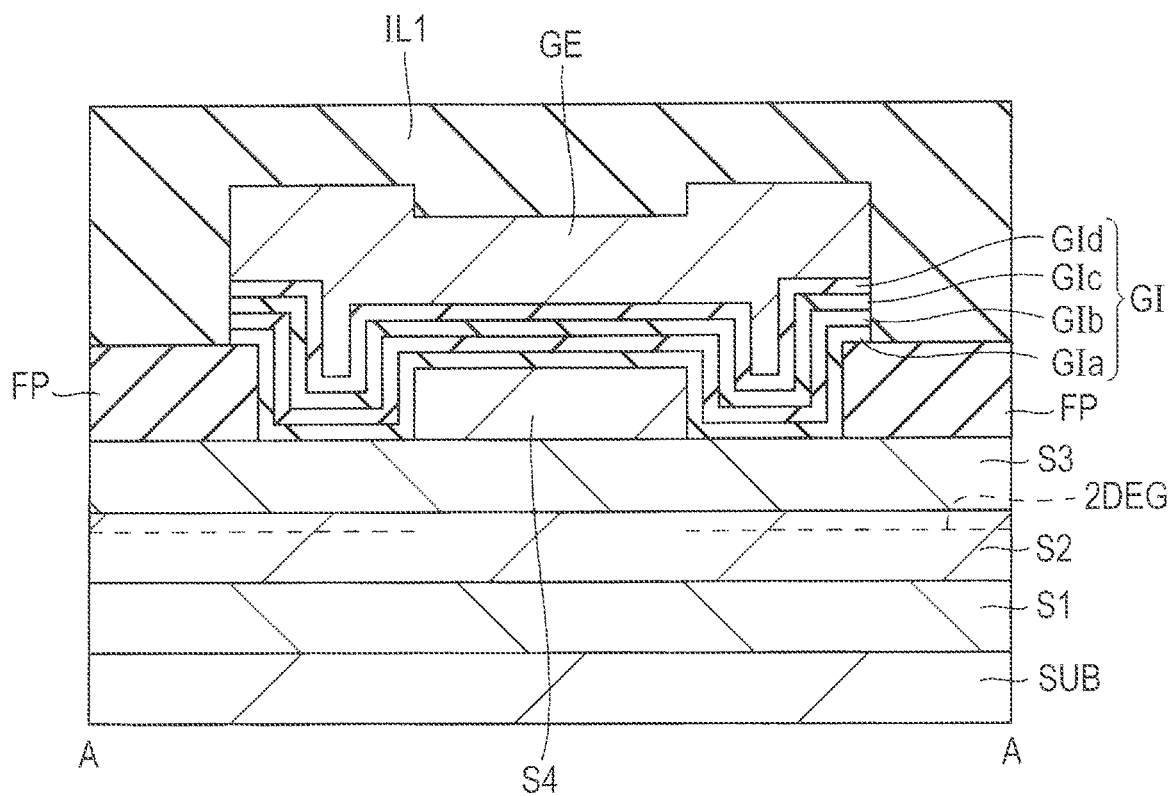
FIG. 29 is a sectional view illustrating the manufacturing process of the semiconductor device of the first embodiment.

Subsequently, as shown in FIG. 29, an interlayer insulating film IL1 is formed over the gate electrode GE. For example, a silicon oxide film is deposited about 1 μm as the interlayer insulating film IL1 using a CVD process or the like. A silicon nitride film about 100 nm thick may be formed under the silicon oxide film. A so-called TEOS film, which is formed from tetraethyl orthosilicate as a raw material, may be used as the silicon oxide film.

Figure 30:
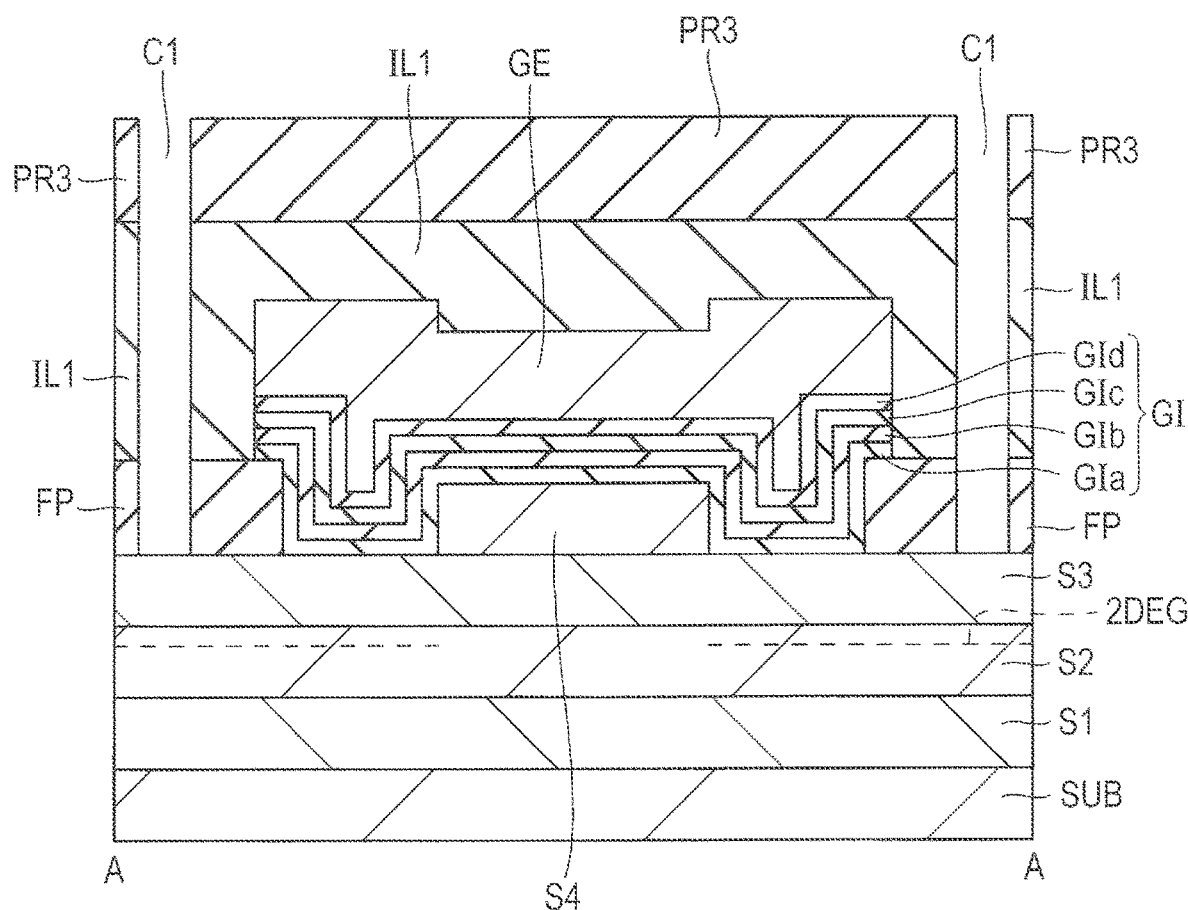
FIG. 30 is a sectional view illustrating the manufacturing process of the semiconductor device of the first embodiment.

Subsequently, as shown in FIG. 30, contact holes C1 are formed in the interlayer insulating film IL1 using a photolithography technique and an etching technique. For example, a photoresist film PR3 having an opening in each of the source electrode coupling region and the drain electrode coupling region is formed over the interlayer insulating film IL1. Subsequently, the contact holes C1 are formed by etching the interlayer insulating film IL1 with the photoresist film PR3 as a mask. Subsequently, the photoresist film PR3 is removed by plasma stripping processing or the like.

Figure 31:
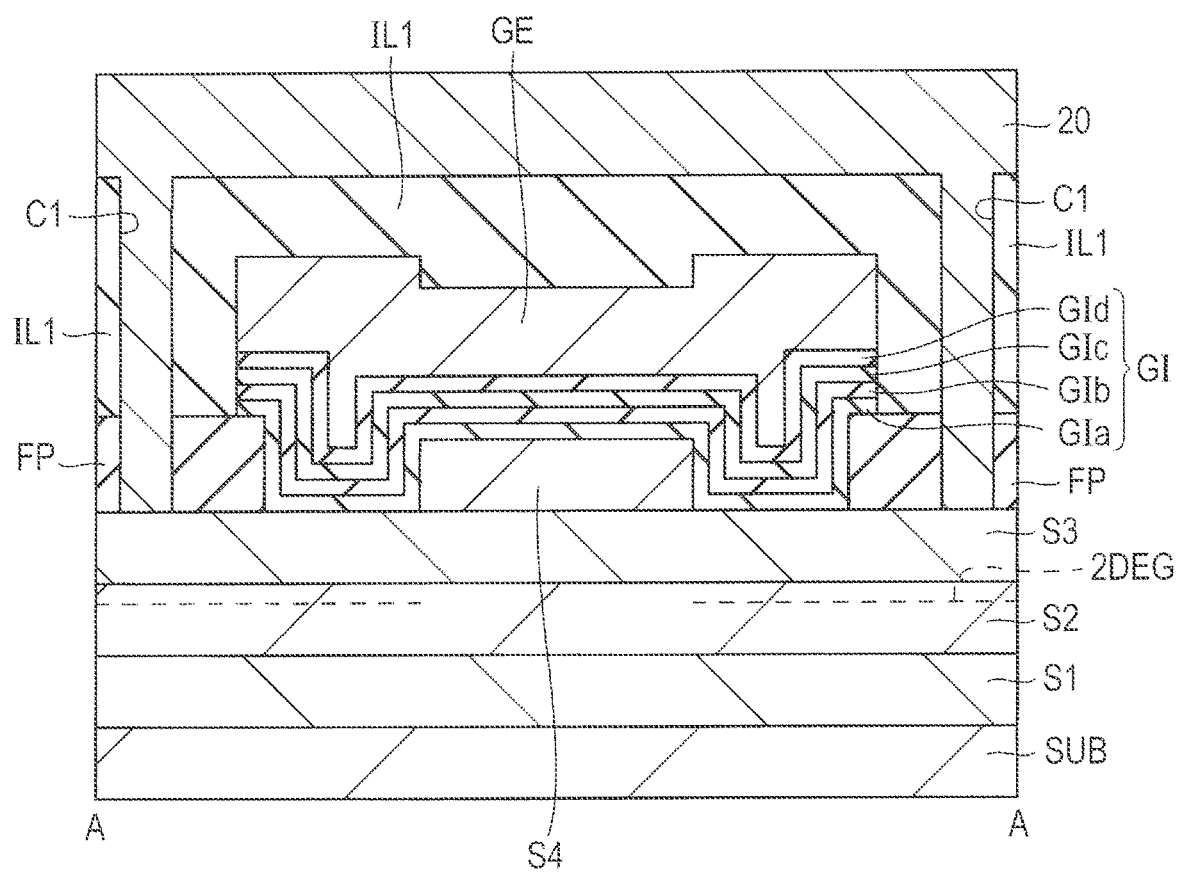
FIG. 31 is a sectional view illustrating the manufacturing process of the semiconductor device of the first embodiment.
Figure 32:
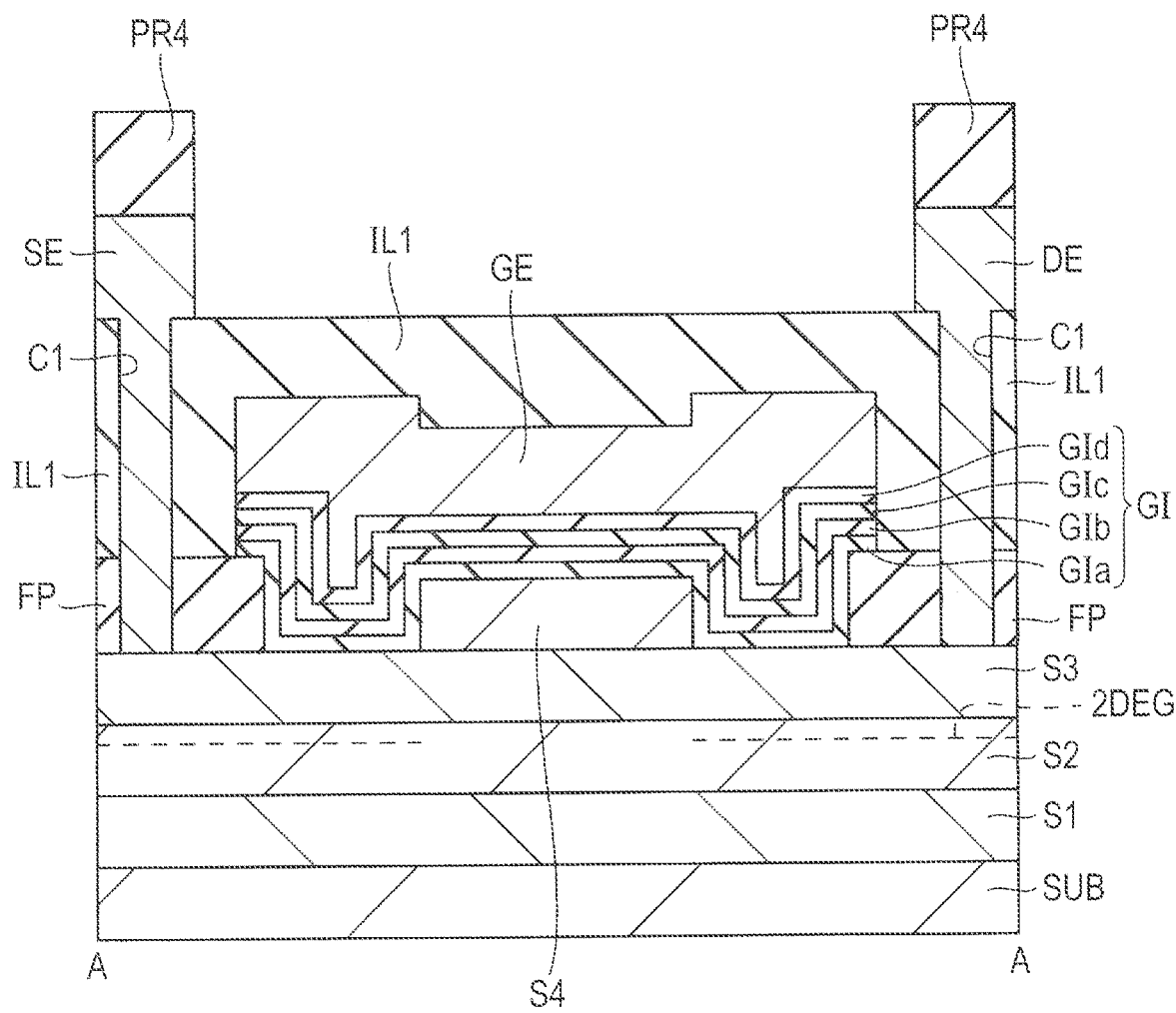
FIG. 32 is a sectional view illustrating the manufacturing process of the semiconductor device of the first embodiment.

Subsequently, as shown in FIGS. 31 and 32, the source electrode SE and the drain electrode DE are formed in the contact holes C1 and over the interlayer insulating film IL1. For example, a conductive film 20 is formed over the interlayer insulating film IL1 including within the contact holes C1. For example, an Al film is formed as the conductive film 20. For example, an Al film is formed at a thickness of about 5 μm using a sputtering process or the like over the interlayer insulating film IL1 including within the contact holes C1.

Subsequently, as shown in FIG. 32, a photoresist film PR4 is formed over the conductive film (Al film) in each of the formation regions of the source electrode SE and the drain electrode DE, and the conductive film (Al film) 20 is etched with the photoresist film PR4 as a mask. The conductive film (Al film) 20 is etched by dry etching using a gas mainly containing C12, for example. Subsequently, the photoresist film PR4 is removed by plasma stripping processing or the like. Consequently, the source electrode SE and the drain electrode DE can be formed. The conductive film (Al film) 20 is patterned and then subjected to heat treatment. For example, heat treatment is performed for 30 min at 550° C. As a result, ohmic contact can be established between the conductive film (Al film) 20 and an underlying layer.

The conductive film (Al film) 20 may be patterned after the heat treatment. An Al/Ti film may be used as the conductive film 20. In such a case, for example, a Ti film is formed at a thickness of about 16 nm using a sputtering process or the like, and an Al film is formed on the Ti film at a thickness of about 2 μm using a sputtering process or the like. Further good ohmic contact can be provided by using the Al/Ti film. An Al/Cu film may also be used as the conductive film 20. In this way, the constitutional material or thickness of the conductive film configuring the source electrode SE or the drain electrode DE can be appropriately adjusted. A material, which can be in ohmic contact with the nitride semiconductor layer, is preferably used for such a conductive film.

Figure 33:
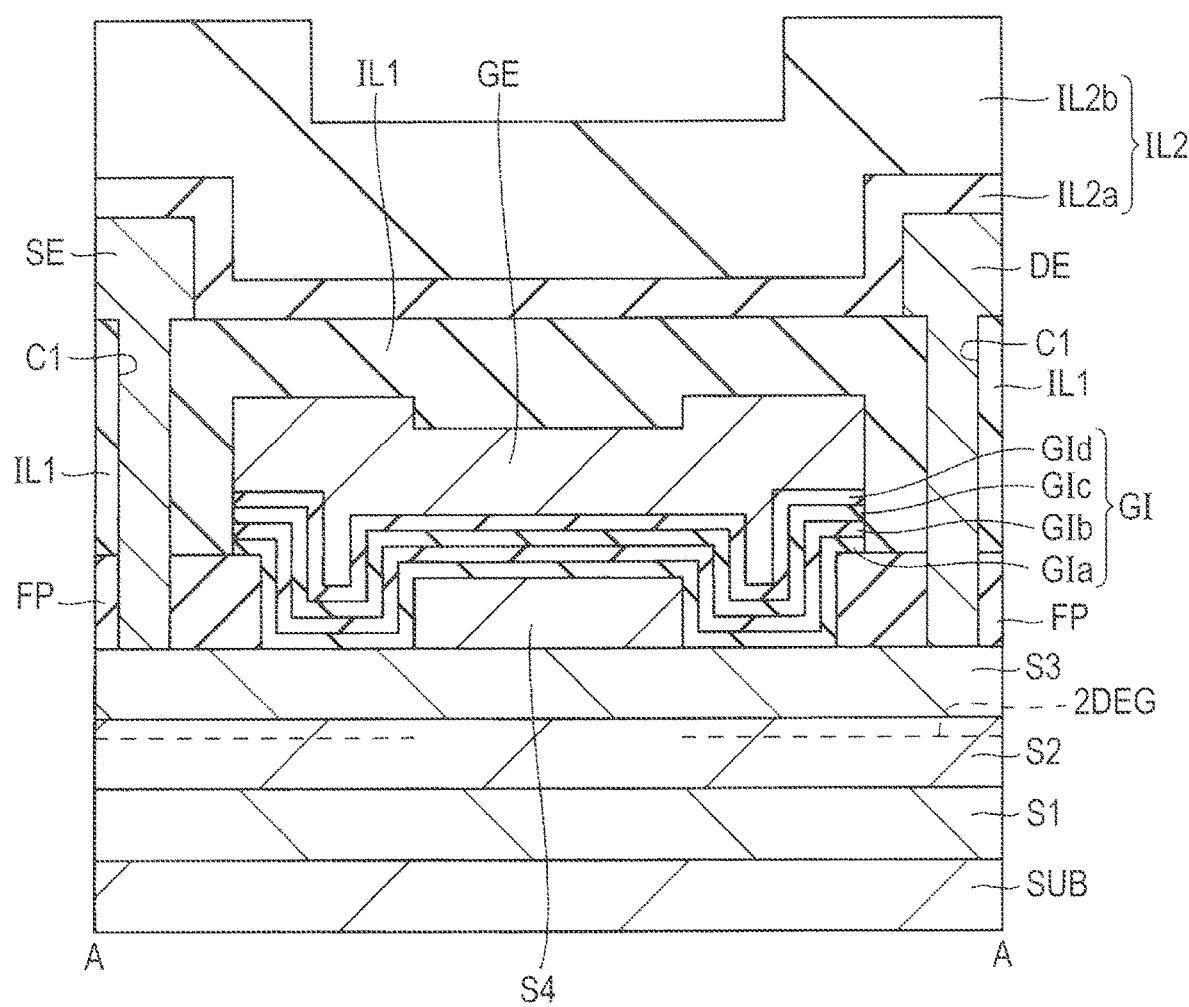
FIG. 33 is a sectional view illustrating the manufacturing process of the semiconductor device of the first embodiment.

Subsequently, as shown in FIG. 33, an insulating film (protective film) IL2 is formed on the interlayer insulating film IL1 including over the source electrode SE and the drain electrode DE. For example, a silicon nitride film is deposited about 90 nm using a CVD process or the like as a lower film (passivation film) of the insulating film (protective film) IL2. Subsequently, a polyimide film is deposited about 7 μm as an upper film on the silicon nitride film using a coating process or the like.

The insulating film (protective film) including the polyimide film and the like may be formed on the top interconnection after formation of multilayer interconnections to be coupled to the source electrode SE and the drain electrode DE. After that, the insulating film (the film stack of the polyimide film and the silicon nitride film) is removed so that part of the underlying conductive film (interconnection) is exposed to form an undepicted pad in each of regions where the gate pad GP, the source pad SP, and the drain pad DP are necessary to be electrically coupled to external components.

The semiconductor device of the first embodiment can be formed through the above-described steps. The steps are merely shown as an example, and the semiconductor device of the first embodiment may be manufactured through other steps.

Second Embodiment

A semiconductor device of a second embodiment is now described in detail with reference to the accompanying drawings. In the second embodiment, any configuration other than the gate electrode and the gate insulating film is the same as that in the first embodiment, and can be formed in the same manufacturing method as in the first embodiment.

Description of Structure

Figure 34:
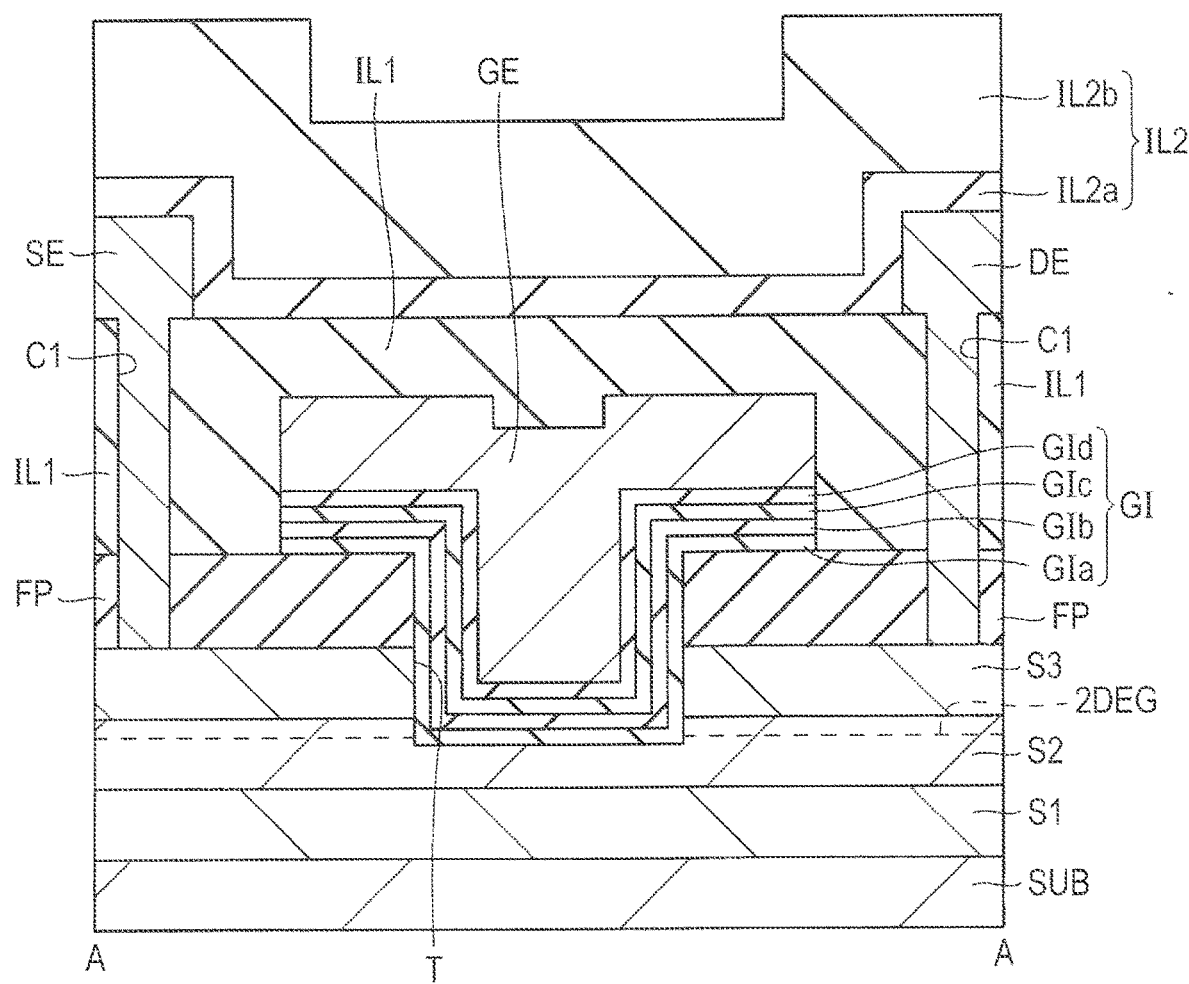
FIG. 34 is a sectional view illustrating a configuration of a semiconductor device of a second embodiment.

FIG. 34 is a sectional view illustrating a configuration of the semiconductor device of the second embodiment. The semiconductor device of FIG. 34 is a MOS field effect transistor using a nitride semiconductor. The semiconductor device of the second embodiment is a so-called recessed-gate semiconductor device. The same configuration as that in the first embodiment is designated by the same reference numeral, and detailed description thereof is omitted. The plan view of the semiconductor device of the second embodiment is similar to FIG. 16, and FIG. 34 corresponds to a portion A-A in FIG. 16.

In the semiconductor device of the second embodiment, as shown in FIG. 34, the first nitride semiconductor layer Si, the second nitride semiconductor layer S2, and the third nitride semiconductor layer S3 are formed in order over the substrate SUB. A nucleation layer and an overlying high-resistance buffer layer may be formed over the substrate SUB before formation of the first nitride semiconductor layer S1 and others. The substrate SUB, the first to third nitride semiconductor layers (S1 to S3), the nucleation layer, and the high-resistance buffer layer can each be formed from a material and at a thickness similar to those in the first embodiment.

The second nitride semiconductor layer S2 has an electron affinity equal to or larger than that of the first nitride semiconductor layer S1 (S1≤S2).

The third nitride semiconductor layer S3 has an electron affinity smaller than that of the first nitride semiconductor layer S1 (S1>S3).

In the second embodiment, the gate electrode GE is formed over the inside of a trench (recess) T, which runs up to a slight depth of the second nitride semiconductor layer S2 through the field plate insulating film FP and the third nitride semiconductor layer S3, with the gate insulating film GI in between.

The 2DEG, which is generated in the vicinity of the interface between the second nitride semiconductor layer (channel layer) S2 and the third nitride semiconductor layer (barrier layer) S3 and in the second nitride semiconductor layer S2, is therefore separated by the trench T. Hence, when a predetermined voltage (threshold voltage) is applied to the gate electrode GE, a channel is formed below the gate electrode GE, and a portion between the 2DEG regions becomes conductive by the channel, leading to an on state of the transistor. That is, normally-off operation can be achieved.

The planar shape of the trench T is a rectangular shape having a long side in a paper depth direction (Y direction in FIG. 16). The planar shape of the stack of the gate insulating film (GI) and the gate electrode GE is a rectangular shape having a long side in the Y direction (see FIG. 16). The width (length in the X direction, length in the current flow direction from the drain electrode to the source electrode, i.e., in the gate length direction) of the gate electrode GE is larger than the width (length in the X direction) of the trench T.

A film including four layers (GIa to GId) is formed as the gate insulating film GI in the second embodiment. Specifically, provided is the gate insulating film including a stack of two layers of two-layer film including the crystalline $Al_2O_3$ as the lower layer and the silicon oxide ($SiO_2$) as the upper layer.

As described above, the second embodiment uses the film stack, which is formed by repeatedly stacking the two-layer films including the crystalline $Al_2O_3$ films and the overlying $SiO_2$ films, as the gate insulating film GI. The $Al_2O_3$ film on the $SiO_2$ film is formed in an amorphous state and then crystallized. Such a film stack is used as the gate insulating film GI, thereby the threshold voltage (Vt) can be increased as described above.

The field plate insulating film FP is formed on the third nitride semiconductor layer S3 on both sides of the trench T. In this way, the field plate insulating film FP is provided below the end portion of the gate electrode GE, making it possible to increase the withstand voltage of the semiconductor device.

As in the first embodiment, the interlayer insulating film IL1 is formed over the gate electrode GE. The source electrode SE and the drain electrode DE are formed over the third nitride semiconductor layer S3 on the two respective sides of the trench T. For example, contact holes (coupling holes) C1 are formed in the interlayer insulating film IL1, and the source electrode SE and the drain electrode DE are disposed in and on the respective contact holes C1. The insulating film IL2 is formed over the source electrode SE and the drain electrode DE. The insulating film IL2 includes a film stack of the lower film IL2a and the upper film IL2b.

Description of Manufacturing Method

A method of manufacturing the semiconductor device of the second embodiment is now described with reference to FIGS. 35 to 51 while the configuration of the semiconductor device is further clarified. FIGS. 35 to 51 are each a sectional view illustrating a manufacturing process of the semiconductor device of the second embodiment. A configuration and a step similar to those in the first embodiment are not described in detail.

Figure 35:
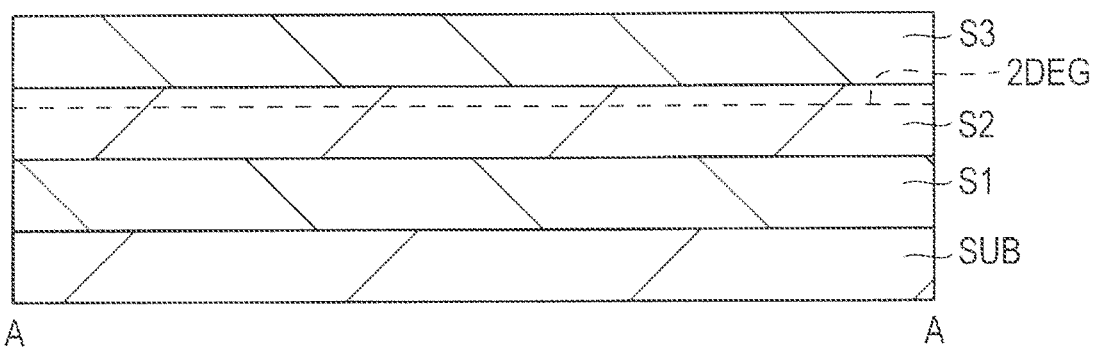
FIG. 35 is a sectional view illustrating a manufacturing process of the semiconductor device of the second embodiment.

As show in FIG. 35, the substrate SUB is provided, and the first to third nitride semiconductor layers (S1 to S3) are formed in order. A substrate similar to that in the first embodiment can be used as the substrate SUB. Each of the first to third nitride semiconductor layers (S1 to S3) can be formed using the same material and in the same way as in the first embodiment. The two-dimensional electron gas (2DEG) is generated at the interface between the second nitride semiconductor layer (channel layer) S2 and the third nitride semiconductor layer (barrier layer) S3 and in the second nitride semiconductor layer S2. Subsequently, an element isolation region (ISO), which cannot be shown in the section of FIG. 35, is formed as in the first embodiment (see FIG. 16).

Figure 36:
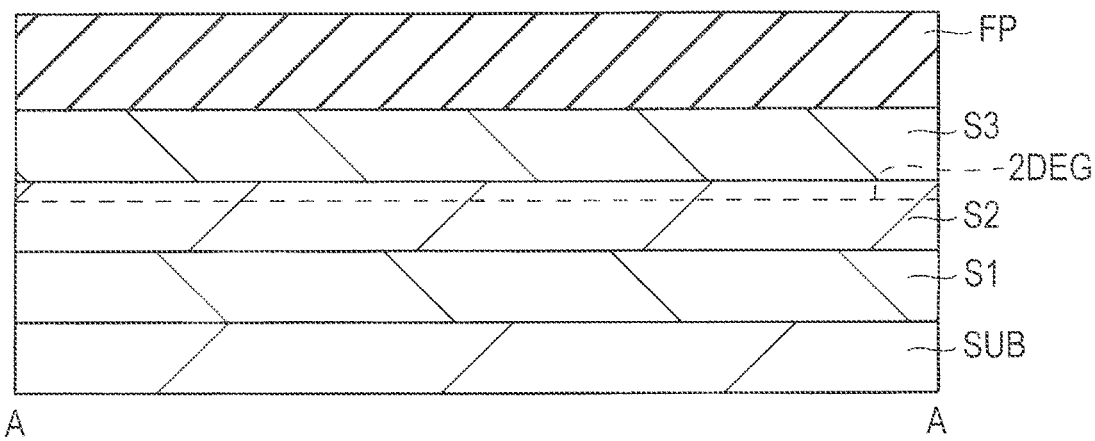
FIG. 36 is a sectional view illustrating the manufacturing process of the semiconductor device of the second embodiment.
Figure 37:
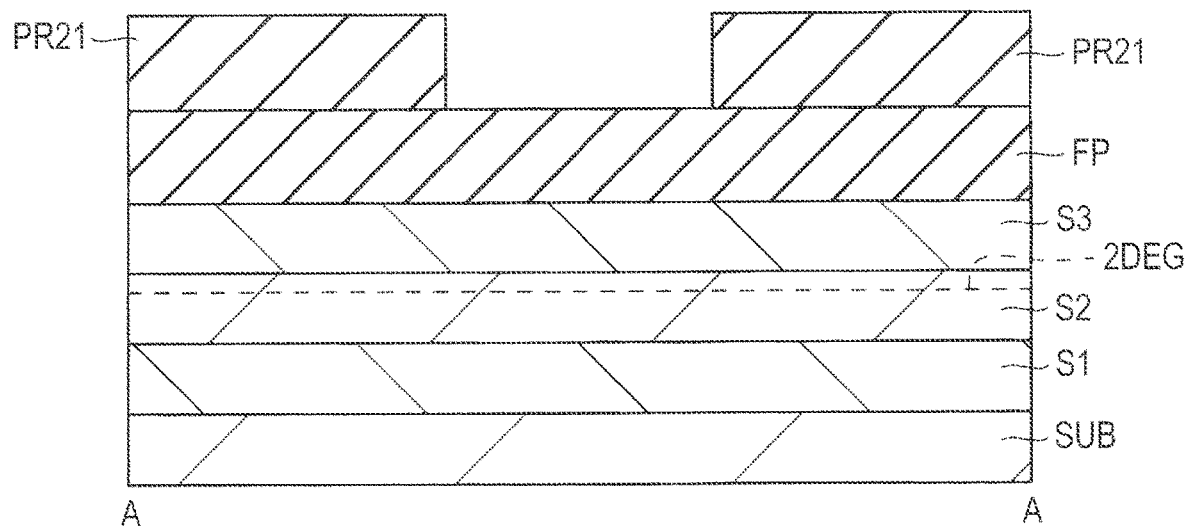
FIG. 37 is a sectional view illustrating the manufacturing process of the semiconductor device of the second embodiment.
Figure 38:
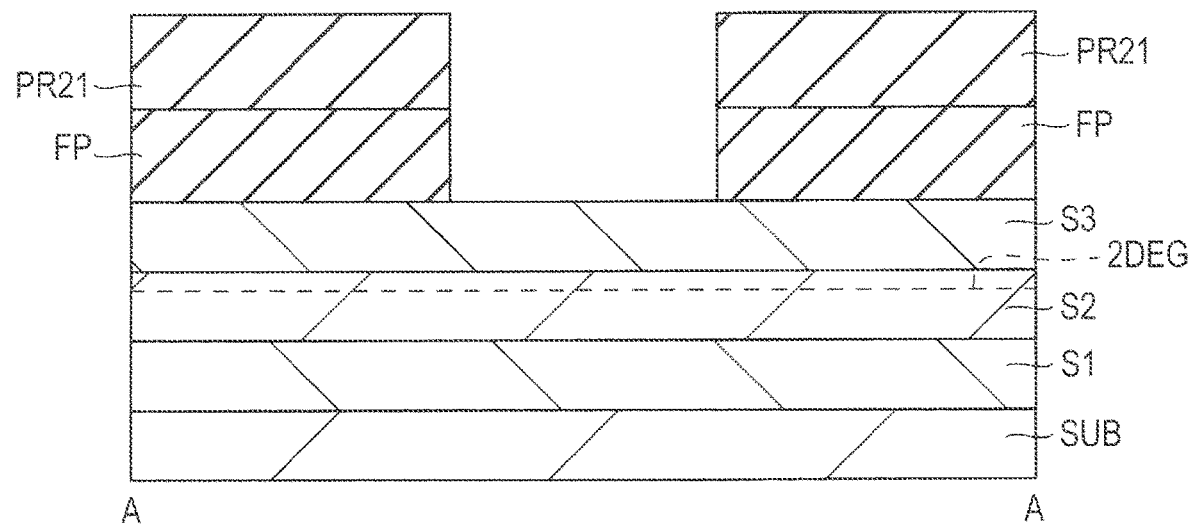
FIG. 38 is a sectional view illustrating the manufacturing process of the semiconductor device of the second embodiment.
Figure 39:
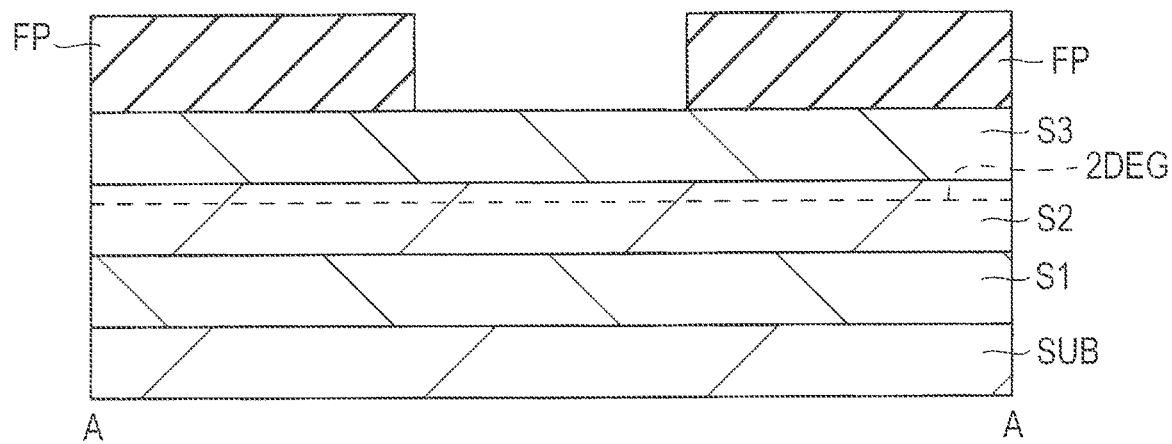
FIG. 39 is a sectional view illustrating the manufacturing process of the semiconductor device of the second embodiment.

Subsequently, as shown in FIGS. 36 to 39, the field plate insulating film FP having an opening is formed on the third nitride semiconductor layer S3. For example, as shown in FIG. 36, a silicon nitride film is deposited about 90 nm as a film for the field plate insulating film FP over the third nitride semiconductor layer S3 by a plasma CVD process or the like. Subsequently, a photoresist film PR21 having an opening in a formation region of the trench T is formed on the silicon nitride film (FIG. 37). The film for the field plate insulating film FP is etched with the photoresist film PR21 as a mask. For example, the film for the field plate insulating film FP is etched by dry etching using a fluorine-based gas (FIG. 38). Subsequently, the photoresist film PR21 is removed by plasma stripping processing or the like. As a result, as shown in FIG. 39, the field plate insulating film FP having the opening in the formation region of the trench T can be formed.

Figure 40:
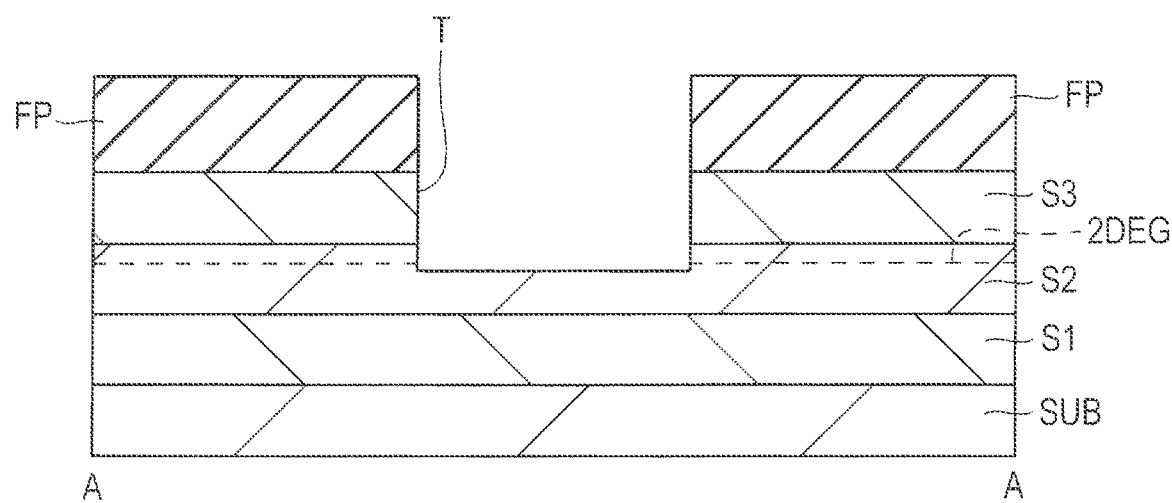
FIG. 40 is a sectional view illustrating the manufacturing process of the semiconductor device of the second embodiment.

Subsequently, as shown in FIG. 40, the third nitride semiconductor layer S3 and the second nitride semiconductor layer S2 are etched with the field plate insulating film FP as a mask to form the trench T that exposes the second nitride semiconductor layer S2 while running through the field plate insulating film FP and the third nitride semiconductor layer S3. For example, the trench T is formed by dry etching using a chlorine-based gas. After the etching, heat treatment (anneal) may be performed to recover etching damage.

Figure 41:
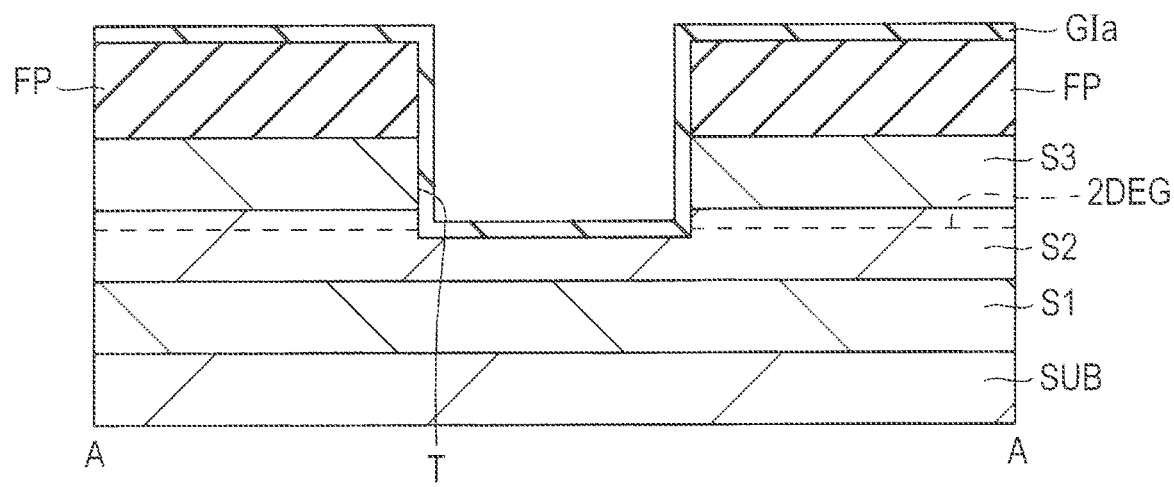
FIG. 41 is a sectional view illustrating the manufacturing process of the semiconductor device of the second embodiment.

Subsequently, as shown in FIGS. 41 to 46, the gate insulating film GI and the gate electrode GE are formed in the trench T having the bottom surface, from which the second nitride semiconductor layer (channel layer) S2 is exposed, and over the field plate insulating film FP. First, for example, amorphous aluminum oxide (a-$Al_2O_3$) is formed at a deposition temperature of 300° C. so as to have a thickness of 5 nm using an ALD process over the bottom surface and the side surface of the trench T and over the field plate insulating film FP as shown in FIG. 41. Subsequently, the amorphous aluminum oxide (a-$Al_2O_3$) is subjected to heat treatment for 10 min at 800° C. in an inert gas (for example, nitrogen) atmosphere. Through the heat treatment, the amorphous aluminum oxide (a-$Al_2O_3$) is crystallized and formed into crystalline aluminum oxide (c-$Al_2O_3$) (FIG. 41). As described above, the thickness of the amorphous aluminum oxide (a-$Al_2O_3$) or the crystalline aluminum oxide (c-$Al_2O_3$) can be adjusted within a range from 2 to 20 nm, more preferably 5 to 10 nm.

Figure 42:
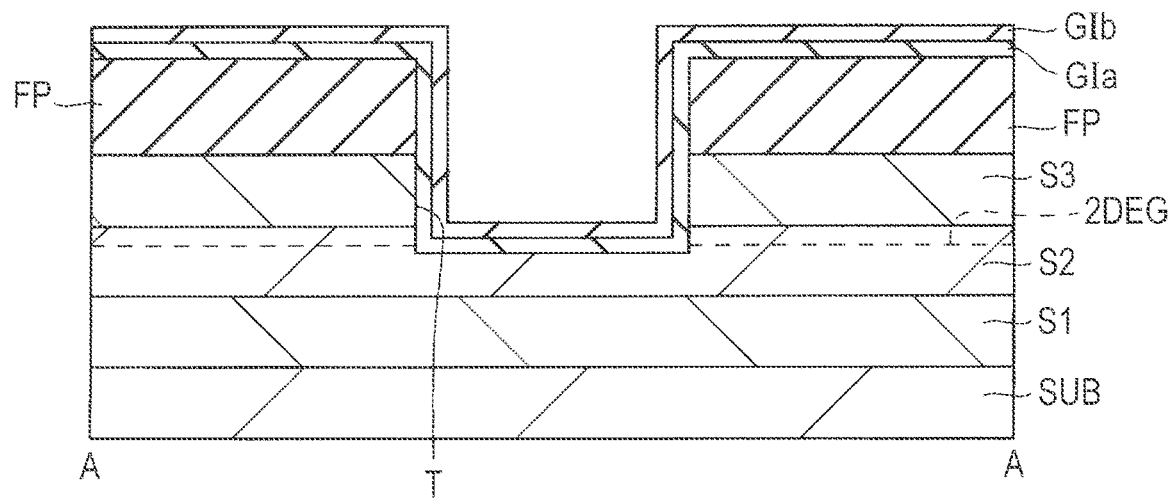
FIG. 42 is a sectional view illustrating the manufacturing process of the semiconductor device of the second embodiment.

Subsequently, as shown in FIG. 42, a silicon oxide film ($SiO_2$ film) is formed as the second gate insulating film GIb on the first gate insulating film GIa. For example, the silicon oxide film ($SiO_2$ film) is formed at a deposition temperature of 400° C. so as to have a thickness of 10 nm using a LPCVD process. As described above, the thickness of the silicon oxide film ($SiO_2$ film) can be adjusted within a range from 5 to 20 nm, more preferably 5 to 10 nm.

The silicon oxide film ($SiO_2$ film) is formed as the second gate insulating film GIb on the crystalline aluminum oxide (c-$Al_2O_3$); hence, dipole is formed at the interface between such films.

Figure 43:
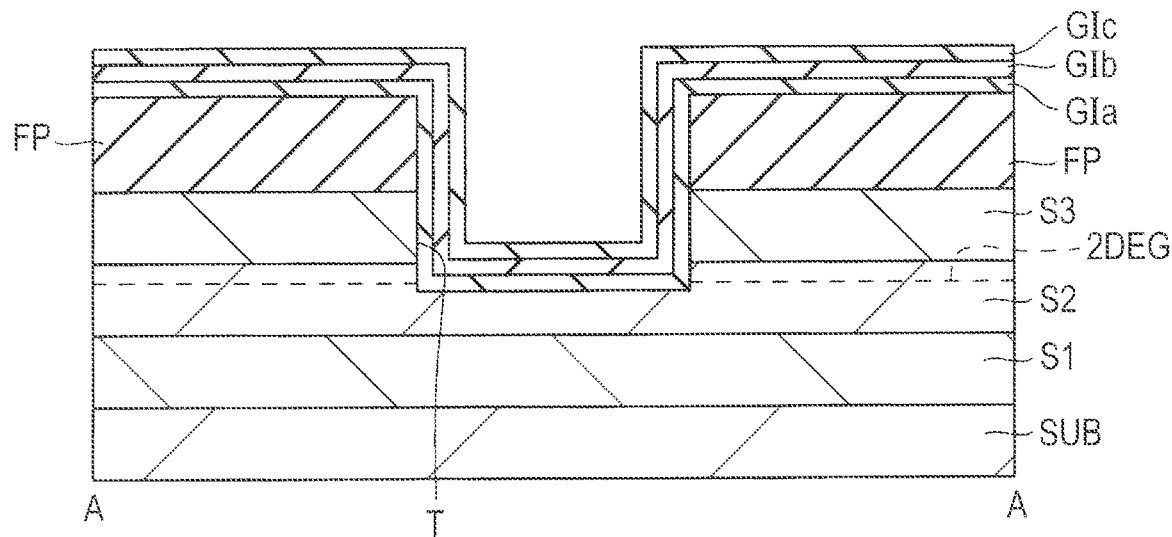
FIG. 43 is a sectional view illustrating the manufacturing process of the semiconductor device of the second embodiment.

Subsequently, the amorphous aluminum oxide (a-$Al_2O_3$) is formed on the second gate insulating film GIb at a deposition temperature of 300° C. so as to have a thickness of 10 nm using an ALD process. Subsequently, the amorphous aluminum oxide (a-$Al_2O_3$) is subjected to heat treatment for 10 min at 800° C. in an inert gas (for example, nitrogen) atmosphere. Through the heat treatment, the amorphous aluminum oxide (a-$Al_2O_3$) is crystallized and formed into crystalline aluminum oxide (c-$Al_2O_3$) (FIG. 43). The above heat treatment condition is an exemplary condition. However, heat treatment at 800° C. or higher is preferably performed to crystallize the amorphous aluminum oxide (a-$Al_2O_3$).

No dipole is formed at the interface between the silicon oxide film ($SiO_2$ film) GIb and the overlying aluminum oxide (a-$Al_2O_3$, c-$Al_2O_3$) through the heat treatment (crystallization). As described above, the thickness of the amorphous aluminum oxide (a-$Al_2O_3$) or the crystalline aluminum oxide (c-$Al_2O_3$) to be the third gate insulating film GIc can be adjusted within a range from 2 to 20 nm, more preferably 5 to 10 nm.

Figure 44:
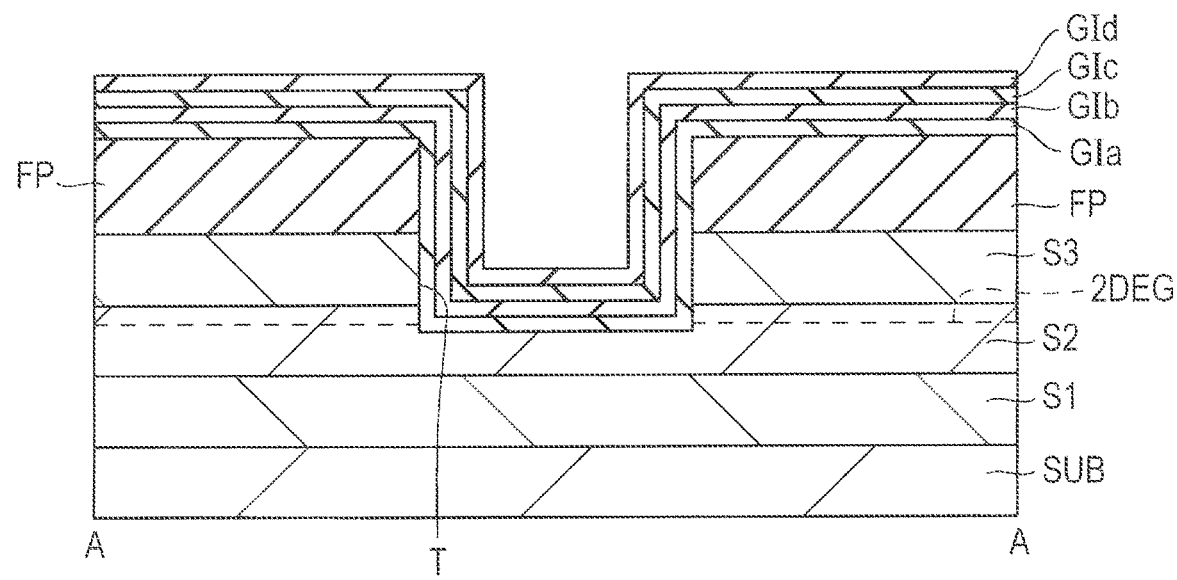
FIG. 44 is a sectional view illustrating the manufacturing process of the semiconductor device of the second embodiment.

Subsequently, as shown in FIG. 44, a silicon oxide film ($SiO_2$ film) is formed as the fourth gate insulating film GId on the third gate insulating film GIc. For example, the silicon oxide film ($SiO_2$ film) is formed at a deposition temperature of 400° C. so as to have a thickness of 10 nm using a LPCVD process. As described above, the thickness of the silicon oxide film ($SiO_2$ film) to be the fourth gate insulating film GId can be adjusted within a range from 5 to 20 nm, more preferably 5 to 10 nm. As a result, the gate insulating film GI including the four-layer insulating film (GIa to GId) can be formed. As described above, when the $SiO_2$ film is formed on the $Al_2O_3$ film, the $SiO_2$ film may be formed in an atmosphere of 800° C. or higher so that the $Al_2O_3$ film as the lower layer is crystallized.

The silicon oxide film ($SiO_2$ film) is formed as the fourth gate insulating film GId on the crystalline aluminum oxide (c-$Al_2O_3$); hence, dipole is formed at the interface between such films.

As described above, the threshold voltage can be cumulatively increased by repeatedly stacking the two-layer films including the crystalline $Al_2O_3$ films and the overlying $SiO_2$ films (see FIG. 2). Although the gate insulating film GI includes four layers (GIa to GId) in this case, the gate insulating film GI may include six, eight, or at least 10 layers. For example, as described in the first embodiment, a film, which is formed by stacking the crystalline $Al_2O_3$ film (GIa) 5 nm thick, the $SiO_2$ film (GIb) 10 nm thick, the crystalline $Al_2O_3$ film (GIc) 10 nm thick, and the $SiO_2$ film (GId) 10 nm thick in order from the bottom side, may be used as the gate insulating film. In addition, a film, which is formed by stacking a crystalline $Al_2O_3$ film 5 nm thick, a $SiO_2$ film 5 nm thick, a crystalline $Al_2O_3$ film 5 nm thick, and a $SiO_2$ film 10 nm thick in order from the bottom side, may be used as the gate insulating film.

Figure 45:
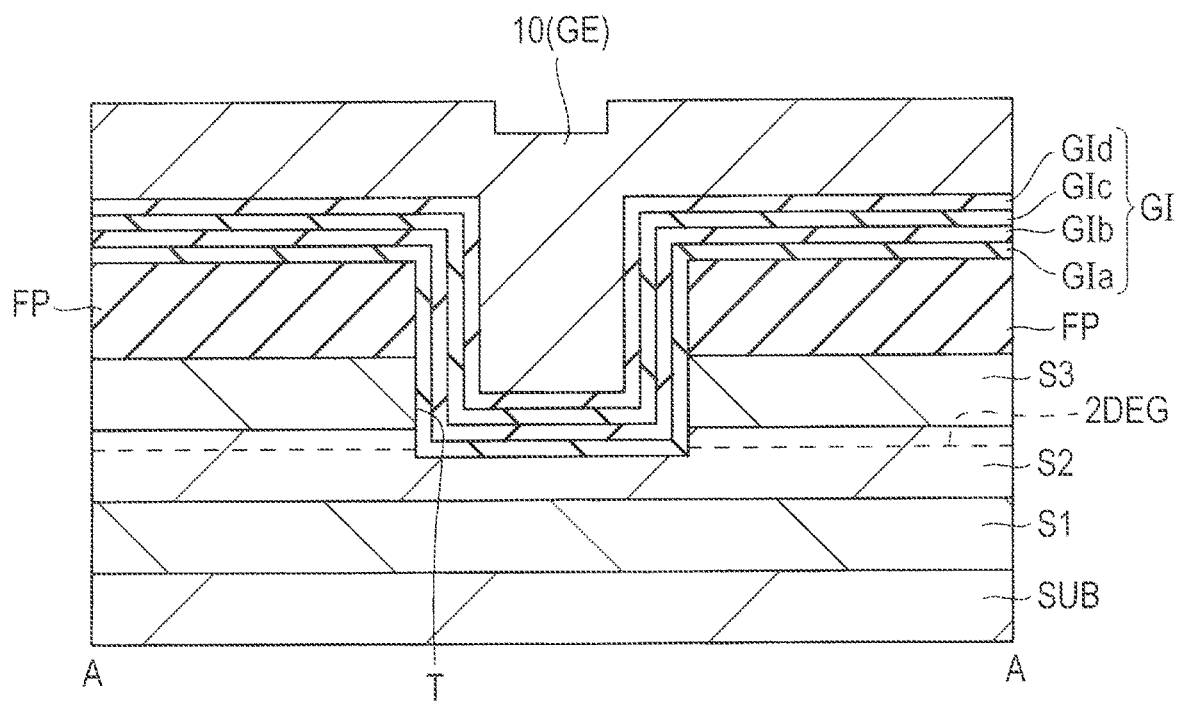
FIG. 45 is a sectional view illustrating the manufacturing process of the semiconductor device of the second embodiment.

Subsequently, for example, a titanium nitride (TiN) film is deposited as a conductive film 10 for the gate electrode GE on the insulating film for the gate insulating film GI at a thickness of about 100 nm using a sputtering process or the like (FIG. 45). As in the first embodiment, a film other than the TiN film may be used as the conductive film 10 for the gate electrode GE.

Figure 46:
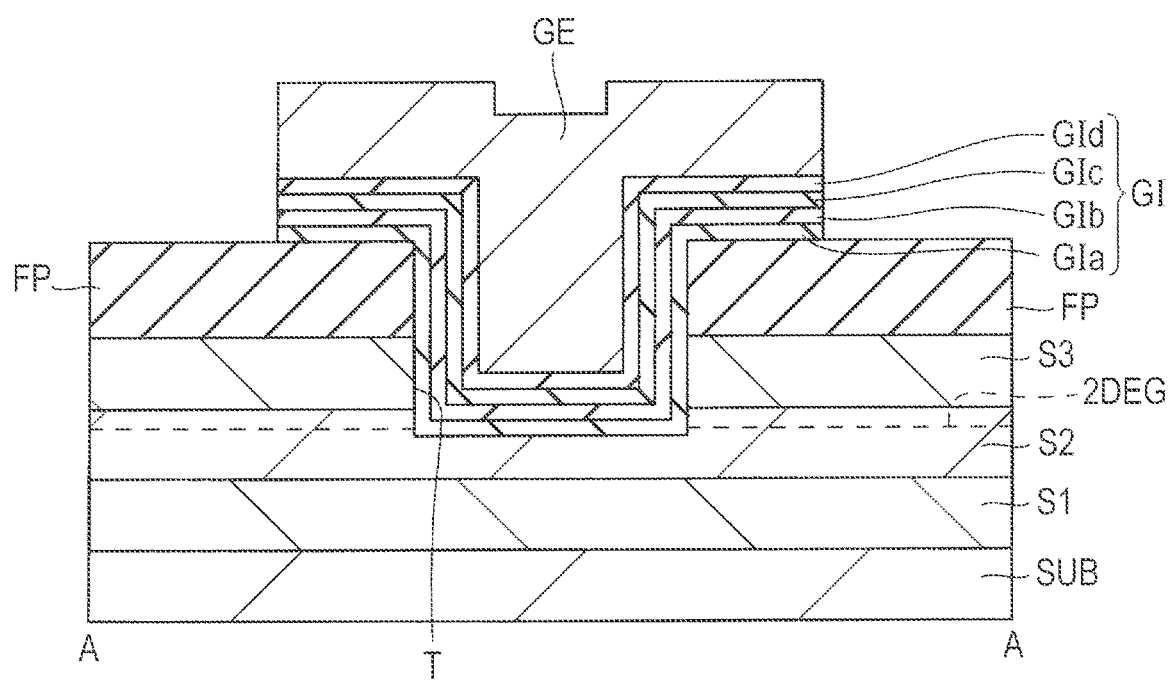
FIG. 46 is a sectional view illustrating the manufacturing process of the semiconductor device of the second embodiment.

Subsequently, an undepicted photoresist film is formed in a formation region of the gate electrode GE on the conductive film for the gate electrode GE by photolithography processing. The conductive film for the gate electrode GE and the gate insulating film GI are etched with the photoresist film as a mask. For example, the TiN film and the aluminum oxide film are etched by dry etching using a chlorine-based gas, and the silicon oxide film is etched by dry etching using a fluorine-based gas. A patterned insulating film (for example, silicon oxide film) may be used as a mask. Subsequently, the photoresist film is removed by plasma stripping processing or the like. Consequently, as shown in FIG. 46, the gate electrode GE is formed over the third nitride semiconductor layer S3 with the gate insulating film GI in between.

The interlayer insulating film IL1, the source electrode SE, the drain electrode DE, and the insulating film (protective film) IL2 as shown below can each be formed in the same way as in the first embodiment.

Figure 47:
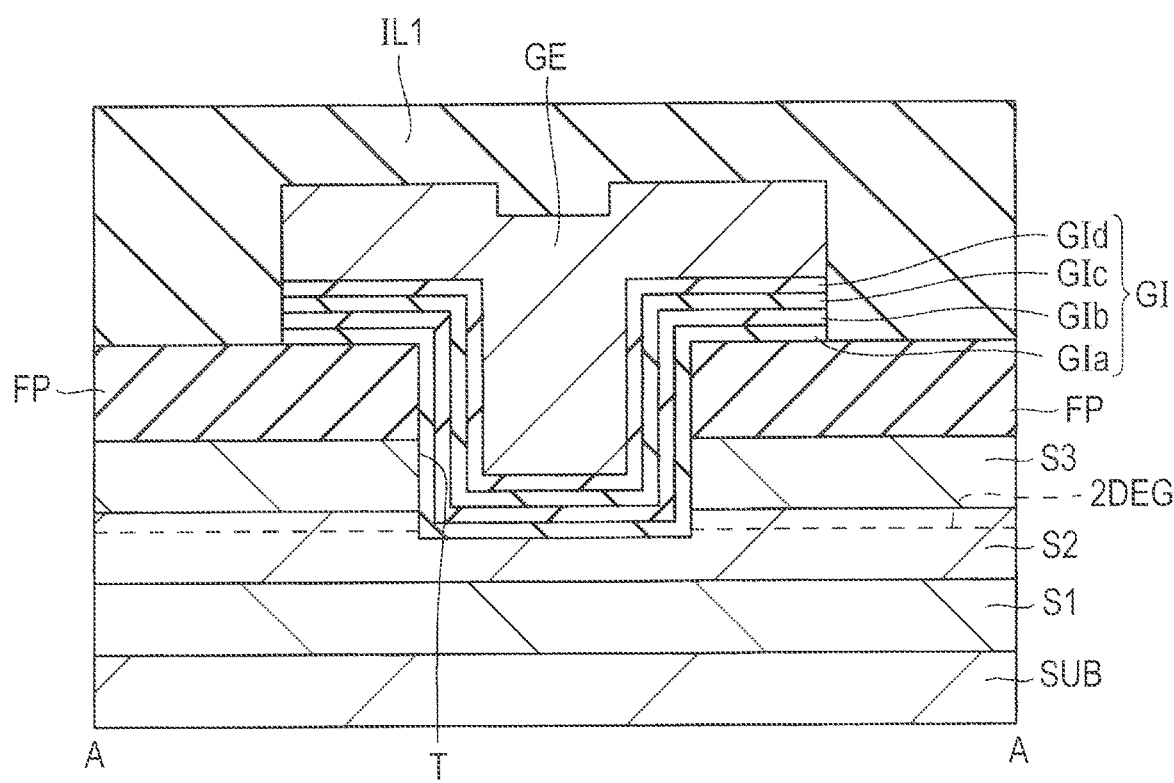
FIG. 47 is a sectional view illustrating the manufacturing process of the semiconductor device of the second embodiment.
Figure 48:
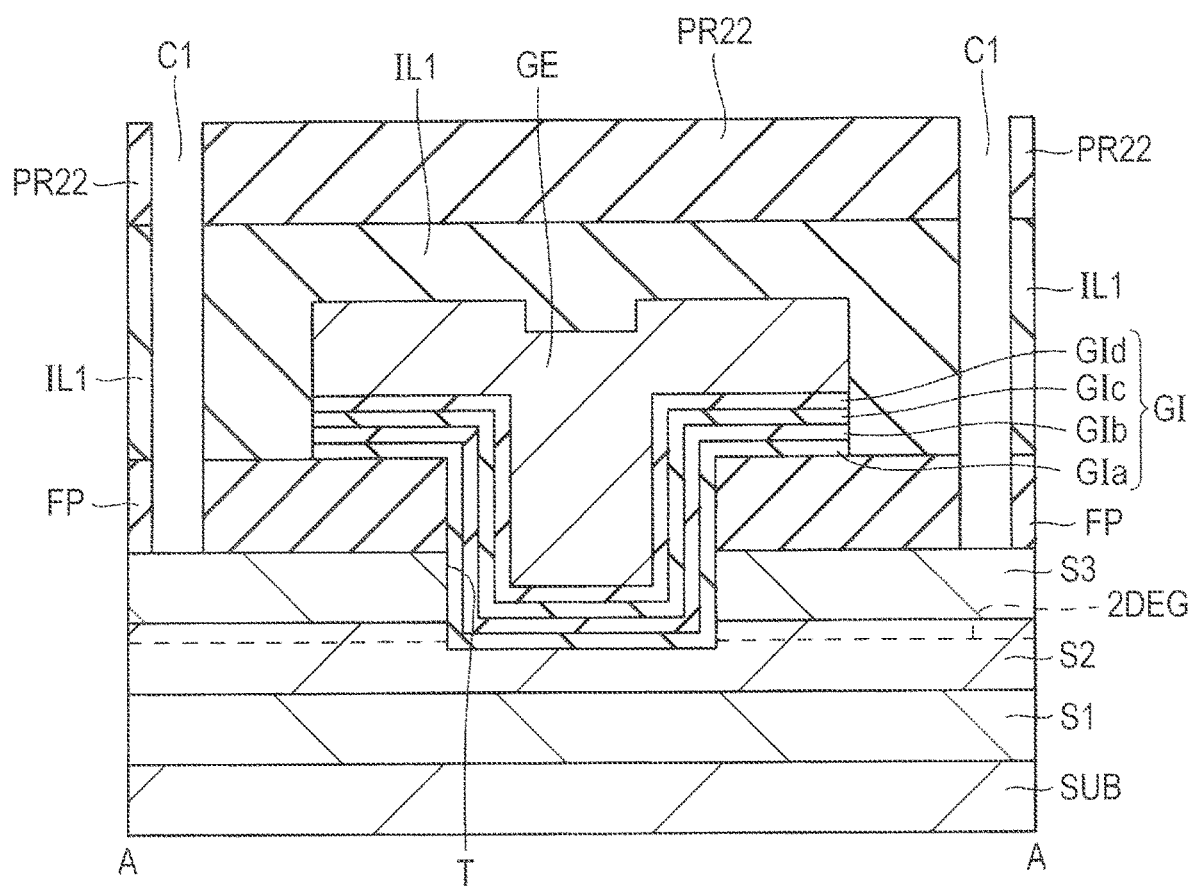
FIG. 48 is a sectional view illustrating the manufacturing process of the semiconductor device of the second embodiment.
Figure 49:
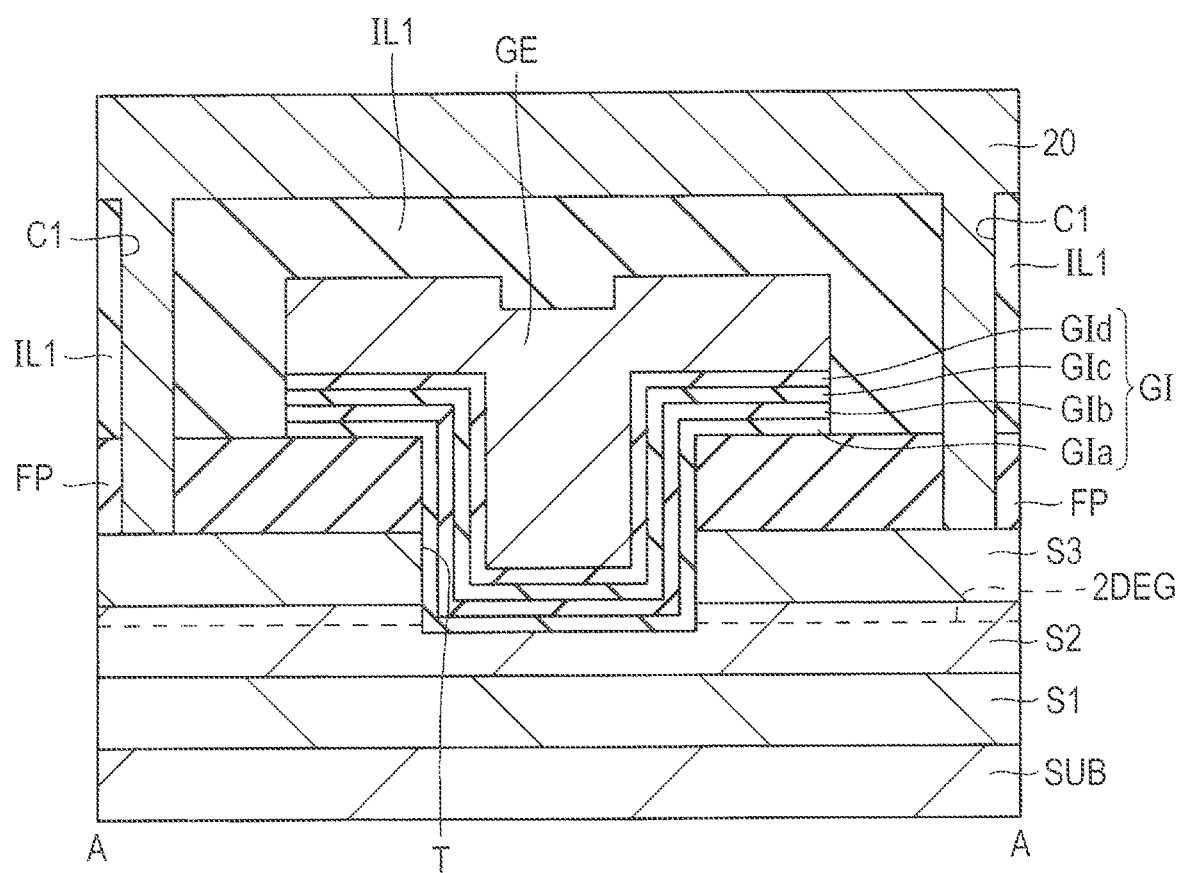
FIG. 49 is a sectional view illustrating the manufacturing process of the semiconductor device of the second embodiment.
Figure 50:
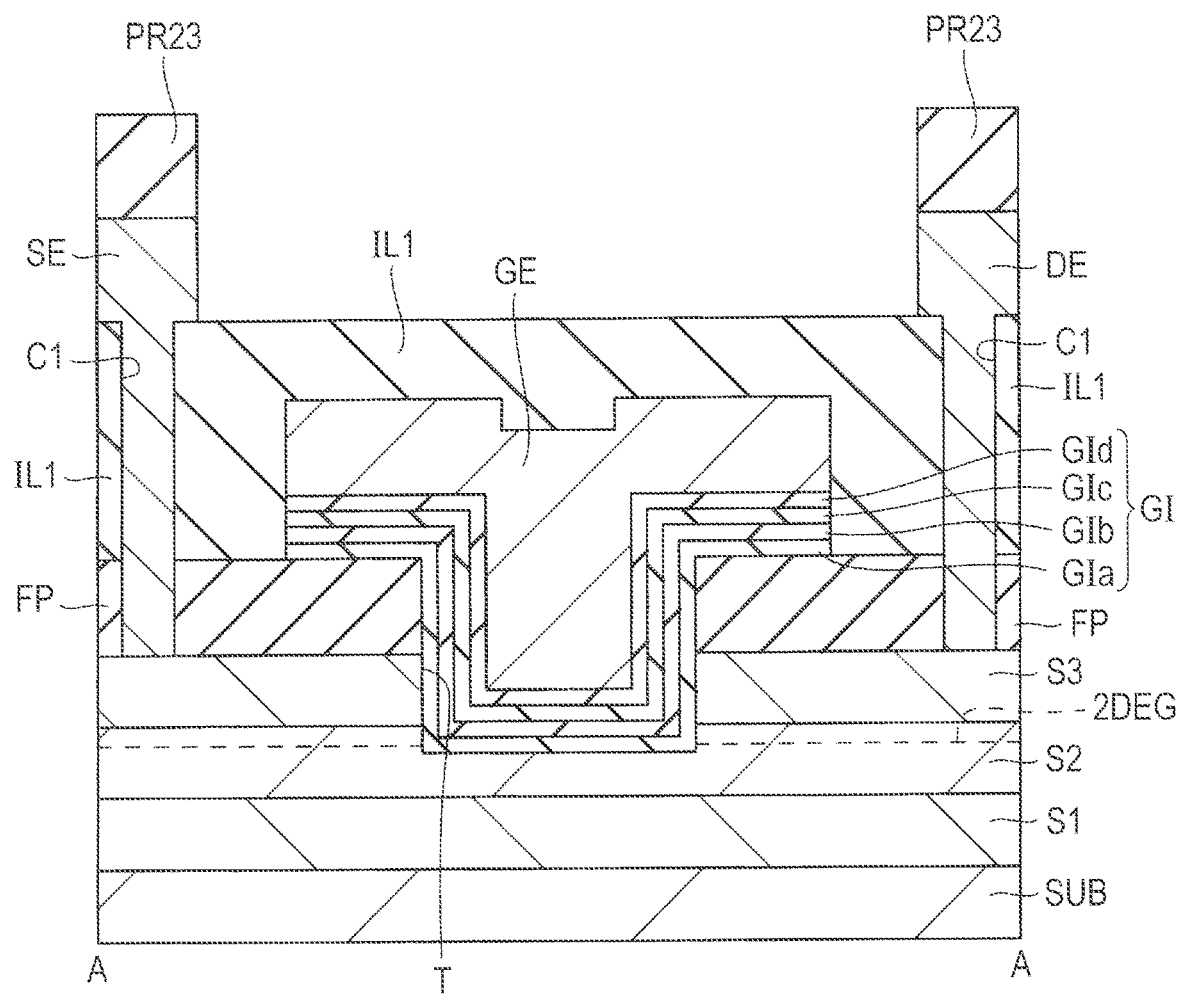
FIG. 50 is a sectional view illustrating the manufacturing process of the semiconductor device of the second embodiment.
Figure 51:
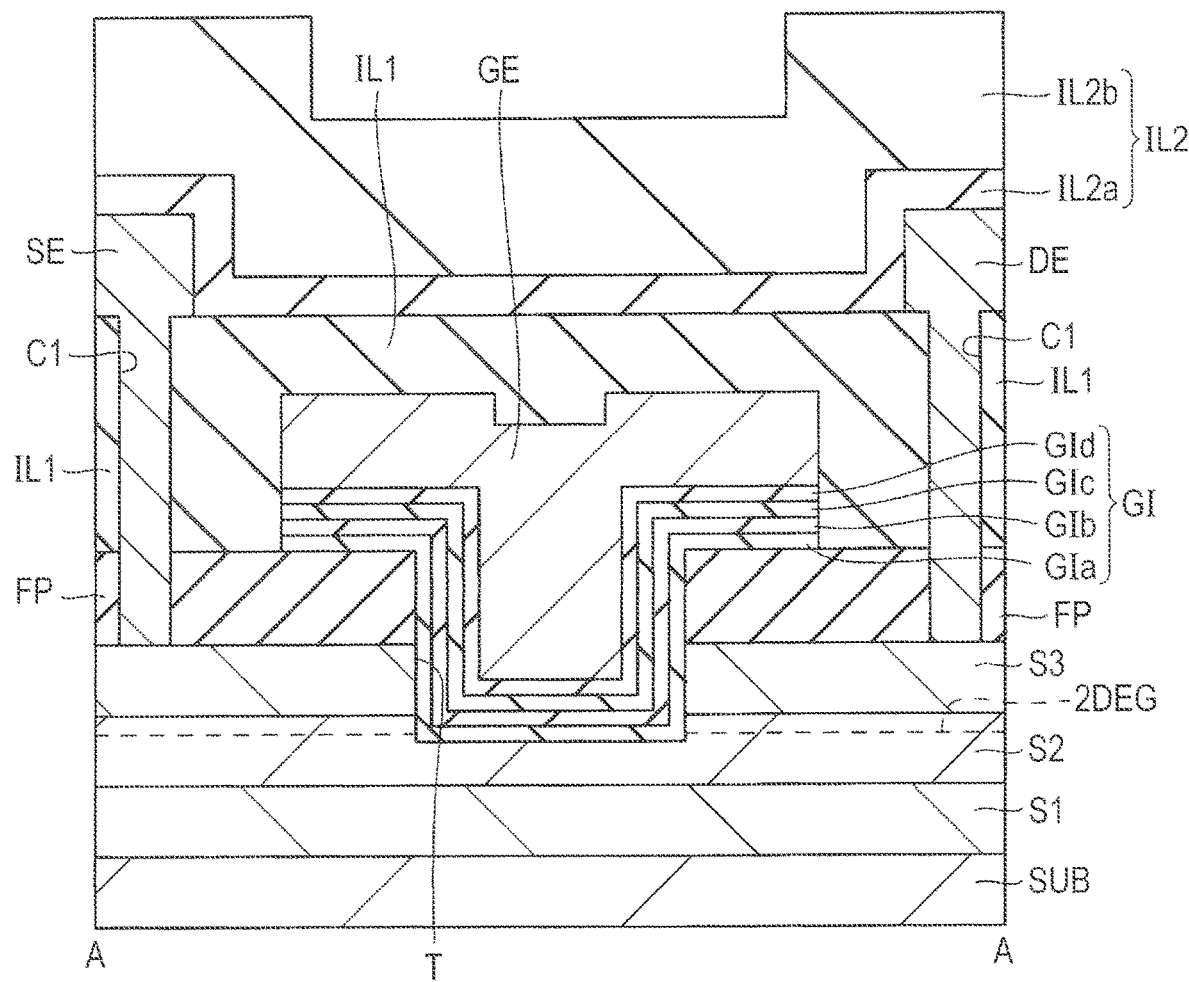
FIG. 51 is a sectional view illustrating the manufacturing process of the semiconductor device of the second embodiment.

To briefly describe, first, as shown in FIG. 47, the interlayer insulating film IL1 is formed over the gate electrode GE. Subsequently, as shown in FIG. 48, contact holes C1 are formed in the interlayer insulating film IL1 using a photolithography technique and an etching technique. For example, the contact holes C1 are formed by etching the interlayer insulating film IL1 with the photoresist film PR22 as a mask. Subsequently, as shown in FIG. 49, the conductive film 20 is formed over the interlayer insulating film IL1 including within the contact holes C1, and then, as shown in FIG. 50, the conductive film (Al film) 20 is etched with the photoresist film PR23 on the conductive film (Al film) as a mask to form the source electrode SE and the drain electrode DE. Subsequently, the photoresist film PR23 is removed by plasma stripping processing or the like, and then, as shown in FIG. 51, the insulating film (protective film) IL2 is formed over the interlayer insulating film IL1 including over the source electrode SE and the drain electrode DE.

The insulating film (protective film) including the polyimide film and the like may be formed on the top interconnection after formation of multilayer interconnections to be coupled to the source electrode SE and the drain electrode DE. After that, the insulating film (the film stack of the polyimide film and the silicon nitride film) is removed so that part of the underlying conductive film (interconnection) is exposed to form an undepicted pad in each of regions where the gate pad GP, the source pad SP, and the drain pad DP are necessary to be electrically coupled to external components.

The semiconductor device of the second embodiment can be formed through the above-described steps. The steps are merely shown as an example, and the semiconductor device of the second embodiment may be manufactured through other steps.

Third Embodiment

Although the gate insulating film has been configured by a film including at least four layers in the first and second embodiments, the film may be configured by a two-layer film. In addition, the first and second embodiments have been exemplarily described with the film stack of the crystalline aluminum oxide ($Al_2O_3$) film and the silicon oxide ($SiO_2$) film, a film stack of a first-metal oxide film (M1O) and a second-metal oxide film (M2O) may also be used.

First Application

Figure 52:
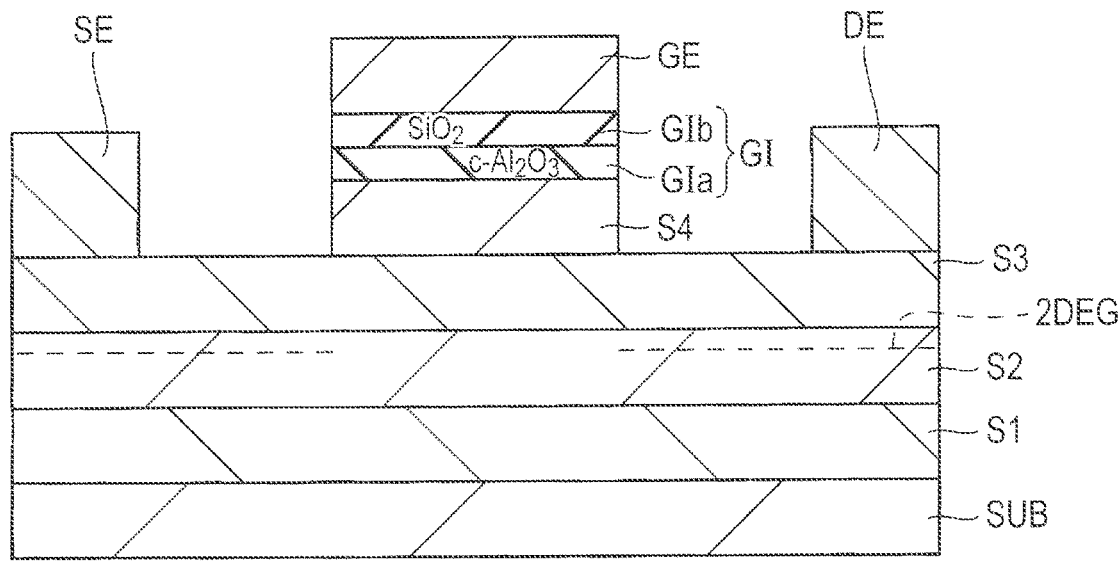
FIG. 52 is a sectional view illustrating a configuration of a semiconductor device of a first application of a third embodiment.

FIG. 52 is a sectional view illustrating a configuration of a semiconductor device of a first application of the third embodiment. In the semiconductor device of the first application, any configuration other than the gate insulating film GI is the same as that of the semiconductor device of the first embodiment (FIG. 1).

That is, the gate insulating film GI including the four-layer insulating film (GIa to GId) is used in the semiconductor device of the first embodiment (FIG. 1), a gate insulating film GI including a two-layer insulating film (GIa, GIb) is used in the first application. Specifically, a film stack of a first gate insulating film GIa made of a crystalline aluminum oxide ($Al_2O_3$) and a second gate insulating film GIb made of an overlying silicon oxide ($SiO_2$) is used as the gate insulating film GI.

In such a case, dipole is also formed at the boundary between the crystalline $Al_2O_3$ film and the $SiO_2$ film and cancels the electric field caused by the interfacial positive charge $Q_{int}$ as described with reference to FIGS. 13 and 14 in the first embodiment. As a result, the threshold voltage (Vt) can be increased In this way, the threshold voltage (Vt) can also be increased in the case where the two-layer film including the crystalline $Al_2O_3$ film and the overlying $SiO_2$ film is used as the gate insulating film GI. However, if the second gate insulating film GIb made of the silicon oxide ($SiO_2$) for the upper layer has a large thickness, the threshold voltage (Vt) is reduced beyond the effect of the dipole (see FIG. 13). Hence, when the two-layer film including the crystalline $Al_2O_3$ film and the overlying $SiO_2$ is used as the gate insulating film GI, the second gate insulating film GIb made of the silicon oxide ($SiO_2$) for the upper layer preferably has a thickness of 5 to 10 nm. The first gate insulating film GIa made of the crystalline $Al_2O_3$ for the lower layer preferably has a thickness having a lower limit of 2 nm or more, more preferably 5 nm or more. In an exemplary thickness design for the two-layer film to be used, the aluminum oxide GIa may have a thickness of 37.5 nm, and the silicon oxide GIb may have a thickness of 10 nm, for example.

The two-layer gate insulating film of the first application may be applied to the semiconductor device having the mesa MOS structure (FIG. 15) and the recessed-gate semiconductor device (FIG. 34) described in the first and second embodiments.

The method of manufacturing the semiconductor device of the first application may correspond to the method of manufacturing the semiconductor device of the first or second embodiment, in which, however, the formation steps of the two upper insulating films (GIc, GId) in the four insulating films (GIa to GId) are omitted.

Second Application

Figure 53:
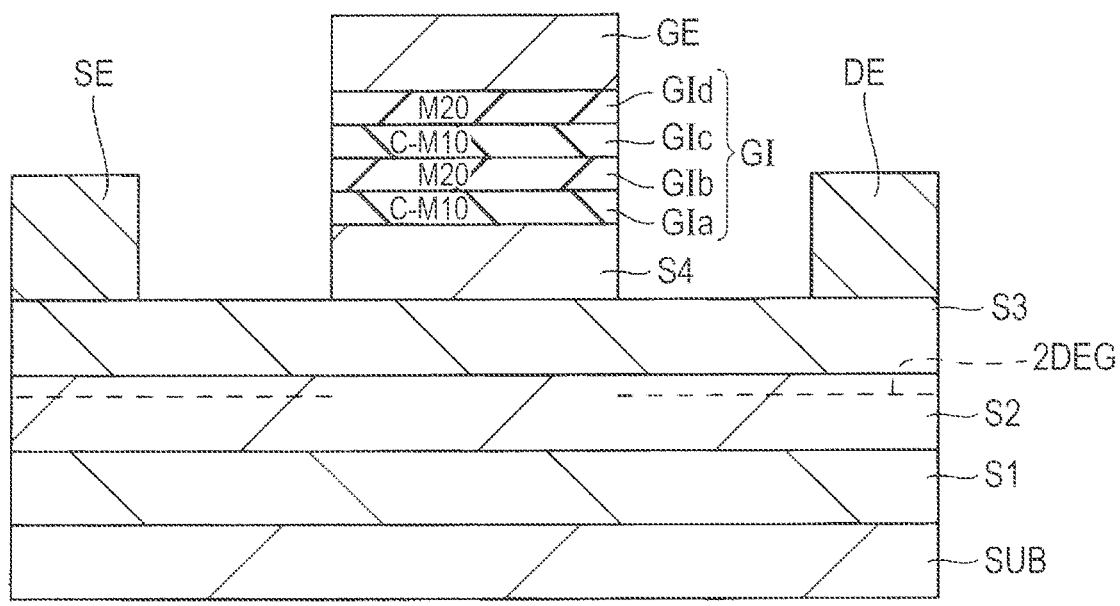
FIG. 53 is a sectional view illustrating a configuration of a semiconductor device of a second application of the third embodiment.

FIG. 53 is a sectional view illustrating a configuration of a semiconductor device of a second application of the third embodiment. In the semiconductor device of the second application, any configuration other than the gate insulating film GI is the same as that of the semiconductor device of the first embodiment (FIG. 1).

That is, although the gate insulating film GI is configured by the crystalline $Al_2O_3$ film (GIa), the $SiO_2$ film (GIb), the crystalline $Al_2O_3$ film (GIc), and the $SiO_2$ film (GId) in order from the bottom side in the semiconductor device of the first embodiment (FIG. 1), the gate insulating film GI may be configured by oxide films of various metals (elements).

Specifically, a four-layer film, which includes a crystalline oxide film (M1O, GIa) of a first metal, an oxide film (M2O, GIb) of a second metal, a crystalline oxide film (M1O, GIc) of the first metal, and an oxide film (M2O, GId) of the second metal in order from the bottom side, is used as the gate insulating film GI. The first metal (M1) has a lower electronegativity than the second metal (M2). It will be appreciated that a compositional ratio of M1 or M2 to O varies depending on an element to be selected.

Such a gate insulating film GI is formed by the following steps. The crystalline first film made of the oxide of the first metal is formed on the mesa part, and the second film made of the second metal oxide is formed on the crystalline first film. Subsequently, an amorphous third film made of the oxide of the first metal is formed on the second film, and is subjected to heat treatment and crystallized, thereby a crystalline third film made of the oxide of the first metal is formed. Furthermore, a fourth film made of the oxide of the second metal is formed on the crystalline third film.

In the first or second embodiment, the first metal is Al, and the second metal (element) is Si. In addition, the first film (GIa) and the third film (GIc) are each the aluminum oxide ($Al_2O_3$) film, and the second film (GIb) and the fourth film (GId) are each the silicon oxide ($SiO_2$) film.

In such a stacking relationship, the events of "dipole is formed by forming the oxide film (M2O) of the second metal on the crystalline oxide film (c-M1O) of the first metal" and "no dipole is formed in the case where the amorphous oxide film (a-M1O) of the first metal is formed on the oxide film (M2O) of the second metal and crystallized" are used, so that the threshold voltage can be cumulatively increased using the gate insulating film, which is formed by repeatedly stacking the two-layer films including the crystalline oxide films (M1O, GIa) of the first metal and the oxide films (M2O, GIb) of the second metal (see FIG. 2).

The first metal M1 and the second metal are each selected from elements of group II, group III, group IV, group V, and group XIII shown in FIG. 54 (Pauling's electronegativity Table). In particular, the oxide of each of the first metal M1 and the second metal preferably exists as solid at a temperature in a device operation range (for example, lower than 200° C.), and has good insulation performance in a thin-film state. A combination of the lower oxide film and the upper oxide film may be appropriately selected from among such metals in light of the electronegativity relationship.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

For example, the gate insulating film of the second application may be formed as a two-layer film and applied to the semiconductor device described in the first application.

Supplementary Note 1

A semiconductor device, includes:

a first nitride semiconductor layer;

a second nitride semiconductor layer formed over the first nitride semiconductor layer;

a third nitride semiconductor layer formed over the second nitride semiconductor layer;

a trench that runs up to the second nitride semiconductor layer through the third nitride semiconductor layer; and a gate electrode disposed over the inside of the trench with a gate insulating film in between, where electron affinity of the second nitride semiconductor layer is equal to or larger than electron affinity of the first nitride semiconductor layer, where electron affinity of the third nitride semiconductor layer is smaller than the electron affinity of the first nitride semiconductor layer, and where the gate insulating film includes a stack formed by stacking a crystalline first film made of oxide of a first metal, a second film made of oxide of a second metal, a crystalline third film made of the oxide of the first metal, and a fourth film made of the oxide of the second metal in order from a bottom side.

Supplementary Note 2

The semiconductor device according to supplementary Note 1, where the first metal has a lower electronegativity than the second metal.

Supplementary Note 3

The semiconductor device according to supplementary Note 1, where the first film and the third film are each an aluminum oxide film, and where the second film and the fourth film are each a silicon oxide film.

Supplementary Note 4

A method of manufacturing a semiconductor device, includes the steps of:

(a) forming a second nitride semiconductor layer over a first nitride semiconductor layer;

(b) forming a third nitride semiconductor layer over the second nitride semiconductor layer;

(c) forming a mesa part including a fourth nitride semiconductor layer over the third nitride semiconductor layer;

(d) forming a gate insulating film above the mesa part; and (e) forming a gate electrode over the gate insulating film, where electron affinity of the second nitride semiconductor layer is equal to or larger than electron affinity of the first nitride semiconductor layer, where electron affinity of the third nitride semiconductor layer is smaller than the electron affinity of the first nitride semiconductor layer, where electron affinity of the fourth nitride semiconductor layer is larger than the electron affinity of the first nitride semiconductor layer, and where the step (d) includes the steps of (d1) forming a crystalline aluminum oxide film over the mesa part; and (d2) forming a silicon oxide film over the aluminum oxide film, where the aluminum oxide film has a thickness of 2 to 20 nm, and where the silicon oxide film has a thickness of 5 to 20 nm.

Supplementary Note 5

The method according to supplementary Note 4 where in the step (d1), the amorphous aluminum oxide film is subjected to heat treatment and crystallized, thereby the crystalline aluminum oxide film is formed.

Supplementary Note 6

A method of manufacturing a semiconductor device, includes the steps of:

(a) forming a second nitride semiconductor layer over a first nitride semiconductor layer;

(b) forming a third nitride semiconductor layer over the second nitride semiconductor layer;

(c) etching the third nitride semiconductor layer and the second nitride semiconductor layer, thereby forming a trench that runs up to the second nitride semiconductor layer through the third nitride semiconductor layer;

(d) forming a gate insulating film over a bottom surface and a sidewall of the trench; and (e) forming a gate electrode over the gate insulating film, where electron affinity of the second nitride semiconductor layer is equal to or larger than electron affinity of the first nitride semiconductor layer, where electron affinity of the third nitride semiconductor layer is smaller than the electron affinity of the first nitride semiconductor layer, and where the step (d) includes the steps of (d1) forming a crystalline aluminum oxide film over the bottom surface and the sidewall of the trench; and (d2) forming a silicon oxide film over the aluminum oxide film, where the aluminum oxide film has a thickness of 2 to 20 nm, and where the silicon oxide film has a thickness of 5 to 20 nm.

Supplementary Note 7

The method according to supplementary Note 6, where in the step (d1), the amorphous aluminum oxide film is subjected to heat treatment and crystallized, thereby the crystalline aluminum oxide film is formed.

Supplementary Note 8

A semiconductor device, includes:

a first nitride semiconductor layer;

a second nitride semiconductor layer formed over the first nitride semiconductor layer;

a third nitride semiconductor layer formed over the second nitride semiconductor layer;

a mesa part including a fourth nitride semiconductor layer formed over the third nitride semiconductor layer; and a gate electrode disposed over the mesa part with a gate insulating film in between, where electron affinity of the second nitride semiconductor layer is equal to or larger than electron affinity of the first nitride semiconductor layer, where electron affinity of the third nitride semiconductor layer is smaller than the electron affinity of the first nitride semiconductor layer, where electron affinity of the fourth nitride semiconductor layer is larger than the electron affinity of the first nitride semiconductor layer, where the gate insulating film includes a stack formed by stacking a crystalline aluminum oxide film and a silicon oxide film in order from a bottom side, where the aluminum oxide film has a thickness of 2 to 20 nm, and where the silicon oxide film has a thickness of 5 to 10 nm.
Supplementary Note 9

A semiconductor device, includes:
a first nitride semiconductor layer;
a second nitride semiconductor layer formed over the first nitride semiconductor layer;
a third nitride semiconductor layer formed over the second nitride semiconductor layer;
a trench that runs up to the second nitride semiconductor layer through the third nitride semiconductor layer; and
a gate electrode disposed over the inside of the trench with a gate insulating film in between,
where electron affinity of the second nitride semiconductor layer is equal to or larger than electron affinity of the first nitride semiconductor layer,
where electron affinity of the third nitride semiconductor layer is smaller than the electron affinity of the first nitride semiconductor layer, and
where the gate insulating film includes a stack formed by stacking a crystalline aluminum oxide film and a silicon oxide film in order from a bottom side,
where the aluminum oxide film has a thickness of 2 to 20 nm, and
where the silicon oxide film has a thickness of 5 to 10 nm.

What is claimed is:

1. A method of manufacturing a semiconductor device, comprising the steps of:
    (a) forming a second nitride semiconductor layer over a first nitride semiconductor layer;
    (b) forming a third nitride semiconductor layer over the second nitride semiconductor layer;
    (c) forming a mesa part including a fourth nitride semiconductor layer over the third nitride semiconductor layer;
    (d) forming a gate insulating film above the mesa part; and
    (e) forming a gate electrode over the gate insulating film,
    wherein electron affinity of the second nitride semiconductor layer is equal to or larger than electron affinity of the first nitride semiconductor layer,
    wherein electron affinity of the third nitride semiconductor layer is smaller than the electron affinity of the first nitride semiconductor layer,
    wherein electron affinity of the fourth nitride semiconductor layer is larger than the electron affinity of the first nitride semiconductor layer, and
    wherein the step (d) includes the steps of:
    (d1) forming a crystalline first film made of oxide of a first metal over the mesa part;
    (d2) forming a second film made of oxide of a second metal over the crystalline first film; and
    (d3) forming an amorphous third film made of the oxide of the first metal over the second film.

2. The method according to claim 1, wherein after the step (d3), the step (d) further includes the steps of:
    (d4) performing heat treatment on the amorphous third film to crystallize the amorphous third film, thereby forming a crystalline third film made of the oxide of the first metal; and
    (d5) forming a fourth film made of the oxide of the second metal over the crystalline third film.

3. The method according to claim 2, wherein in the step (d1), the amorphous first film is subjected to heat treatment and crystallized, thereby the crystalline first film made of the oxide of the first metal is formed.

4. The method according to claim 3, wherein the first metal has a lower electronegativity than the second metal.

5. The method according to claim 3,
    wherein the first film and the third film are each an aluminum oxide film, and
    wherein the second film and the fourth film are each a silicon oxide film.

6. The method according to claim 5, wherein the heat treatment in the step (d4) is performed in an atmosphere of 800° C. or higher.

7. The method according to claim 5, wherein in the steps (d4) and (d5), the silicon oxide film is formed in an atmosphere of 800° C. or higher.

8. The method according to claim 5,
    wherein the aluminum oxide film has a thickness of 2 to 20 nm, and
    wherein the silicon oxide film has a thickness of 5 to 20 nm.

9. The method according to claim 8,
    wherein the aluminum oxide film has a thickness of 5 to 10 nm, and
    wherein the silicon oxide film has a thickness of 5 to 10 nm.

* * * * *